(12) United States Patent  
Anzelmo et al.

(10) Patent No.: US 12,317,466 B2  
(45) Date of Patent: May 27, 2025

(54) FREQUENCY SELECTIVE METAMATERIAL FOR PROTECTIVE ENCLOSURES

(71) Applicant: Lyten, Inc., San Jose, CA (US)

(72) Inventors: Bryce H. Anzelmo, Randolph, NJ (US); Carlos Montalvo, Cambria, CA (US); Michael Stowell, Sunnyvale, CA (US)

(73) Assignee: LYTEN, INC., San Jose, CA (US)

( * ) Notice: Subject to any disclaimer, the term of this patent is extended or adjusted under 35 U.S.C. 154(b) by 0 days.

(21) Appl. No.: 18/889,176

(22) Filed: Sep. 18, 2024

(65) Prior Publication Data

US 2025/0016970 A1  Jan. 9, 2025

Related U.S. Application Data

(63) Continuation-in-part of application No. 18/440,806, filed on Feb. 13, 2024, and a continuation-in-part of (Continued)

(51) Int. Cl.  
*H05K 9/00* (2006.01)

(52) U.S. Cl.  
CPC ......... *H05K 9/0088* (2013.01); *H05K 9/0052* (2013.01); *H05K 9/006* (2013.01); *H05K 9/0083* (2013.01); *H05K 9/0071* (2013.01)

(58) Field of Classification Search  
CPC .... H05K 9/0088; H05K 9/0052; H05K 9/006; H05K 9/0083; H05K 9/0071  
(Continued)

(56) References Cited

U.S. PATENT DOCUMENTS 6,359,444 B1  3/2002  Grimes  
6,525,105 B1  2/2003  Udagawa et al.  
(Continued)

FOREIGN PATENT DOCUMENTS

CN  104677879 B  6/2017  
EP  1289809 B1  5/2007  
(Continued)

OTHER PUBLICATIONS

Material District, Metamaterial Mechanisms Made From a Single Piece of Plastic, Oct. 2016, https://materialdistrict.com/article/metamaterial-mechanisms-single-piece/ (Year: 2016).*

(Continued)

*Primary Examiner* — Eric Blount  
(74) *Attorney, Agent, or Firm* — Zilka-Kotab, P.C.

(57) ABSTRACT

The present disclosure provides a protective enclosure for electronic systems. The enclosure comprises a polymer-containing matrix and a metamaterial incorporated into the matrix. The metamaterial is tuned to a specific permittivity or permeability to absorb or reflect a particular frequency. The protective enclosure may be used to create a safe inner environment for electronic components while facilitating uninterrupted wireless communications to/from the outer environment. Additionally, the protective enclosure may be used to protect against electromagnetic interference. In particular, shielding metamaterials are configured individually or in combination to specifically shield (via reflection, absorption, etc.) against relatively wide bands of electromagnetic frequencies, while transparent metamaterials are configured specifically to pass electromagnetic signals within narrow bands of frequencies. This new approach resolves and vastly improves current shield solutions, such as Faraday cages. For example, tuned metamaterials may be configured across a variety of preconfigured frequencies, and can be constructed of lightweight materials.

43 Claims, 22 Drawing Sheets

Related U.S. Application Data application No. 18/230,080, filed on Aug. 3, 2023, which is a continuation-in-part of application No. 17/940,256, filed on Sep. 8, 2022, which is a continuation-in-part of application No. 17/340,493, filed on Jun. 7, 2021, now Pat. No. 11,592,279, and a continuation-in-part of application No. 17/227,249, filed on Apr. 9, 2021, now Pat. No. 11,479,062, said application No. 17/340,493 is a continuation-in-part of application No. 16/829,355, filed on Mar. 25, 2020, now Pat. No. 11,446,966, said application No. 17/227,249 is a continuation-in-part of application No. 16/829,355, filed on Mar. 25, 2020, now Pat. No. 11,446,966.

(60) Provisional application No. 63/622,464, filed on Jan. 18, 2024, provisional application No. 63/532,859, filed on Aug. 15, 2023, provisional application No. 63/531,657, filed on Aug. 9, 2023, provisional application No. 63/525,622, filed on Jul. 7, 2023, provisional application No. 63/525,346, filed on Jul. 6, 2023, provisional application No. 63/445,948, filed on Feb. 15, 2023, provisional application No. 63/408,372, filed on Sep. 20, 2022, provisional application No. 63/373,072, filed on Aug. 21, 2022, provisional application No. 63/281,846, filed on Nov. 22, 2021, provisional application No. 63/276,274, filed on Nov. 5, 2021, provisional application No. 63/247,680, filed on Sep. 23, 2021, provisional application No. 63/242,270, filed on Sep. 9, 2021, provisional application No. 63/094,223, filed on Oct. 20, 2020, provisional application No. 63/036,796, filed on Jun. 9, 2020, provisional application No. 63/036,118, filed on Jun. 8, 2020, provisional application No. 63/008,262, filed on Apr. 10, 2020, provisional application No. 62/985,550, filed on Mar. 5, 2020, provisional application No. 62/979,215, filed on Feb. 20, 2020, provisional application No. 62/824,440, filed on Mar. 27, 2019.

(58) Field of Classification Search
USPC .......................................................... 174/377
See application file for complete search history.

(56) References Cited

U.S. PATENT DOCUMENTS

| | | |
|---|---|---|
| 6,885,291 B1 | 4/2005 | Pollack et al. |
| 6,997,039 B2 | 2/2006 | Rao et al. |
| 7,581,439 B2 | 9/2009 | Rensel et al. |
| 8,364,419 B2 | 1/2013 | Potyrailo et al. |
| 8,448,496 B2 | 5/2013 | Huang et al. |
| 8,567,232 B2 | 10/2013 | Ackley et al. |
| 8,736,425 B2 | 5/2014 | Potyrailo |
| 9,038,443 B1 | 5/2015 | Pace et al. |
| 9,172,147 B1 | 10/2015 | Manry, Jr. |
| 9,208,362 B1* | 12/2015 | Fink .................. G06K 7/10336 |
| 9,395,343 B2 | 7/2016 | Schmid et al. |
| 9,538,657 B2 | 1/2017 | Potyrailo et al. |
| 9,705,469 B2 | 7/2017 | Rinaldi et al. |
| 9,944,131 B2 | 4/2018 | Wei et al. |
| 10,278,287 B2 | 4/2019 | Wilson et al. |
| 10,492,683 B2 | 12/2019 | Yalçinkaya et al. |
| 10,502,705 B2 | 12/2019 | Stowell et al. |
| 10,802,018 B2 | 10/2020 | Cubukcu et al. |
| 11,014,413 B2 | 5/2021 | Räisänen et al. |
| 11,137,368 B2 | 10/2021 | Stowell et al. |
| 11,555,748 B2 | 1/2023 | Stowell et al. |
| 11,555,761 B1 | 1/2023 | Stowell |
| 11,585,731 B2 | 2/2023 | Stowell et al. |
| 11,892,372 B2 | 2/2024 | Stowell et al. |
| 11,965,803 B2 | 4/2024 | Stowell et al. |
| 2003/0080919 A1 | 5/2003 | Forster et al. |
| 2003/0201044 A1 | 10/2003 | Schick |
| 2004/0113846 A1 | 6/2004 | Achim |
| 2007/0068493 A1 | 3/2007 | Pavlovsky |
| 2007/0090926 A1 | 4/2007 | Potyrailo et al. |
| 2007/0175555 A1 | 8/2007 | Myatt |
| 2007/0295069 A1 | 12/2007 | Mancosu et al. |
| 2008/0135614 A1 | 6/2008 | Werner et al. |
| 2009/0145233 A1 | 6/2009 | Eklund et al. |
| 2009/0234587 A1 | 9/2009 | Hsiung et al. |
| 2009/0327188 A1 | 12/2009 | Ryhanen et al. |
| 2011/0018556 A1 | 1/2011 | Le et al. |
| 2011/0040498 A1 | 2/2011 | Huang et al. |
| 2012/0235690 A1 | 9/2012 | Potyrailo et al. |
| 2013/0150516 A1 | 6/2013 | Lettow |
| 2013/0214875 A1 | 8/2013 | Duncan et al. |
| 2013/0285681 A1 | 10/2013 | Wilson et al. |
| 2014/0002111 A1 | 1/2014 | Potyrailo et al. |
| 2014/0134092 A1 | 5/2014 | Shankman |
| 2014/0266850 A1* | 9/2014 | Suorsa .................. H01Q 17/002 29/601 |
| 2014/0305191 A1 | 10/2014 | Schmid et al. |
| 2014/0350883 A1 | 11/2014 | Carter et al. |
| 2014/0354112 A1 | 12/2014 | Rocha |
| 2015/0118492 A1 | 4/2015 | Sitharaman et al. |
| 2015/0123678 A1 | 5/2015 | Neikirk et al. |
| 2015/0323482 A1 | 11/2015 | Shimoyama et al. |
| 2016/0033442 A1 | 2/2016 | Sun et al. |
| 2016/0065169 A1 | 3/2016 | Rinaldi et al. |
| 2016/0091544 A1 | 3/2016 | Daneshmand et al. |
| 2016/0169824 A1 | 6/2016 | Shin et al. |
| 2016/0282312 A1 | 9/2016 | Cable et al. |
| 2017/0096036 A1 | 4/2017 | Guinart et al. |
| 2017/0294698 A1 | 10/2017 | Cho et al. |
| 2017/0294699 A1 | 10/2017 | Cho et al. |
| 2017/0330004 A1 | 11/2017 | Gibson |
| 2018/0042479 A1 | 2/2018 | Yalçinkaya et al. |
| 2018/0265666 A1 | 9/2018 | Anzelmo et al. |
| 2018/0346684 A1 | 12/2018 | Polyzos et al. |
| 2019/0204265 A1 | 7/2019 | Stowell et al. |
| 2019/0260120 A1* | 8/2019 | Khushrushahi ...... H01Q 19/062 |
| 2019/0264004 A1 | 8/2019 | Stowell et al. |
| 2019/0277702 A1 | 9/2019 | Aleman et al. |
| 2019/0277761 A1 | 9/2019 | Falk et al. |
| 2019/0324433 A1 | 10/2019 | Cella et al. |
| 2019/0379639 A1 | 12/2019 | Corning |
| 2020/0242858 A1 | 7/2020 | Meroux et al. |
| 2020/0278304 A1 | 9/2020 | Udpa et al. |
| 2021/0112781 A1 | 4/2021 | Crouthamel et al. |
| 2021/0118081 A1 | 4/2021 | Jha et al. |
| 2021/0229503 A1 | 7/2021 | Stowell et al. |
| 2021/0293521 A1 | 9/2021 | Stowell et al. |
| 2021/0293630 A1 | 9/2021 | Stowell et al. |
| 2021/0348909 A1 | 11/2021 | Stowell et al. |
| 2022/0146415 A1 | 5/2022 | Putkaradze et al. |
| 2023/0017082 A1 | 1/2023 | Stowell et al. |
| 2023/0018475 A1 | 1/2023 | Stowell |
| 2023/0019088 A1 | 1/2023 | Montalvo et al. |
| 2023/0021276 A1 | 1/2023 | Stowell et al. |
| 2023/0083633 A1 | 3/2023 | Desai et al. |
| 2023/0096239 A1 | 3/2023 | Cole |
| 2023/0296479 A1 | 9/2023 | Stowell et al. |
| 2023/0384264 A1 | 11/2023 | Jardine et al. |
| 2023/0384265 A1 | 11/2023 | Jardine et al. |
| 2023/0417685 A1 | 12/2023 | Jardine et al. |
| 2024/0003779 A1 | 1/2024 | Stowell et al. |
| 2024/0264043 A1 | 8/2024 | Stowell et al. |
| 2024/0272103 A1 | 8/2024 | Cook et al. |
| 2024/0273648 A1 | 8/2024 | Cook et al. |
| 2024/0275608 A1 | 8/2024 | Cook et al. |
| 2024/0280526 A1 | 8/2024 | Cook et al. |
| 2024/0288381 A1 | 8/2024 | Stowell et al. |

(56) References Cited

U.S. PATENT DOCUMENTS

| | | |
|---|---|---|
| 2024/0417669 A1 | 12/2024 | Lim et al. |
| 2025/0076233 A1 | 3/2025 | Cook et al. |

FOREIGN PATENT DOCUMENTS

| | | |
|---|---|---|
| JP | 5822282 B2 | 11/2015 |
| KR | 100721261 B1 | 5/2007 |
| TW | 201312104 A | 3/2013 |
| TW | 202223332 A | 6/2022 |
| WO | 199325400 A1 | 12/1993 |
| WO | 2009024673 A1 | 2/2009 |
| WO | 20110018556 A1 | 2/2011 |
| WO | 2013027029 A1 | 2/2013 |
| WO | 2013192335 A1 | 12/2013 |
| WO | 2014169195 A1 | 10/2014 |
| WO | 2015083073 A1 | 6/2015 |
| WO | 2016068810 A1 | 5/2016 |
| WO | 2019067488 A1 | 4/2019 |
| WO | 2019136181 A1 | 7/2019 |
| WO | 2020198451 A1 | 10/2020 |
| WO | 2021096890 A1 | 5/2021 |
| WO | 2023003893 A1 | 1/2023 |

OTHER PUBLICATIONS

Biggins et al., U.S. Appl. No. 18/792,423, filed Aug. 1, 2024.
Office Action from Taiwanese Application No. 112123553, dated Jul. 31, 2024, 16 pages.
International Search Report and Written Opinion from PCT Application No. PCT/US 24/15862, dated Jul. 18, 2024.
Notice of Allowance from U.S. Appl. No. 18/596,390, dated Aug. 14, 2024.
Lim et al. U.S. Appl. No. 18/814,320, filed Aug. 23, 2024.
Potyrailo et al., "Battery-free Radio Frequency Identification (RFID) Sensors for Food Quality and Safety," Journal of Agricultural and Food Chemistry, vol. 60, 2012, pp. 8535-8543.
Vasala et al., "Modern Tools for Rapid Diagnostics of Antimicrobial Resistance," Frontiers in Cellular and Infection Microbiology, vol. 10, Jul. 15, 2020, pp. 1-23.
Office Action from Chinese Patent Application No. 202280067756.0, dated Aug. 23, 2024, 3 pages.
Corrected Notice of Allowance from U.S. Appl. No. 18/596,390, dated Aug. 29, 2024.
Non-Final Office Action from U.S. Appl. No. 17/940,256, dated Oct. 7, 2024.
Notice of Allowance from U.S. Appl. No. 18/440,806, dated Nov. 5, 2024.
Stowell et al., U.S. Appl. No. 17/940,227, filed Sep. 8, 2022.
Stowell, M., U.S. Appl. No. 17/940,240, filed Sep. 8, 2022.
Montalvo et al., U.S. Appl. No. 17/940,246, filed Sep. 8, 2022.
Stowell et al., U.S. Appl. No. 17/940,256, filed Sep. 8, 2022.
International Search Report and Written Opinion from PCT Application No. PCT/US2019/012224, dated Apr. 26, 2019.
International Search Report and Written Opinion from PCT Application No. PCT/US2021/042735, dated Nov. 3, 2021.
Na et al., "Graphene-Based Wireless Environmental Gas Sensor on PET Substrate," IEEE Sensor Journal, 2015, pp. 1-7.
Potyrailo et al., "A Passive Radio-Frequency Identification {RFID} Gas Sensor With Self-Correction Against Fluctuations of Ambient Temperature," Sens Actuators B Chem., vol. 185, Aug. 1, 2013, 16 pages.
Potyrailo et al., "Multivariable MHz and GHz Wireless Chem/Bio Sensors for Environmental, Industrial, and Security Applications," The 14th International Meeting on Chemical Sensors (IMCS), vol. 40, May 2012, pp. 399-402.
Potyrailo et al., "Wireless sensors and sensor networks for homeland security applications," Trends in Analytical Chemistry, vol. 40, Nov. 1, 2012, pp. 1-25.
Zhu et al., "Optoelectromechanical Multimodal Biosensor with Graphene Active Region," Nano Letters, vol. 14, 2014, pp. 5641-5649.
Non-Final Office Action from U.S. Appl. No. 17/940,227, dated Nov. 14, 2022.
Notice of Allowance from U.S. Appl. No. 17/940,240, dated Nov. 16, 2022.
Stowell et al., U.S. Appl. No. 17/340,678, filed Jun. 7, 2021.
Stowell et al., U.S. Appl. No. 17/340,514, filed Jun. 7, 2021.
Notice of Allowance from U.S. Appl. No. 17/340,514, dated Oct. 5, 2022.
Corrected Notice of Allowance from U.S. Appl. No. 17/340,514, dated Oct. 27, 2022.
Stowell et al., U.S. Appl. No. 17/340,493, filed Jun. 7, 2021.
Non-Final Office Action from U.S. Appl. No. 17/340,493, dated Jul. 21, 2022.
Notice of Allowance from U.S. Appl. No. 17/340,493, dated Oct. 13, 2022.
Notice of Allowance from U.S. Appl. No. 17/940,227, dated Dec. 8, 2022.
Stowell et al., U.S. Appl. No. 18/080,606, filed Dec. 13, 2022.
Corrected Notice of Allowance from U.S. Appl. No. 17/940,240, dated Dec. 2, 2022.
Corrected Notice of Allowance from U.S. Appl. No. 17/940,227, dated Jan. 5, 2022.
International Search Report and Written Opinion from PCT Application No. PCT/US 22/43125, dated Dec. 15, 2022.
Non-Final Office Action from U.S. Appl. No. 18/080,606, dated Jul. 20, 2023.
Reddy et al., "Split ring resonator and its evolved structures over the past decade," IEEE International Conference on Emerging Trends in Computing, Communication, and Nanotechnology (ICECCN), 2013, pp. 625-629.
Jardine et al., U.S. Appl. No. 18/230,072, filed Aug. 3, 2023.
Jardine et al., U.S. Appl. No. 18/230,080, filed Aug. 3, 2023.
Jardine et al., U.S. Appl. No. 18/230,083, filed Aug. 3, 2023.
Non-Final Office Action from U.S. Appl. No. 18/080,606, dated Aug. 24, 2023.
Stowell et al., U.S. Appl. No. 18/369,418, filed Sep. 18, 2023.
Notice of Allowance from U.S. Appl. No. 18/080,606, dated Sep. 29, 2023.
Non-Final Office Action from U.S. Appl. No. 18/369,418, dated Oct. 31, 2023.
Corrected Notice of Allowance from U.S. Appl. No. 18/080,606, dated Dec. 6, 2023.
Notice of Allowance from U.S. Appl. No. 18/369,418, dated Dec. 5, 2023.
Corrected Notice of Allowance from U.S. Appl. No. 18/369,418, dated Dec. 26, 2023.
International Search Report and Written Opinion from PCT Application No. PCT/US23/33178, dated Dec. 20, 2023.
Corrected Notice of Allowance from U.S. Appl. No. 18/369,418, dated Jan. 17, 2024.
Cook et al., U.S. Appl. No. 18/440,806, filed Feb. 13, 2024.
Cook et al., U.S. Appl. No. 18/440,719, filed Feb. 13, 2024.
Cook et al., U.S. Appl. No. 18/440,741, filed Feb. 13, 2024.
Stowell et al., U.S. Appl. No. 18/440,753, filed Feb. 13, 2024.
Cook et al., U.S. Appl. No. 18/440,769, filed Feb. 13, 2024.
Stowell et al., U.S. Appl. No. 18/596,390, dated Mar. 5, 2024.
Non-Final Office Action from U.S. Appl. No. 18/596,390, dated May 28, 2024.
Non-Final Office Action from U.S. Appl. No. 17/940,246, dated Jun. 5, 2024.
Office Action from Taiwanese Application No. 112135663, dated May 21, 2024, 13 pages.
Final Office Action from U.S. Appl. No. 18/596,390, dated Jun. 28, 2024.
Non-Final Office Action from U.S. Appl. No. 18/440,806, dated Jul. 15, 2024.
Cook et al., U.S. Appl. No. 18/952,878, filed Nov. 19, 2024.
Corrected Notice of Allowance from U.S. Appl. No. 18/440,806, dated Nov. 15, 2024.

(56) References Cited

OTHER PUBLICATIONS

Corrected Notice of Allowance from U.S. Appl. No. 18/440,806, dated Dec. 4, 2024.
Non-Final Office Action from U.S. Appl. No. 18/952,878, dated Jan. 16, 2025.
Non-Final Office Action from U.S. Appl. No. 18/440,806, dated Feb. 27, 2025.
Anzelmo et al., U.S. Appl. No. 19/083,318, filed Mar. 18, 2025.
Notice of Allowance from U.S. Appl. No. 18/440,806, dated Apr. 9, 2025.

* cited by examiner $C = \varepsilon * (A/d)$
$R = (1/\sigma)*(d/A)$

SAMPLE RESPONSES
601B

800 sMIM-C OVERLAY TO
TOPOGRAPHY

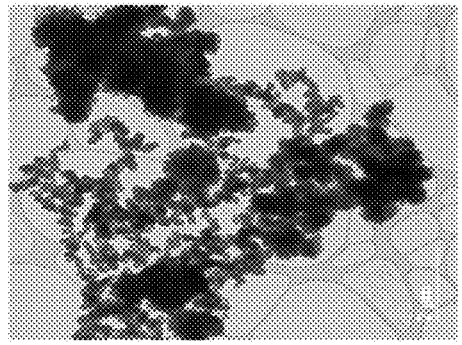
FIG. 10G
FIG. 10H
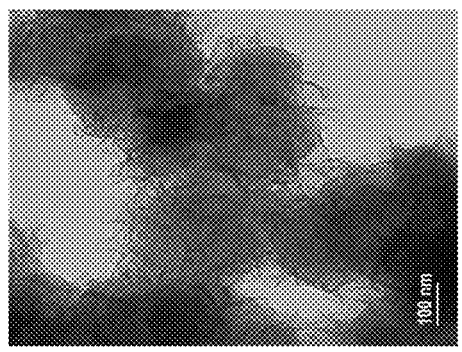
FIG. 10I
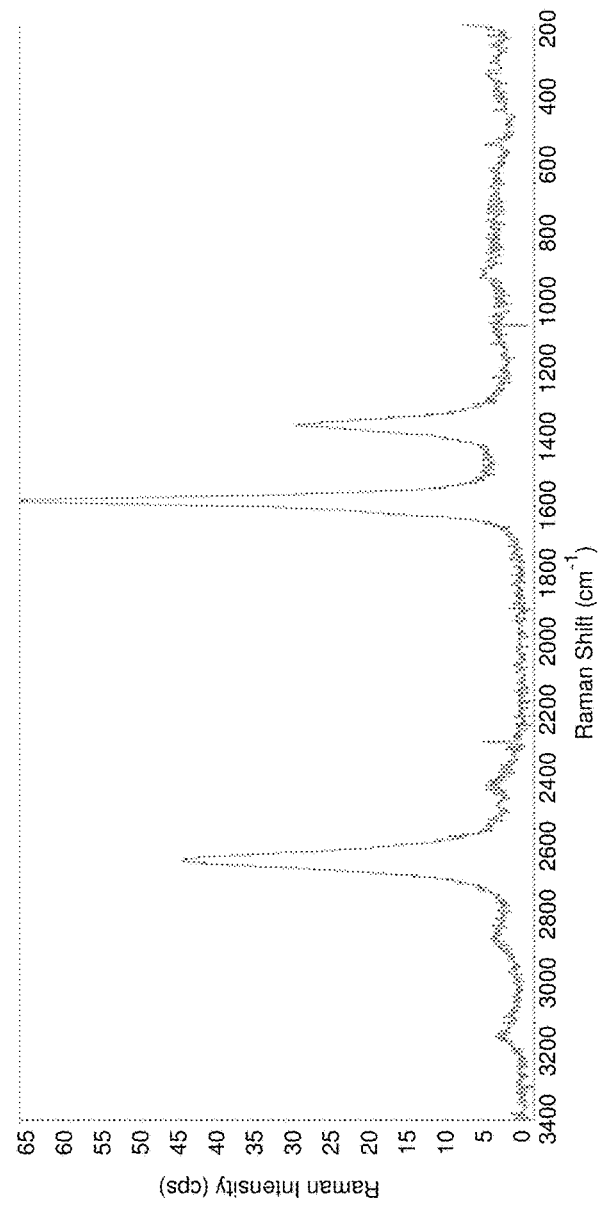
FIG. 10J

FREQUENCY SELECTIVE METAMATERIAL FOR PROTECTIVE ENCLOSURES

CROSS-REFERENCE TO RELATED APPLICATIONS

This Patent Application is a continuation-in-part of and claims the benefit of priority to U.S. patent application Ser. No. 18/440,806, entitled "RECONFIGURING A SECOND TYPE OF SENSOR BASED ON SENSING DATA OF A FIRST TYPE OF SENSOR," filed Feb. 13, 2024, and U.S. patent application Ser. No. 18/230,080, entitled "LEAKY COAXIAL RESONANT SENSOR SYSTEMS AND METHODS," filed Aug. 3, 2023, all of which are to the assignee hereof; the disclosure of the prior Applications are considered part of and incorporated by reference in this Patent Application.

U.S. patent application Ser. No. 18/440,806 claims the benefit of priority to: U.S. Provisional Patent Application No. 63/525,346, entitled "SYSTEM, METHOD, AND COMPUTER PRODUCT FOR DIGITAL SIGNATURE-BASED SENSORS" filed Jul. 6, 2023; U.S. Provisional Patent Application No. 63/532,859, entitled "SYSTEM AND METHOD OF SPATIAL SENSING WITHIN A CONTAINER" filed Aug. 15, 2023; U.S. Provisional Patent Application No. 63/445,948, entitled "SENSORS INCORPORATED INTO SEMI-RIGID STRUCTURAL MEMBERS TO DETECT PHYSICAL CHARACTERISTIC CHANGES" filed Feb. 15, 2023; U.S. Provisional Patent Application No. 63/531,657, entitled "SCOPE SENSORS IN THE INTERNET FOG" filed Aug. 9, 2023; U.S. Provisional Patent Application No. 63/622,464, entitled "SYSTEM AND METHOD FOR TRACKING INDIRECT GREENHOUSE GAS EMISSIONS THROUGHOUT A PRODUCT'S LIFECYCLE" filed Jan. 18, 2024, all of which are assigned to the assignee hereof; the disclosures of all prior Applications are considered part of and are incorporated by reference in this Patent Application.

U.S. patent application Ser. No. 18/230,080 claims the benefit of priority to U.S. Provisional Patent Application No. 63/525,622, entitled "WATER DROPLET SENSING SYSTEMS AND METHODS" filed Jul. 7, 2023, U.S. Provisional Patent Application No. 63/408,372, entitled "RESONANT SENSORS FOR ENVIRONMENTAL HEALTH RISK DETECTION" filed Sep. 20, 2022, and U.S. Provisional Patent Application No. 63/445,948, entitled "SENSORS INCORPORATED INTO SEMI-RIGID STRUCTURAL MEMBERS TO DETECT PHYSICAL CHARACTERISTIC CHANGES" filed Feb. 15, 2023, all of which are assigned to the assignee hereof; the disclosures of all prior Applications are considered part of and are incorporated by reference in this Patent Application.

U.S. patent application Ser. No. 18/230,080 is a continuation-in-part of and claims the benefit of priority to U.S. patent application Ser. No. 17/940,256, entitled "SENSORS INCORPORATED INTO AIRBORNE VEHICLE COMPONENTS TO DETECT PHYSICAL CHARACTERISTIC CHANGES" filed Sep. 8, 2022, which is assigned to the assignee hereof; the disclosures of which is considered part of and are incorporated by reference in this Patent Application.

U.S. patent application Ser. No. 17/940,256 claims the benefit of priority to: U.S. Provisional Patent Application No. 63/242,270, entitled "SENSORS INCORPORATED INTO SEMI-RIGID STRUCTURAL MEMBERS TO DETECT PHYSICAL CHARACTERISTIC CHANGES" filed Sep. 9, 2021; U.S. Provisional Patent Application No. 63/247,680, entitled "SENSORS INCORPORATED INTO SEMI-RIGID STRUCTURAL MEMBERS TO DETECT PHYSICAL CHARACTERISTIC CHANGES" and filed Sep. 23, 2021; U.S. Provisional Patent Application No. 63/276,274, entitled "SENSORS INCORPORATED IN VEHICLE COMPONENTS TO DETECT PHYSICAL CHARACTERISTIC CHANGES, and filed Nov. 5, 2021; and U.S. Provisional Patent Application No. 63/281,846, entitled "SENSORS INCORPORATED INTO AIRBORNE VEHICLE COMPONENTS TO DETECT PHYSICAL CHARACTERISTIC CHANGES" and filed Nov. 22, 2021, all of which are assigned to the assignee hereof; the disclosures of all prior Applications are considered part of and are incorporated by reference in this Patent Application.

U.S. patent application Ser. No. 17/940,256 is also a continuation-in-part of and claims the benefit of priority to U.S. patent application Ser. No. 17/227,249, entitled "TUNED RADIO FREQUENCY (RF) RESONANT MATERIALS AND MATERIAL CONFIGURATIONS FOR SENSING IN A VEHICLE" and filed on Apr. 9, 2021, which in turn, claims the benefit of priority to U.S. Provisional Patent Application No. 63/008,262, entitled "RESONANCE SENSING IN TIRES" and filed on Apr. 10, 2020, and to U.S. Provisional Patent Application No. 63/036,796, entitled "RESONANCE SENSING IN ELASTOMER-CONTAINING PRODUCTS" and filed on Jun. 9, 2020, all of which are assigned to the assignee hereof; the disclosures of all prior Applications are considered part of and are incorporated by reference in this Patent Application.

U.S. patent application Ser. No. 17/227,249 is also a continuation-in-part of and claims the benefit of priority to U.S. patent application Ser. No. 16/829,355, entitled "TIRES CONTAINING RESONATING CARBON-BASED MICROSTRUCTURES" and filed on Mar. 25, 2020, which in turn, claims the benefit of priority to U.S. Provisional Patent Application No. 62/985,550, entitled "RESONANT SERIAL NUMBER IN VEHICLE TIRES" and filed on Mar. 5, 2020, to U.S. Provisional Patent Application No. 62/979,215, entitled "WASTE ENERGY HARVESTING AND POWERING IN VEHICLES" and filed on Feb. 20, 2020, and to U.S. Provisional Patent Application No. 62/824,440, entitled "TUNING RESONANT MATERIALS FOR VEHICLE SENSING" and filed on Mar. 27, 2019, all of which are assigned to the assignee hereof; the disclosures of all prior Applications are considered part of and are incorporated by reference in this Patent Application.

U.S. patent application Ser. No. 17/940,256 is a continuation-in-part of and claims the benefit of priority to U.S. patent application Ser. No. 17/340,493, entitled "SENSORS INCORPORATED INTO ELASTOMERIC MATERIALS TO DETECT ENVIRONMENTALLY-CAUSED PHYSICAL CHARACTERISTIC CHANGES" and filed on Jun. 7, 2021, which in turn, claims the benefit of priority to U.S. Provisional Patent Application No. 63/036,118, entitled "CARBON-CONTAINING STICTION SENSORS" and filed on Jun. 8, 2020, to U.S. Provisional Patent Application No. 63/094,223, entitled "SENSORS FOR ELASTOMER PROPERTY CHANGE DETECTION" and filed on Oct. 20, 2020, and to, U.S. Provisional Patent Application No. 63/036,796, entitled "RESONANCE SENSING IN ELASTOMER-CONTAINING PRODUCTS" and filed on Jun. 9, 2020, all of which are assigned to the assignee hereof; the disclosures of all prior Applications are considered part of and are incorporated by reference in this Patent Application.

U.S. patent application Ser. No. 17/340,493 is also a continuation-in-part of and claims the benefit of priority to U.S. patent application Ser. No. 16/829,355, entitled "TIRES CONTAINING RESONATING CARBON-BASED MICROSTRUCTURES" and filed on Mar. 25, 2020, which in turn, claims the benefit of priority to U.S. Provisional Patent Application No. 62/824,440, entitled "TUNING RESONANT MATERIALS FOR VEHICLE SENSING" and filed on Mar. 27, 2019, all of which are assigned to the assignee hereof; the disclosures of all prior Applications are considered part of and are incorporated by reference in this Patent Application.

FIELD OF THE INVENTION

This disclosure relates to protective enclosures for electronic systems, and more particularly to techniques for tuning frequency selective surfaces of such protective enclosures.

BACKGROUND

The field of electronics has seen a rapid advancement in recent years, with devices becoming increasingly sophisticated and interconnected. These electronic systems, including communication devices, computing devices, and sensing equipment, often operate at specific frequencies and are susceptible to electromagnetic interference (EMI). EMI can disrupt the normal operation of these devices, leading to performance degradation or even complete failure. Therefore, there is a constant demand for effective shielding solutions to protect these electronic systems from EMI.

Traditional shielding solutions often involve the use of Faraday cages, which work by conducting and reflecting electromagnetic waves. However, these solutions have their limitations. For instance, they may not be effective against all frequencies of electromagnetic waves, and they may not be suitable for use with devices that require wireless communication. Moreover, Faraday cages are typically made of metal, which can be heavy and bulky, limiting their applicability in portable or space-constrained devices.

As such, there is thus a need for addressing these and/or other issues associated with the prior art.

SUMMARY

In some aspects, the techniques described herein relate to a protective enclosure for electronic systems, including: a polymer-containing matrix; and a metamaterial incorporated into or embedded within the polymer-containing matrix, the metamaterial being tuned to a specific permittivity or permeability to absorb or reflect a particular frequency of electromagnetic interference.

In some aspects, the techniques described herein relate to a protective enclosure, wherein the metamaterial includes carbon nanoparticles and aggregates.

In some aspects, the techniques described herein relate to a protective enclosure, wherein the carbon nanoparticles are tuned to absorb a specific frequency of electromagnetic interference.

In some aspects, the techniques described herein relate to a protective enclosure, wherein the carbon nanoparticles are tuned to reflect a specific frequency of electromagnetic interference.

In some aspects, the techniques described herein relate to a protective enclosure, wherein the polymer-containing matrix includes a thermoplastic material.

In some aspects, the techniques described herein relate to a protective enclosure, wherein the metamaterial is embedded within the polymer-containing matrix in at least one selected from the group of a uniform distribution, a layered structure, a grid-like structure, and a random structure.

In some aspects, the techniques described herein relate to a protective enclosure, wherein the metamaterial is tuned to allow wireless communication signals in a frequency band associated with Wi-Fi or cellular communication.

In some aspects, the techniques described herein relate to a protective enclosure, wherein the metamaterial is tuned to absorb electromagnetic interference in a specific frequency band while allowing wireless communication signals in a different frequency band to pass through.

In some aspects, the techniques described herein relate to a protective enclosure, wherein the metamaterial is tuned to absorb electromagnetic interference in a frequency band associated with radio frequency interference.

In some aspects, the techniques described herein relate to a protective enclosure, wherein the metamaterial is embedded within the polymer-containing matrix in a manner that allows for application of an external stimulus to the metamaterial after the formation of the protective enclosure.

In some aspects, the techniques described herein relate to a protective enclosure, wherein the external stimulus includes at least one selected from the group of heat, light, and an electric field.

In some aspects, the techniques described herein relate to a protective enclosure, wherein the external stimulus is configured to cause a change in the metamaterial to absorb or reflect a different particular frequency.

In some aspects, the techniques described herein relate to a protective enclosure, wherein the polymer-containing matrix is a coated surface layer of the protective enclosure.

In some aspects, the techniques described herein relate to a protective enclosure, wherein the polymer-containing matrix is embedded into a structure of the protective enclosure.

In some aspects, the techniques described herein relate to a protective enclosure, wherein the metamaterial is configured to enhance a performance of at least one selected from the group of: an antenna housed within the protective enclosure, a telemetry module housed within the protective enclosure, a communication device housed within the protective enclosure, a computing device housed within the protective enclosure, a sensing equipment housed within the protective enclosure, a battery pack that includes telemetry devices for sending alert signals to safety systems housed within the protective enclosure, and a device that requires uninterrupted wireless telemetry housed within the protective enclosure.

In some aspects, the techniques described herein relate to a protective enclosure, wherein the metamaterial is configured with a non-metallic material.

In some aspects, the techniques described herein relate to a protective enclosure, wherein the metamaterial is configured to protect against electromagnetic disturbances, wherein the electromagnetic disturbances includes at least one selected from the group of electromagnetic radiation, electromagnetic interference, radio frequency interference, electromagnetic pulse, data interception, static electricity, and preconfigured electromagnetic frequencies.

In some aspects, the techniques described herein relate to a protective enclosure, wherein the metamaterial is configured to repeal, at a first level of the metamaterial, a preconfigured electromagnetic first frequency or a first set of frequencies, and to absorb, at a second level of the metamaterial, a preconfigured electromagnetic second frequency or a second set of frequencies.

In some aspects, the techniques described herein relate to a protective enclosure, further including an impedance sheet, located on a first side of the metamaterial, and a conducting backplane, located on a second side of the metamaterial, wherein the impedance sheet is configured to reflect or shield a first set of preconfigured frequencies, the metamaterial is configured to absorb a second set of preconfigured frequencies, and the conducting backplane is configured to reflect a third set of preconfigured frequencies.

In some aspects, the techniques described herein relate to a protective enclosure, wherein the impedance sheet is configured such that only a fraction of incoming electromagnetic waves pass through the impedance sheet and reach the metamaterial.

In some aspects, the techniques described herein relate to a protective enclosure for electronic systems, including: a polymer-containing matrix; a first metamaterial embedded within the polymer-containing matrix, the first metamaterial having a specific permittivity or permeability to absorb a particular frequency of electromagnetic energy; and a second metamaterial embedded within the polymer-containing matrix, the second metamaterial configure to allow specific communication frequencies to pass through the protective enclosure.

In some aspects, the techniques described herein relate to a protective enclosure, wherein the first metamaterial includes carbon nanoparticles.

In some aspects, the techniques described herein relate to a protective enclosure, wherein the carbon nanoparticles are tuned to absorb a specific frequency of electromagnetic energy by adjusting their size, shape, or composition.

In some aspects, the techniques described herein relate to a protective enclosure, wherein the second metamaterial includes a frequency selective surface.

In some aspects, the techniques described herein relate to a protective enclosure, wherein the frequency selective surface is configured to allow electromagnetic radiation in a communication band to pass through while reflecting or absorbing other frequencies.

In some aspects, the techniques described herein relate to a protective enclosure, wherein the polymer-containing matrix includes a thermoplastic material.

In some aspects, the techniques described herein relate to a protective enclosure, wherein the first metamaterial is embedded within the polymer-containing matrix in a uniform distribution.

In some aspects, the techniques described herein relate to a protective enclosure, wherein the first metamaterial is embedded within the polymer-containing matrix in a layered structure.

In some aspects, the techniques described herein relate to a protective enclosure, wherein the first metamaterial is embedded within the polymer-containing matrix in a grid-like structure.

In some aspects, the techniques described herein relate to a protective enclosure, wherein the first metamaterial is embedded within the polymer-containing matrix in a random structure.

In some aspects, the techniques described herein relate to a protective enclosure. wherein the first metamaterial is embedded within the polymer-containing matrix in a manner that allows for the application of an external stimulus to the first metamaterial after the formation of the protective enclosure.

DETAILED DESCRIPTION

Figure 1A:
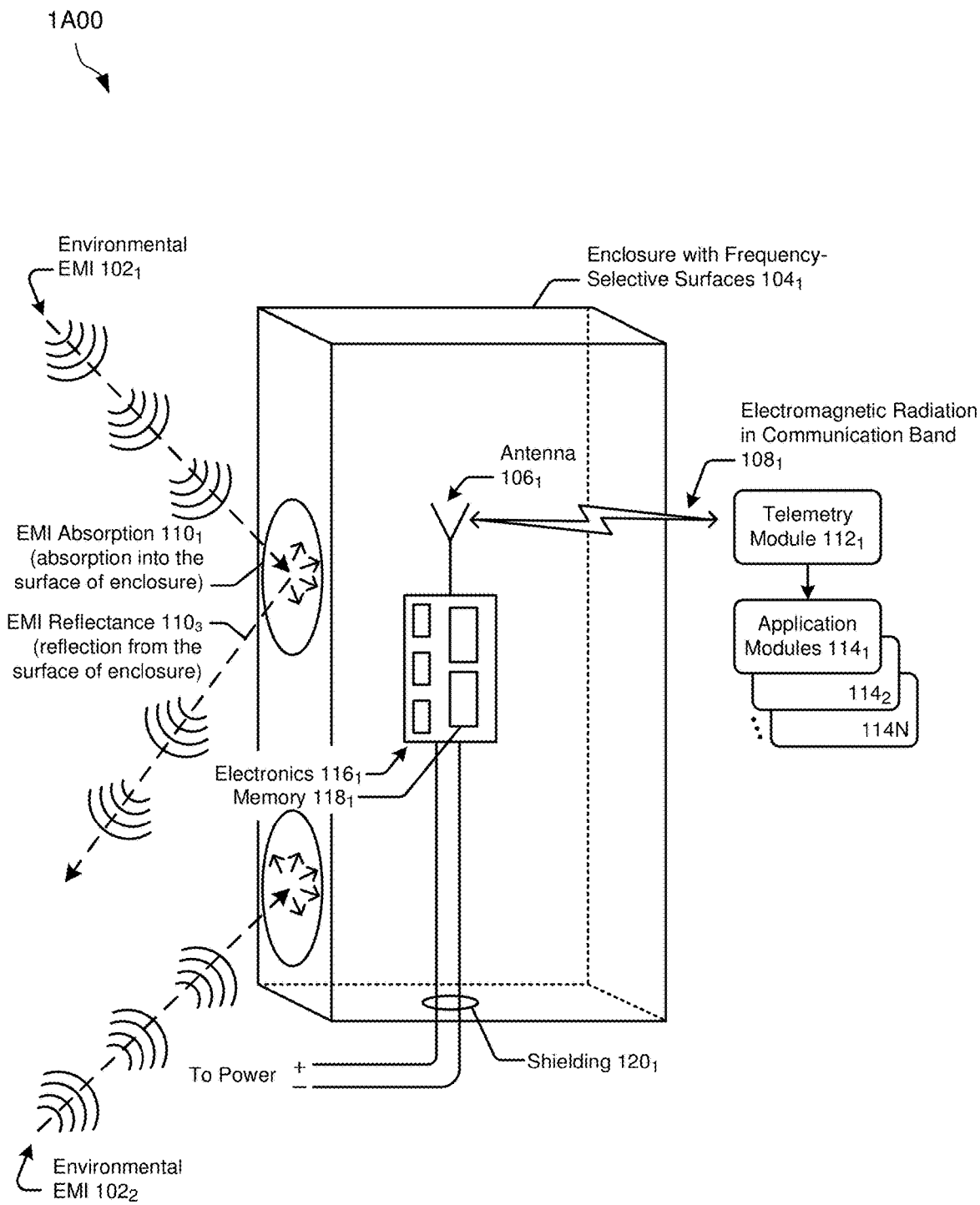
FIG. 1A shows a protective enclosure for an electronic system, according to an embodiment.

Aspects of the present disclosure solve problems associated with creating a safe inner environment for electronic components while facilitating uninterrupted wireless communications to/from the outer environment. Some implementations are directed to approaches for absorbing certain frequency bands of electromagnetic interference while permitting wireless communications in different electromagnetic communication bands. The accompanying figures and discussions herein describe how to make and use frequency selective protective enclosures for electronic systems.

Electromagnetic interference (EMI) is everywhere. In some situations, electromagnetic interference interferes with wireless telemetry. Legacy approaches to handling EMI are deficient, at least in that EMI protections fail to account for all conditions under which the wireless telemetry is intended to continue uninterrupted.

What is needed are improved approaches. More particularly, there is a large commercial market for hardened cases made of polymers, such as polypropylene. Such hardened cases provide mechanical protection (such as vibration) and impact protection (such as droppage) of fragile equipment and cargo contained therein, in particular electronic devices. Strictly as examples, such electronic systems may include remote power generators, field medical systems, portable and/or vehicle-mounted sensing equipment, global positioning equipment, as well as communication devices of all types, computing devices of all types, etc.

Any/all of the foregoing devices, plus others that may not have been listed are subject to compromise or even catastrophic failure if/when subjected to unwanted EMI, RF, or other energy sources.

Legacy methods for protecting electrical devices and electrically powered systems from compromise and/or failure due to EMI noise, RF noise and other electromagnetic energy sources include use of a "Faraday Cage". A Faraday cage is a metal structure that completely encloses internal electronics and shields the internal electronics from harmful energy waves by reflecting the energies. Unfortunately, Faraday cages are expensive, often heavy and can only support a limited set of physical design characteristics. Any leak of EMI through the cage (such as through cracks, seams, or unshielded areas of the container) may result in compromise or, in some cases irreversible incapacitation of the electrical devices (such as memory devices) inside the cage. Moreover, Faraday cages cannot be tuned to let some frequencies pass, while other frequencies are reflected.

Disclosed herein are techniques to make and use frequency selective electroactive metamaterials. More specifically, disclosed herein are techniques to incorporate frequency selective electroactive metamaterials into polymers that are in turn molded into protective enclosures. The frequency selective electroactive metamaterials can be tuned such that when they are incorporated into a protective enclosure (such as on the surfaces of the enclosure or embedded within a material of the enclosure) they are configured to (1) absorb the otherwise harmful energy (such as RF interference), and at the same time (2) allow other frequencies to penetrate in and out of the protective enclosures. As such, RF-based telemetry between the inner environment (such as within the protective enclosure) and the outer environment (such as outside of the protective enclosure) can be carried out uninterrupted-even when the local outer environment is extremely and/or dangerously noisy.

One application family where RF-based telemetry between the inner environment (such as within the protective enclosure) and the outer environment (such as outside of the protective enclosure) needs to be carried out are communication equipment applications that need to allow a communication device (such as a transceiver) to continue to send and receive signals to/from electronic components that are situated outside the protective enclosure-even while at the same time the outer environment is rife with debilitating frequencies that would otherwise (such as in absence of use of the herein-disclosed protective enclosure technologies) debilitate the electronics systems within the protective enclosure.

Another application family where RF-based telemetry between the inner environment (such as within the protective enclosure) and the outer environment (such as outside of the protective enclosure) needs to be carried out are battery packs that include telemetry devices for sending alert signals to safety systems that are situated outside the protective enclosure-even while at the same time the outer environment is rife with debilitating frequencies that would otherwise (such as in absence of use of the herein-disclosed protective enclosure technologies) the telemetry.

In these and other applications, the foregoing approaches for producing metamaterial-based frequency selective surface cure the deficiencies of Faraday cages. Further, protective enclosures that result from practice of the herein-disclosed protective enclosure technologies are lighter and more manufacturable than metal Faraday cages. Moreover, when the herein-disclosed tuned metamaterials are incorporated into a polymer, the resulting matrix composite may lend itself to multiple types of manufacturing processes (such as injection molding and roto-molding, etc.), thus facilitating a broad array container design flexibility.

In various other embodiments, the present disclosure provides techniques for the creation and utilization of frequency selective metamaterials in protective enclosures for electronic systems. These techniques address the challenge of mitigating electromagnetic interference (EMI) that can compromise the functionality of electronic systems. The disclosed technology focuses on the tuning of metamaterials to specific permittivity and/or permeability, and their subsequent incorporation into a polymer-containing matrix to form a protective enclosure.

This approach offers a novel solution to protect electronic systems from harmful energy waves, while simultaneously allowing for uninterrupted wireless communications. The disclosed technology offers a distinct advantage over traditional Faraday cages, which are typically heavy, expensive, and limited in their physical design characteristics. The disclosed metamaterials, when incorporated into protective enclosures, can absorb or reflect specific frequency bands of electromagnetic interference, while permitting other frequencies to penetrate, thus facilitating uninterrupted wireless communication. This technology has potential applications in a variety of fields, including but not limited to, communication equipment that requires uninterrupted wireless telemetry, and battery packs that include telemetry devices for sending alert signals to safety systems.

Definitions and Use of Figures

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Various embodiments are described herein with reference to the figures. It should be noted that the figures are not necessarily drawn to scale, and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment.

An aspect or an advantage described in conjunction with a particular embodiment is not necessarily limited to that embodiment and can be practiced in any other embodiments even if not so illustrated. References throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments. The disclosed embodiments are not intended to be limiting of the claims.

Descriptions of Exemplary Embodiments

FIG. 1A shows a protective enclosure 1A00 for an electronic system. As an option, one or more variations of protective enclosure 1A00 for an electronic system or any aspect thereof may be implemented in the context of the architecture and functionality of the implementations described herein. The protective enclosure 1A00 for an electronic system or any aspect thereof may be implemented in any environment.

As shown, the protective enclosure system 1A00 is designed to shield various electronic systems from environmental EMI $102_1$ and/or environmental EMI $102_2$ In some cases, the electronic systems protected by the protective enclosure 1A00 may include communication devices, computing devices, power devices, or sensing equipment. The protective enclosure 1A00 with frequency-selective surfaces $104_1$ is designed to absorb EMI absorption $110_1$, thereby preventing the environmental EMI $102_1$ and/or $102_2$ from reaching the electronic systems housed within the enclosure. In another embodiment, the protective enclosure 1A00 is designed to reflect EMI reflectance $110_3$, thereby preventing the environmental EMI $102_1$ and/or $102_2$ from reaching the electronic systems housed within the enclosure The protective enclosure system 1A00 also includes an antenna 1061, which is positioned within the enclosure to facilitate electromagnetic radiation in the communication band $108_1$. The antenna $106_1$ may be connected to electronics $116_1$ and/or memory $118_1$, both of which may be susceptible to environmental EMI $102_1$ and/or $102_1$ (and are in need of the enclosure with frequency-selective surfaces $104_1$). Additionally, shielding $120_1$ may be used to shield power to and from the electronics $116_1$ and/or otherwise protect the internal electronics from outside influences (such as the environmental EMI $102_1$ and/or $102_2$).

The antenna $106_1$ may serve as a conduit for wireless communications, allowing signals to be transmitted and received without being affected by the environmental EMI $102_1$ and/or $102_2$. This may be of particular benefit for electronic systems (including the electronics $116_1$ and/or memory $118_1$) that may rely on wireless communications, as it ensures that their communication capabilities are not compromised by the presence of environmental EMI $102_1$ and/or $102_2$. The wireless communication may include electromagnetic radiation in communication band $108_1$, which may include a telemetry module $112_1$.

The telemetry module $112_1$ may include a sensor array consisting of multiple sensors configured to measure diverse parameters pertinent to the specific application. The sensor array may be connected to a communication interface, which may include wireless transceivers, satellite uplinks, or wired connections to ensure reliable data transmission. Further, the processing unit may be integrated into the wireless module to perform data preprocessing, including noise reduction, data compression, and preliminary analysis. The processed data may be then transmitted via a communication interface to a remote processing center for comprehensive analysis and long-term storage.

In this manner, the application modules $114_1$, $114_2$, and/or $114_N$ may be configured to work with the wireless module (such as the electromagnetic radiation in communication band $108_1$) for data transmission, processing, remote actions, data management, etc. The application modules may include a sensor array to collect various types of data, and a wireless communication interface that supports protocols like Wi-Fi, Bluetooth, Zigbee, and cellular networks. A processing unit within the application modules $114_1$, $114_2$, and/or $114_N$ handles data collection, preliminary processing, and communication tasks. In some embodiments, the application modules $114_1$, $114_2$, and/or $114_N$ may be configured for remote work and/or application.

In some aspects, the protective enclosure system 100 may be configured to allow specific frequencies to pass through while blocking others. This can be achieved by tuning the metamaterial incorporated into the polymer-containing matrix to a specific permittivity and/or permeability. By doing so, the protective enclosure 1A00 can effectively filter out harmful frequencies while allowing desired frequencies to pass through, shown as enclosure with frequency-selective surfaces $104_1$. Further, the matrix may include a variety of types of metamaterial, each configured to reflect or allow predetermined frequencies.

This selective frequency absorption or reflection capability of the protective enclosure 1A00 provides a distinct advantage over traditional shielding methods, which typically block all frequencies indiscriminately.

In the context of the present description, a metamaterial is configured with properties that are not found in naturally occurring materials. For example, a metamaterial may include a synthetic composite material engineered to exhibit electromagnetic, acoustic, or mechanical properties not achievable with naturally occurring substances.

As a particular example, the metamaterial may comprise an array of structural elements, which are arranged in a periodic or non-periodic configuration, with dimensions smaller than the wavelength of the external stimulus (e.g., electromagnetic radiation, sound waves). These structural elements may be designed to manipulate the propagation characteristics of the external stimulus in a predetermined manner, resulting in altered reflection, refraction, absorption, or transmission properties that are not inherent to the individual constituent materials. The metamaterial may be configured to achieve functionalities such as negative refractive index, superlensing, cloaking, or enhanced wave control, and is applicable across a range of frequencies, including but not limited to, radio, microwave, terahertz, infrared, visible, and ultraviolet spectrums, as well as acoustic and elastic waves. As such, a metamaterial may include any material configured with properties not found in naturally occurring materials.

In various embodiments, the protective enclosure 1A00 may include a polymer-containing matrix. In some aspects, the polymer-containing matrix may be composed of a thermoplastic material. The protective enclosure may also include a metamaterial that is incorporated into the polymer-containing matrix. The metamaterial may be tuned to a specific permittivity and/or permeability to absorb or reflect a particular frequency of electromagnetic interference. In some cases, the metamaterial may be tuned to absorb a specific frequency of electromagnetic interference. In other cases, the metamaterial may be tuned to reflect a specific frequency of electromagnetic interference.

In various embodiments, the metamaterial may be incorporated into the polymer-containing matrix by embedding the metamaterial within the matrix. This incorporation process may involve dispersing the metamaterial throughout the polymer-containing matrix in a manner that ensures a uniform distribution of the metamaterial within the matrix. The incorporation of the metamaterial into the polymer-containing matrix may be achieved through various methods, such as mixing, blending, or compounding the metamaterial with the polymer material prior to or during the formation of the matrix. It is to be appreciated that the metamaterial may be applied, in an alternative manner, to an exterior surface of the polymer (and/or a material of the structure).

In various embodiments, once the metamaterial is incorporated into the polymer-containing matrix, a protective enclosure may be formed from the metamaterial-containing matrix. The formation of the protective enclosure may involve various manufacturing processes, such as molding, extrusion, or casting, depending on the specific requirements of the electronic systems to be protected. The protective enclosure formed from the metamaterial-containing matrix provides a barrier that can absorb or reflect specific frequencies of electromagnetic interference, thereby protecting the electronic systems housed within the enclosure from harmful electromagnetic interference.

Figure 1B:
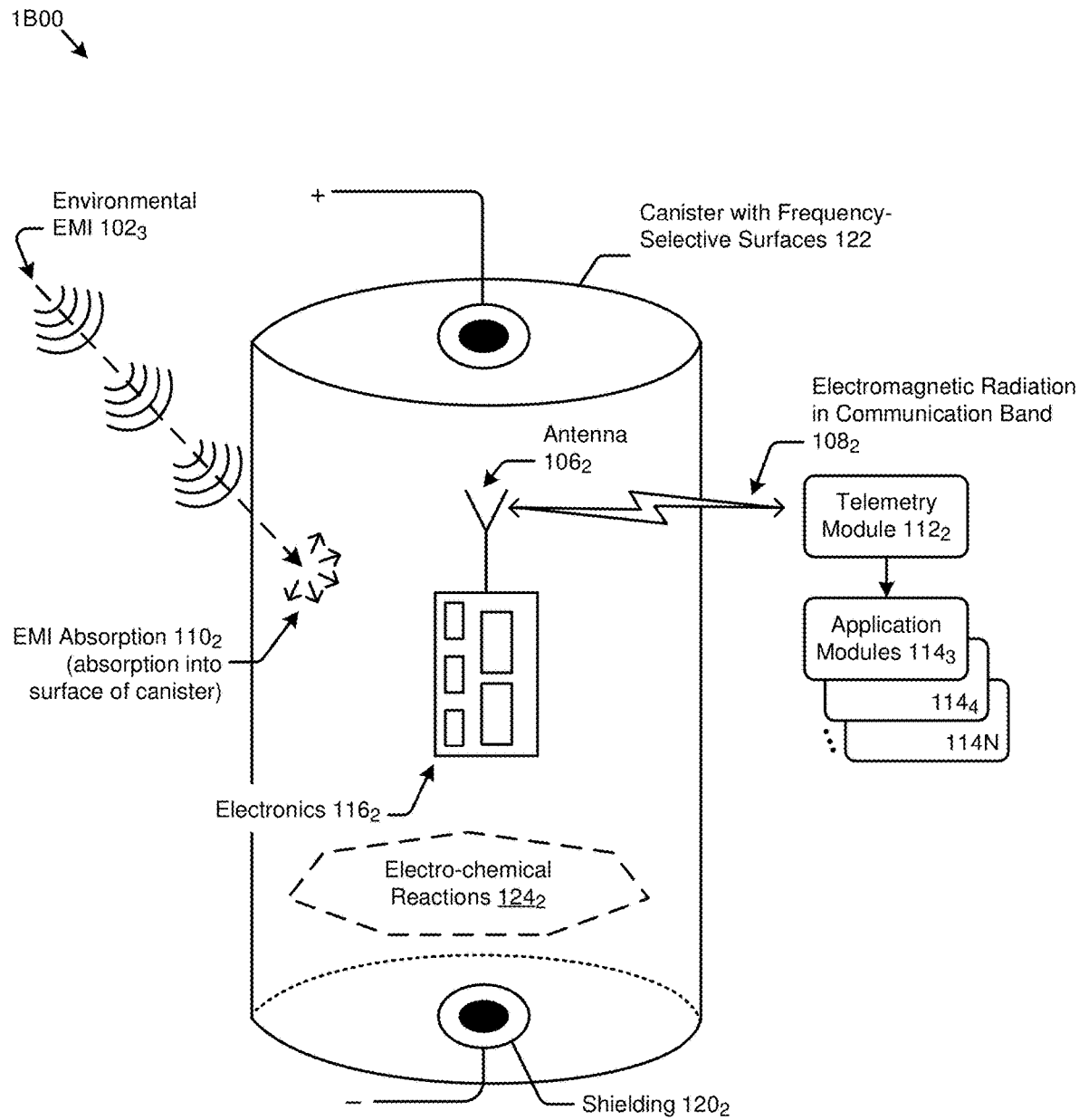
FIG. 1B shows a protective canister for an electronic system, according to an embodiment.

FIG. 1B shows a protective canister 1B00 for an electronic system. As an option, one or more variations of protective canister 1B00 for an electronic system or any aspect thereof may be implemented in the context of the architecture and functionality of the implementations described herein. The protective canister 1B00 for an electronic system or any aspect thereof may be implemented in any environment.

As shown, the canister system 1B00 is depicted as another example of a protective enclosure for electronic systems. Similar to the protective enclosure 1A00 described above in the context of FIG. 1A, the canister system may include a polymer-containing matrix and a metamaterial embedded within the polymer-containing matrix. The metamaterial in the canister system may also be tuned to a specific permittivity and/or permeability to absorb or reflect a particular frequency of electromagnetic interference.

It is to be appreciated that the canister system 1B00 may be representative of any closed-system assembly. For example, the canister system 1B00 may include a cylindrical battery, a chemical drum, a gas cylinder, a jerry can, a key, a vial, etc. In one embodiment, the canister system 1B00 may be configured to contain an electro-chemical reaction $124_2$, which may include any transfer of electrons between chemical species. In one embodiment, the electro-chemical reaction $124_2$ may include a redox configuration, with an anode undergoing oxidation, while the cathode undergoes reduction. It is to be appreciated that the electro-chemical reactions $124_2$ is just one type of contents within the canister system 1B00.

In a similar manner to the protective enclosure 1A00, the canister system 1B00 shows environmental EMI $120_3$ which may be absorbed in a surface or layer of the canister, in one embodiment, via the EMI absorption $110_2$. Such absorption may be predicated on configuring the canister system 1B00 with frequency-selective surfaces 122.

Further, the canister system 1B00 may include an antenna $106_2$ that facilitates electromagnetic radiation in communication band $108_2$. The antenna $106_2$ may be configured to transmit and receive signals within a specific frequency band, allowing for uninterrupted wireless communication with the electronics $116_2$ housed within the canister system 1B00.

The canister system 1B00 may also include a telemetry module $112_2$ that interfaces with the antenna $106_2$. The telemetry module $112_2$ may manage the transmission and reception of signals within the communication band $108_2$, ensuring that the electronics $116_2$ within the canister system 1B00 can communicate effectively with external devices or systems. In some cases, the telemetry module $112_2$ may include various components or modules for processing, modulating, and demodulating the signals transmitted and received by the antenna $106_2$.

In addition to the antenna $106_2$ and the telemetry module $112_2$, the canister system 1B00 includes one or more application modules $114_3$, $114_4$, $114_N$. These application modules $114_3$, $114_4$, $114_N$ may operate in a manner consistent with the description relating hereinabove to the application modules $114_1$, $114_2$, $114_N$.

To protect the internal electronics $116_2$ from environmental electromagnetic interference EMI $102_3$, the canister system 1B00 features EMI absorption $110_2$. The EMI absorption $110_2$ represents the ability of the canister system 1B00 to absorb specific frequencies of electromagnetic interference, thereby preventing these frequencies from reaching the internal electronics $116_2$. In one embodiment, the EMI absorption $110_2$ may be achieved through the incorporation of a metamaterial into the polymer-containing matrix of the canister system 1B00. This metamaterial is tuned to a specific permittivity and/or permeability to absorb or reflect a particular frequency of electromagnetic interference, such as via the frequency-selective surfaces 122.

In addition to the EMI absorption $110_2$, the canister system 1B00 includes shielding $120_2$ to provide additional protection for the internal electronics $116_2$. The shielding $120_2$ may be formed from a conductive material and may be configured to reflect or absorb electromagnetic interference that is not absorbed by the EMI absorption $110_2$. The combination of the EMI absorption $110_2$ and the shielding $120_2$ may provide a comprehensive protection solution for the internal electronics $116_2$, ensuring that they can operate effectively and reliably even in environments with high levels of electromagnetic interference and/or outside damaging signals.

In other embodiments, the protective enclosure system 1A00 and the canister system 1B00 may be designed to allow specific communication frequencies to pass through while attenuating other frequencies. This may be achieved by tuning the metamaterial incorporated into the polymer-containing matrix to a specific permittivity and/or permeability. In some aspects, the metamaterial may be tuned to absorb a specific frequency of electromagnetic interference. This means that the metamaterial is configured in such a way that it absorbs electromagnetic interference at a specific frequency, thereby preventing this frequency from interfering with the electronic systems protected by the enclosure. This tuning process involves adjusting the permittivity and/or permeability of the metamaterial to match the specific frequency of the electromagnetic interference that is to be absorbed.

In other cases, the metamaterial may be tuned to reflect a specific frequency of electromagnetic interference. In this scenario, the metamaterial may be configured to reflect electromagnetic interference at a specific frequency, thereby preventing this frequency from reaching the electronic systems protected by the enclosure. This tuning process involves adjusting the permittivity and/or permeability of the metamaterial to match the specific frequency of the electromagnetic interference.

In various embodiments, the techniques described herein relate to a protective enclosure for electronic systems, including: a polymer-containing matrix; and a metamaterial incorporated into or embedded within the polymer-containing matrix, the metamaterial being tuned to a specific permittivity or permeability to absorb or reflect a particular frequency of electromagnetic interference.

In various embodiments, the metamaterial may include carbon nanoparticles and aggregates. Additionally, the carbon nanoparticles may be tuned to absorb a specific frequency of electromagnetic interference, and/or may be tuned to reflect a specific frequency of electromagnetic interference.

In various embodiments, the polymer-containing matrix may include a thermoplastic material. Additionally, the metamaterial may be embedded within the polymer-containing matrix in at least one selected from the group of a uniform distribution, a layered structure, a grid-like structure, and a random structure.

In various embodiments, the metamaterial may be tuned to allow wireless communication signals in a frequency band associated with Wi-Fi or cellular communication. Additionally, the metamaterial may be tuned to absorb electromagnetic interference in a specific frequency band while allowing wireless communication signals in a different frequency band to pass through. Further, the metamaterial may be tuned to absorb electromagnetic interference in a frequency band associated with radio frequency interference.

In various embodiments, the metamaterial may be embedded within the polymer-containing matrix in a manner that allows for application of an external stimulus to the metamaterial after the formation of the protective enclosure. For example, the external stimulus may include at least one selected from the group of heat, light, and an electric field. Additionally, the external stimulus may be configured to cause a change in the metamaterial to absorb or reflect a different particular frequency.

In various embodiments, the polymer-containing matrix may be a coated surface layer of the protective enclosure, and/or may be embedded into a structure of the protective enclosure. Additionally, the metamaterial may be configured to enhance a performance of at least one selected from the group of: an antenna housed within the protective enclosure, a telemetry module housed within the protective enclosure, a communication device housed within the protective enclosure, a computing device housed within the protective enclosure, a sensing equipment housed within the protective enclosure, a battery pack that includes telemetry devices for sending alert signals to safety systems housed within the protective enclosure, and a device that requires uninterrupted wireless telemetry housed within the protective enclosure.

In various embodiments, the metamaterial may be configured with a non-metallic material. Additionally, the metamaterial may be configured to protect against electromagnetic disturbances, wherein the electromagnetic disturbances includes at least one selected from the group of electromagnetic radiation, electromagnetic interference, radio frequency interference, electromagnetic pulse, data interception, static electricity, and preconfigured electromagnetic frequencies.

In various embodiments, the metamaterial may be configured to repeal, at a first level of the metamaterial, a preconfigured electromagnetic first frequency or a first set of frequencies, and to absorb, at a second level of the metamaterial, a preconfigured electromagnetic second frequency or a second set of frequencies. Additionally, the protective enclosure may further include an impedance sheet, located on a first side of the metamaterial, and a conducting backplane, located on a second side of the metamaterial, where the impedance sheet may be configured to reflect or shield a first set of preconfigured frequencies, the metamaterial may be configured to absorb a second set of preconfigured frequencies, and the conducting backplane may be configured to reflect a third set of preconfigured frequencies. Further, the impedance sheet may be configured such that only a fraction of incoming electromagnetic waves pass through the impedance sheet and reach the metamaterial.

Figure 2A:
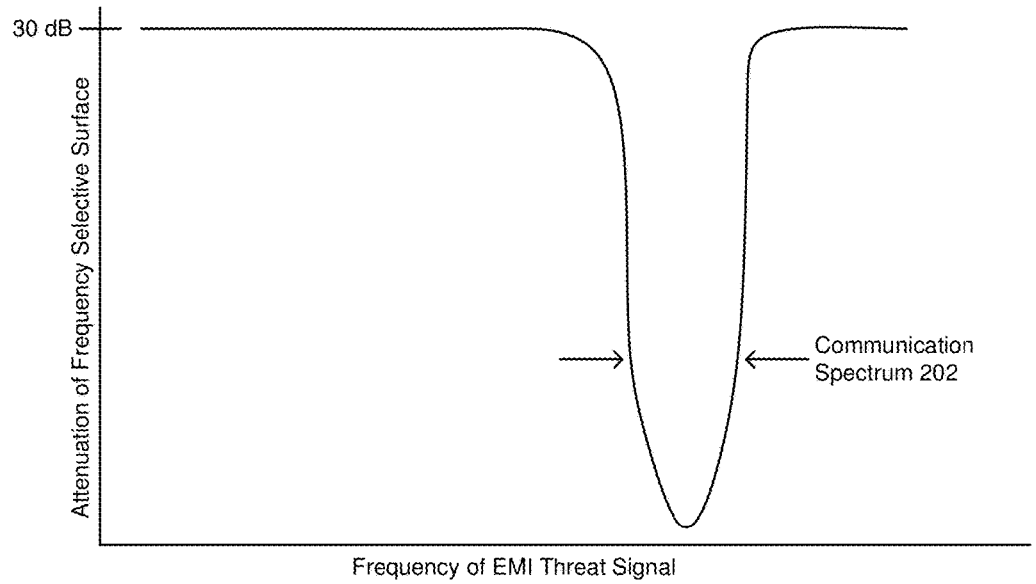
FIG. 2A shows a first example absorption performance chart corresponding to a single notch frequency selective surface, according to an embodiment.

FIG. 2A shows a first example 2A00 absorption performance chart corresponding to a single notch frequency selective surface. As an option, one or more variations of absorption performance chart or any aspect thereof may be implemented in the context of the architecture and functionality of the implementations described herein. The absorption performance chart or any aspect thereof may be implemented in any environment.

As shown, the absorption performance chart 2A00 shows the attenuation of a frequency selective surface across the frequency of an EMI threat signal. The chart highlights a communication spectrum in the first example 202 where the attenuation is minimized, allowing communication signals to pass through. This is achieved by tuning the metamaterial to absorb a specific frequency of electromagnetic interference. In other words, the metamaterial is configured in such a way that it absorbs electromagnetic interference at a specific frequency, thereby preventing this frequency from interfering with the electronic systems protected by the enclosure. This tuning process involves adjusting the permittivity and/or permeability of the metamaterial to match the specific frequency of the electromagnetic interference that is to be absorbed.

Figure 2B:
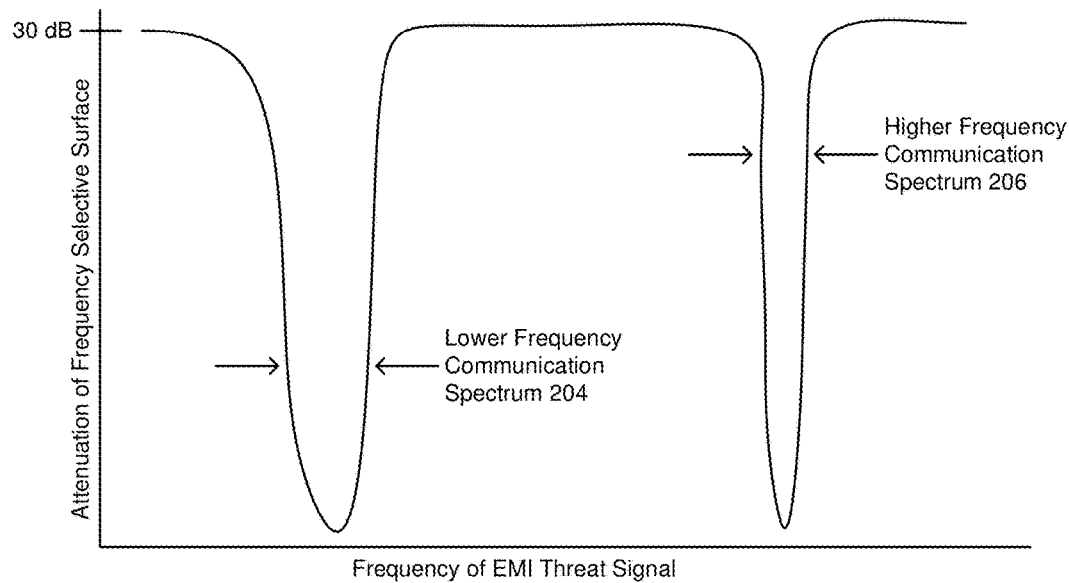
FIG. 2B shows a second example absorption performance chart corresponding to a double notch frequency selective surface, according to an embodiment.

FIG. 2B shows a second example 2B00 absorption performance chart corresponding to a double notch frequency selective surface. As an option, one or more variations of absorption performance chart or any aspect thereof may be implemented in the context of the architecture and functionality of the implementations described herein. The absorption performance chart or any aspect thereof may be implemented in any environment.

As shown, the absorption performance chart 2B00 illustrates a similar concept to the absorption performance chart 2A00 but with two distinct communication spectrums. The lower frequency communication spectrum in the second example 204 and the higher frequency communication spectrum in the second example 206 are both shown with minimized attenuation, indicating that these frequencies are allowed to pass through while other frequencies are attenuated. This is achieved by tuning the metamaterial to reflect a specific frequency of electromagnetic interference. In this case, the metamaterial is configured to reflect electromagnetic interference at a specific frequency, thereby preventing this frequency from reaching the electronic systems protected by the enclosure. This tuning process involves adjusting the permittivity and/or permeability of the metamaterial to match the specific frequency of the electromagnetic interference that is to be reflected.

In particular emphasis, the absorption performance chart 2B00 shows that a metamaterial may be configured to with multiple communication spectrums (i.e. preconfigured frequencies that are permitted). In this manner, the metamaterial may be configured to allow more than one frequency pass through the material.

In some cases, the metamaterial may be tuned to both absorb and reflect specific frequencies of electromagnetic interference. This can be achieved by incorporating different types of metamaterials into the polymer-containing matrix, each tuned to a specific permittivity and/or permeability to absorb or reflect a particular frequency of electromagnetic interference. This may allow for a more comprehensive protection solution, as it may enable the protective enclosure to effectively filter out a wider range of harmful frequencies while allowing desired frequencies to pass through.

Figure 3:
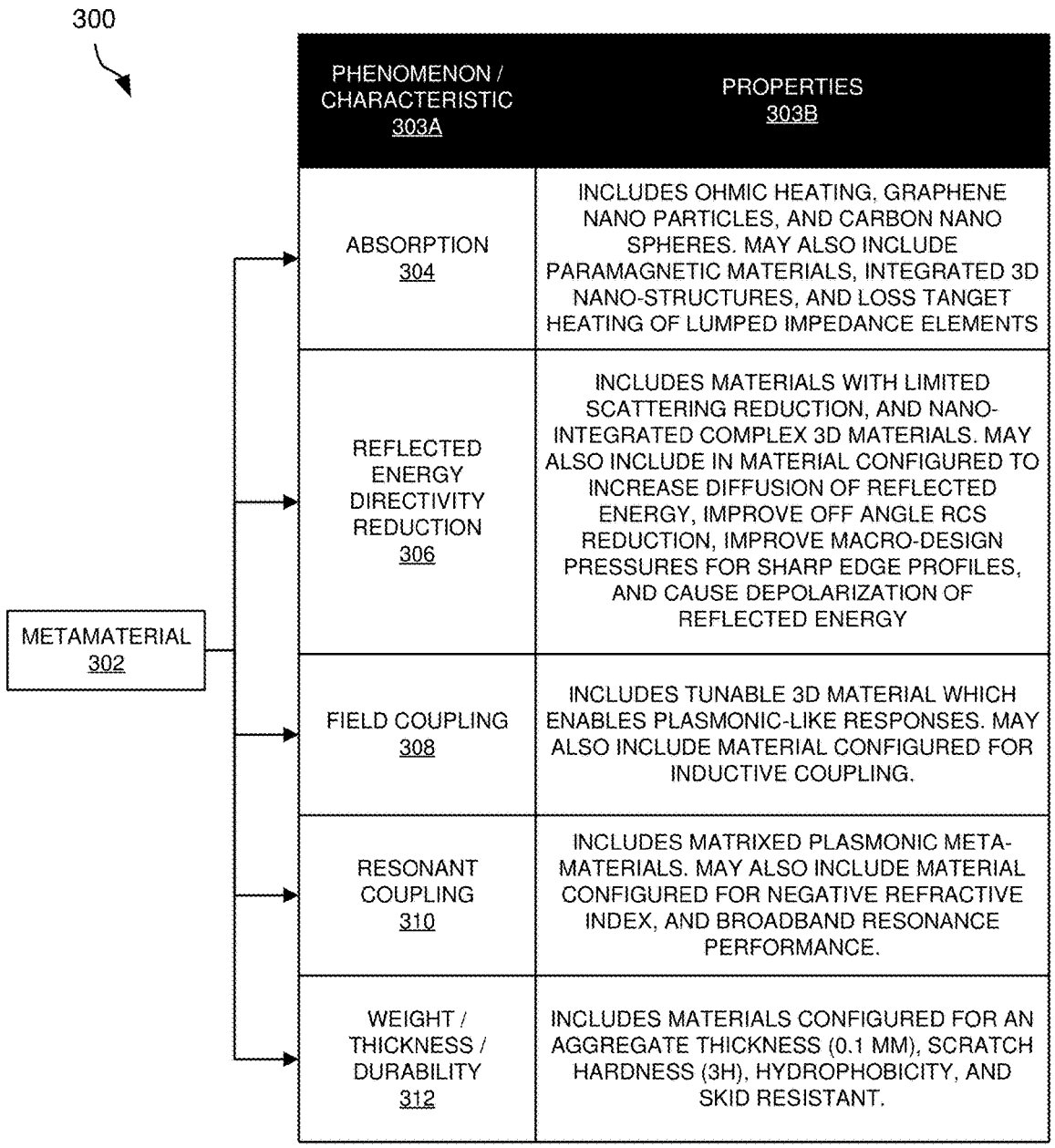
FIG. 3 depicts a chart of examples of frequency selective surface phenomena, according to an embodiment.

FIG. 3 depicts a chart 300 of examples of frequency selective surface phenomena, in accordance with one embodiment. As an option, the chart 300 may be implemented in the context of any one or more of the embodiments set forth in any previous and/or subsequent figure(s) and/or description thereof. Of course, however, the chart 300 may be implemented in the context of any desired environment. Further, the aforementioned definitions may equally apply to the description below.

As shown, the chart 300 is depicted illustrating the relationship between a metamaterial 302 and various phenomena and characteristics 303A, and associated properties 303B. Each row in the chart 300 represents a different phenomenon or characteristic 303A and its corresponding properties 303B as they relate to the metamaterial 302.

In the absorption 304, the properties 303B of the metamaterial 302 in terms of absorption are described. In particular, a metamaterial configured to absorb may include the following properties: ohmic heating (i.e. Joule heating, resistive heating, etc.), graphene nano particles, and/or carbon nano spheres. Such absorption 304 may include paramagnetic materials, integrated 3D nano-structures, and/or loss tangent heating of lumped impedance elements.

In various embodiments, absorption 304 may include of absorption of wireless frequencies. For example, absorption may include interaction of electromagnetic waves with materials, causing them to attenuate or lose energy as they pass through. In this manner, the metamaterial may be configured to impact signal propagation, communication quality, shielding, etc. Further, the metamaterial 302 may be tuned to absorb a specific frequency of electromagnetic interference. This may be achieved by adjusting the permittivity and/or permeability of the metamaterial 302 to match the specific frequency of the electromagnetic interference that is to be absorbed. The absorption 304 of the specific frequency of electromagnetic interference by the metamaterial 302 prevents this frequency from interfering with the electronic systems protected by the enclosure.

In the reflected energy directivity reduction 306, the properties of the metamaterial 302 in terms of reflected energy directivity reduction are described. In some cases, the metamaterial 302 is configured to increase the diffusion of reflected energy and improve off-angle RCS reduction (such as a RCS reduction of greater than −20 dB). This may be achieved by structuring the metamaterial 302 in such a way that it scatters the reflected energy in multiple directions, thereby reducing the directivity of the reflected energy.

In the field coupling 308, the properties of the metamaterial 302 in terms of field coupling are described. In some aspects, the metamaterial 302 enables plasmonic-like responses through tunable 3D material properties. This means that the metamaterial 302 can interact with electromagnetic fields in a way that is similar to plasmonic materials, which exhibit strong interactions with electromagnetic fields at specific frequencies. Further, the field coupling 308 may include inductive coupling of materials at low frequencies.

In the resonant coupling 310, the properties of the metamaterial 302 in terms of resonant coupling are described. In some cases, the metamaterial 302 includes matrixed plasmonic meta-materials for negative refractive index and broadband resonance performance. This means that the metamaterial 302 can exhibit a negative refractive index at specific frequencies, which can enhance the absorption or reflection of these frequencies. Furthermore, the metamaterial 302 can exhibit broadband resonance performance, which means that it can absorb or reflect a wide range of frequencies.

Further, resonant coupling 310 may include configuring the metamaterial to include an electric permittivity and magnetic permeability of negative values, thereby allowing for unique optical phenomena (such as reverse refraction and negative phase velocity). This particular aspect may enable superlenses capable of resolving details smaller than the wavelength of light, and/or manipulating electromagnetic waves such that light may be redirected around objects.

In the weight/thickness/durability 312, the properties of the metamaterial 302 in terms of weight, thickness, and durability are described. In some aspects, the metamaterial 302 may be configured for aggregate thickness (of any preconfigured amount, such as 0.1 mm), scratch hardness (of any preconfigured amount such as 3H), hydrophobicity, and skid resistance. These properties of the metamaterial 302 contribute to the overall durability and performance of the protective enclosure. For example, the aggregate thickness of the metamaterial 302 can influence the amount of electromagnetic interference that can be absorbed or reflected by the enclosure. The scratch hardness, hydrophobicity, and skid resistance of the metamaterial 302 can contribute to the physical durability of the enclosure, making it more resistant to wear and tear.

In other embodiments, the weight, thickness, and durability 312 may be configured based on a use-case scenario. For example, a metamaterial may be configured for a wet environment (such as a ship), a combustive environment (such as an engine), or a harsh environment (such as a rocket ship in space).

In various embodiments, the carbon nanoparticles of absorption 304 used in the metamaterial 302 may be of various types, including but not limited to, multi-walled carbon nanotubes, single-walled carbon nanotubes, graphene, fullerenes, or carbon black. These carbon nanoparticles may be produced through various methods, such as chemical vapor deposition, arc discharge, laser ablation, or flame synthesis. The specific type and production method of the carbon nanoparticles may be selected based on the desired properties of the metamaterial 302, such as its permittivity, permeability, and absorption characteristics.

In some cases, the carbon nanoparticles may be functionalized or modified to enhance their absorption properties. For example, the carbon nanoparticles may be doped with other elements, coated with other materials, or subjected to various treatments to alter their electronic structure, surface properties, or other characteristics. These modifications can further tune the permittivity and/or permeability of the carbon nanoparticles, thereby enhancing the absorption performance of the metamaterial 302.

In some aspects, the carbon nanoparticles may be dispersed uniformly within the polymer-containing matrix to form the metamaterial 302. This dispersion process may involve mixing the carbon nanoparticles with the polymer material under specific conditions to ensure a uniform distribution of the carbon nanoparticles within the matrix. The resulting metamaterial 302 may exhibit a homogeneous structure with evenly distributed carbon nanoparticles, which can enhance its absorption performance and ensure consistent protection against electromagnetic interference across the enclosure.

Figure 4:
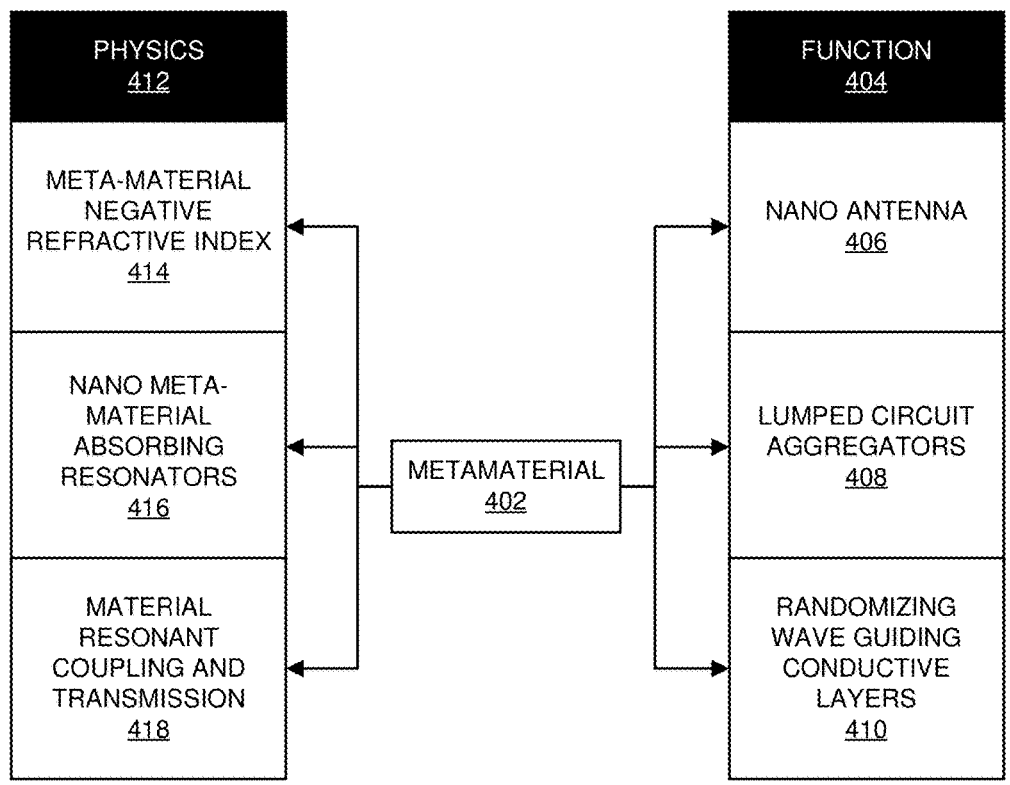
FIG. 4 shows a phenomena chart that correlates exploitation of physical phenomena to particular functions using metamaterials as used in protective enclosures for electronic systems, according to an embodiment.

FIG. 4 shows a phenomena chart 400 that correlates exploitation of physical phenomena to particular functions using metamaterials as used in protective enclosures for electronic systems, in accordance with one embodiment. As an option, the phenomena chart 400 may be implemented in the context of any one or more of the embodiments set forth in any previous and/or subsequent figure(s) and/or description thereof. Of course, however, the phenomena chart 400 may be implemented in the context of any desired environment. Further, the aforementioned definitions may equally apply to the description below.

As shown, the phenomena chart 400 illustrates the relationship between a metamaterial 402 and various elements of a system. The metamaterial 402 interfaces with both a function block 404 and a physics block 412, each comprising several components that interact with the metamaterial 402. From an alternative perspective, the metamaterial 402 is shown in the context of configuration options, including physics 412 and function block 404. Thus, the metamaterial may be configured to exhibit any of the properties shown with respect to the physics block 412 and/or the function block 404.

In the context of the function block 404, the metamaterial 402 is used in conjunction with a nano antenna 406, lumped circuit aggregators 408, and randomizing wave guiding conductive layers 410. In particular, the metamaterial 402 may be configured for manipulating electromagnetic waves.

For example, the nano antenna 406 facilitates the transmission and reception of electromagnetic signals within a specific frequency band. The lumped circuit aggregators 408 manage the processing, modulation, and demodulation of these electromagnetic signals. The randomizing wave guiding conductive layers 410, on the other hand, may be designed to scatter electromagnetic interference in multiple directions, thereby reducing the directivity of the interference. In some aspects, the metamaterial 402 may be configured to enhance the performance of these components by absorbing or reflecting specific frequencies of electromagnetic interference.

In various embodiments, the nano antenna 406 may be configured to interact with electromagnetic waves at the nanoscale. Such nano antenna 406 may be used for transmitting, receiving, or manipulating electromagnetic radiation, often in the visible or infrared spectrum. Such use may be important for applications requiring precise control over light or electromagnetic waves, such as in sensors, imaging devices, and communication technologies.

In various embodiments, the lumped circuit aggregators may include discrete electronic components (such as capacitors, inductors, and resistors) that are grouped together to achieve specific electrical or electromagnetic functionalities. In the context of electromagnetic wave manipulation, lumped circuit aggregators may be used to tailor and enhance the performance of antennas, filters, and other electronic systems.

In various embodiments, the randomizing wave guiding conductive layers 410 may include metamaterial configured to scatter or randomize the propagation of electromagnetic waves. By introducing randomness in the paths of waves, these layers can mitigate interference, enhance signal propagation in certain directions, or even achieve specific transmission characteristics that are beneficial in antenna design, radar systems, or wireless communication.

In the context of the physics block 412, the metamaterial 402 may be associated with a meta-material negative refractive index 414, nano meta-material absorbing resonators 416, and material resonant coupling and transmission 418. In particular, the metamaterial 402 may be configured to exhibit a specific physics component, including electromagnetic and/or quantum mechanics, etc.

The meta-material negative refractive index 414 may refer to the property of the metamaterial 402 to exhibit a negative refractive index at specific frequencies, which can enhance the absorption or reflection of these frequencies. As such, these metamaterials may be engineered to manipulate electric and magnetic fields in ways not possible with naturally occurring materials (including structuring materials at scales smaller than the wavelength of light). Therefore, the negative refractive index 414 may relate to electromagnetic theory of physics block 412.

The nano meta-material absorbing resonators 416 may represent the ability of the metamaterial 402 to absorb specific frequencies of electromagnetic interference. For example, nano meta-material absorbing resonators 416 may be configured to rely on quantum principles to efficiently absorb specific wavelengths of electromagnetic radiation.

The material resonant coupling and transmission 418, on the other hand, refers to the ability of the metamaterial 402 to couple with other materials at specific resonant frequencies, thereby enabling the transmission of these frequencies. The material resonant coupling and transmission 418 may relate to both classical (energy transfer, damping factor, etc.) and quantum (electron transition, energy quantization, etc.) mechanical principles (as it relates to resonance), where materials may interact with specific (and preconfigured) frequencies of electromagnetic waves.

In some cases, the metamaterial 402 may be tuned to both absorb and reflect specific frequencies of electromagnetic interference. This can be achieved by preconfiguring the metamaterial 402 to have specific physics block 412 characteristics and function 404 aspects.

Figure 5:
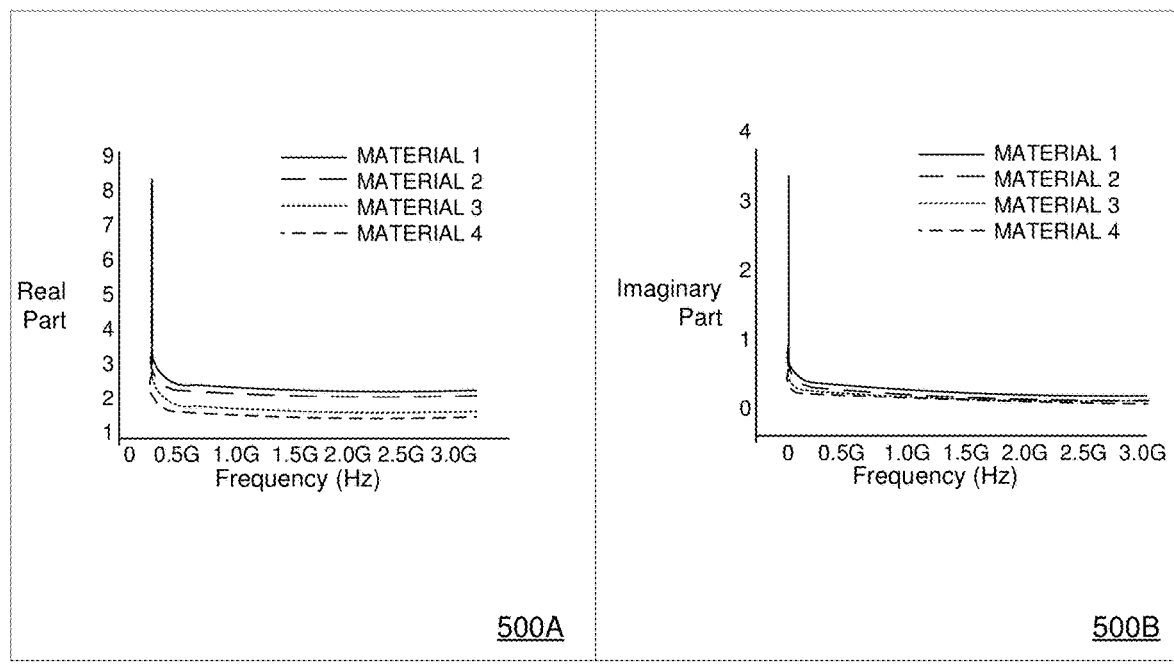
FIG. 5 shows various complex frequency response charts corresponding to different materials, according to an embodiment.

FIG. 5 shows various complex frequency response charts 500A-D corresponding to different materials, in accordance with one embodiment. As an option, the charts 500A-D may be implemented in the context of any one or more of the embodiments set forth in any previous and/or subsequent figure(s) and/or description thereof. Of course, however, the charts 500A-D may be implemented in the context of any desired environment. Further, the aforementioned definitions may equally apply to the description below.

As shown in the charts 500A-D, a variety of materials (shown as materials 1-4) are shown depicting frequency response graphs. The real part frequency response graph 500A and the imaginary part frequency response graph 500B are shown in the top row, illustrating the real and imaginary parts of the frequency response for materials 1-4 4 over a range of frequencies from 0 to 3.0 Hz. These graphs provide a visual representation of how the real and imaginary components of the frequency response vary with frequency for each material.

The real part frequency response graph 500C and the imaginary part frequency response graph 500D are shown in the bottom row, providing additional real and imaginary frequency response data for the same materials over the same frequency range. These graphs provide further insight into the frequency-dependent behavior of the materials, highlighting the variations in the real and imaginary components of the frequency response across different frequencies. In some cases, these graphs can be used to identify specific frequencies at which the materials exhibit maximum or minimum absorption or reflection, which can be useful in the design of protective enclosures for electronic systems.

In particular, the frequency response graphs of charts 500A-D show that materials can be selectively and specifically pre-configured for specific responses at set frequencies. This is especially important, as being able to configure a meta-material to respond (or specifically not respond), thereby allowing the meta-material to absorb (or potentially repeal) electromagnetic waves.

Figure 6:
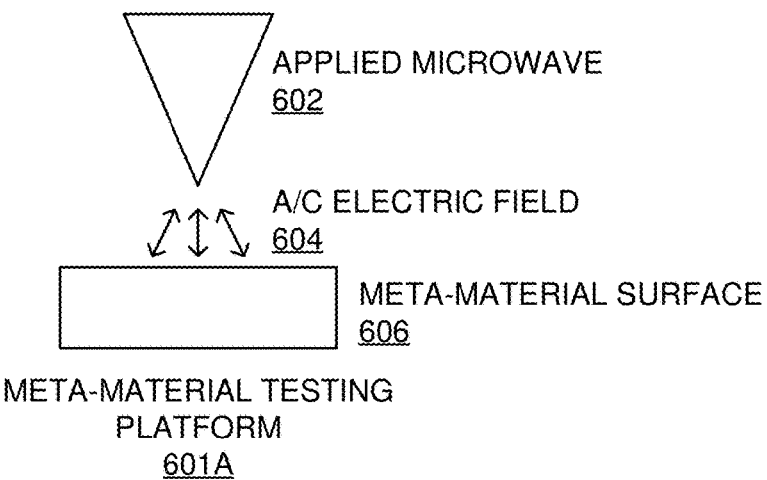
FIG. 6 depicts a configuration for electroactive materials testing, according to an embodiment.
Figure 6:
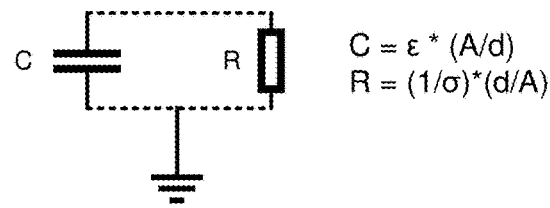

FIG. 6 depicts a configuration 600 for electroactive materials testing, in accordance with one embodiment. As an option, the configuration 600 may be implemented in the context of any one or more of the embodiments set forth in any previous and/or subsequent figure(s) and/or description thereof. Of course, however, the configuration 600 may be implemented in the context of any desired environment. Further, the aforementioned definitions may equally apply to the description below.

As shown, the configuration 600 includes a meta-material testing platform 601A which shows an applied microwave source 602 that creates an A/C electric field 604. It is to be appreciated that any electrochemical wave may be applied within the context of the meta-material testing platform 601A.

The A/C electric field 604 may be directed towards a metamaterial surface 606. The interaction of the metamaterial surface 606 with the A/C electric field 604 results in sample responses 601B, which are measured to determine the interaction of the metamaterial with the applied microwave source 602.

As such, the applied microwave source 602 may generate a strong AC electric field 604 at the tip apex, and the AC electrical field 604 interacts with the sample, including the meta-material surface 606.

In some aspects, the configuration 600 may be used to evaluate the permittivity and/or permeability of the meta-material. The permittivity and/or permeability of the meta-material can be determined based on the sample responses 601B, which may include measurements of the reflected and transmitted electromagnetic waves.

The sample responses 601B may include a dielectric interaction (for capacitive response), an electrical interaction (for resistive response), and/or a magnetic interaction.

In some cases, the meta-material testing platform 601A may also be used to evaluate the effectiveness of the metamaterial in absorbing or reflecting a particular frequency of electromagnetic interference. This can be achieved by exposing the metamaterial to an electromagnetic wave of the particular frequency and measuring the amount of the wave that is absorbed or reflected by the metamaterial. In other embodiments, the platform 601A may be used to evaluate the durability and physical properties of the metamaterial. For example, the metamaterial may be subjected to various environmental conditions, such as temperature and humidity variations, and its performance in absorbing or reflecting electromagnetic interference under these conditions may be evaluated.

In various embodiments, the platform 601A may be used obtain direct measurement of electrical properties, including image local variation of $\varepsilon$ (permittivity) and $\sigma$ (conductivity), and/or <100 nm lateral resolution (50 nm typical, 20 nm for some modes/materials). Further, the platform 601A may be compatible with all materials, including images dielectrics, insulators, semiconductors, and/or metals. Further, the platform 601A may be used to measure with contact, tapping mode (resonant and non-resonant), and/or non-contact imaging. Still yet, the platform 601A may be configured for sub-surface sensitivity, including the ability to image through ~100 nm over-layers.

Referring back to FIG. 1A and FIG. 1B, the protective enclosure 1A00 for electronic systems and the canister system 1B00 may be manufactured by forming a metamaterial tuned to a specific permittivity and/or permeability. The tuning process may involve adjusting the properties of the metamaterial, such as its composition, structure, and morphology, to match the specific frequency of the electromagnetic interference that is to be absorbed or reflected. Such a tuning process may include use of the meta-material testing platform 601A and/or the sample response 601B.

Figure 7A:
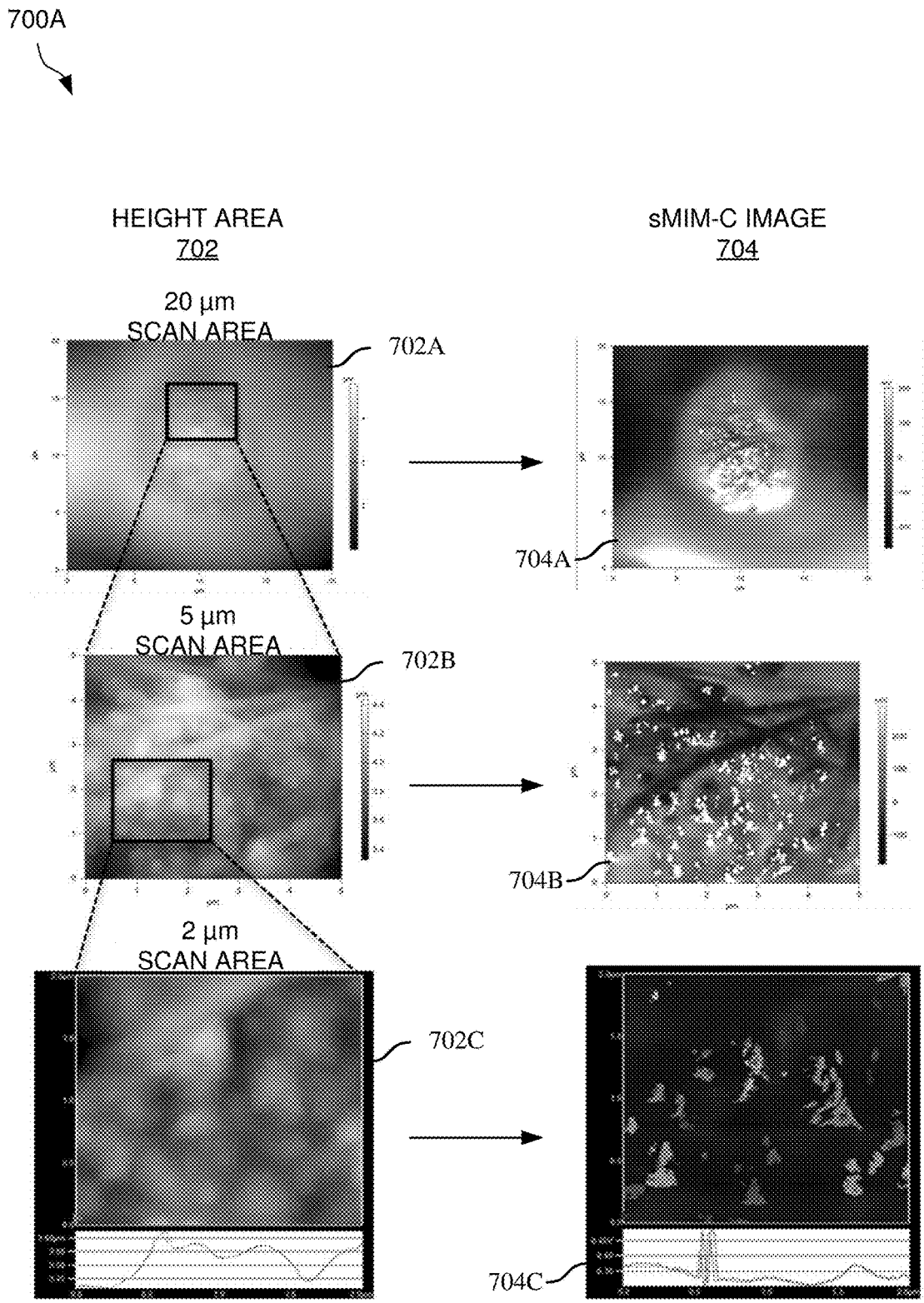
FIGS. 7A and 7B depict a set of images for demonstrating physical properties of metamaterials, according to an embodiment.
Figure 7B:
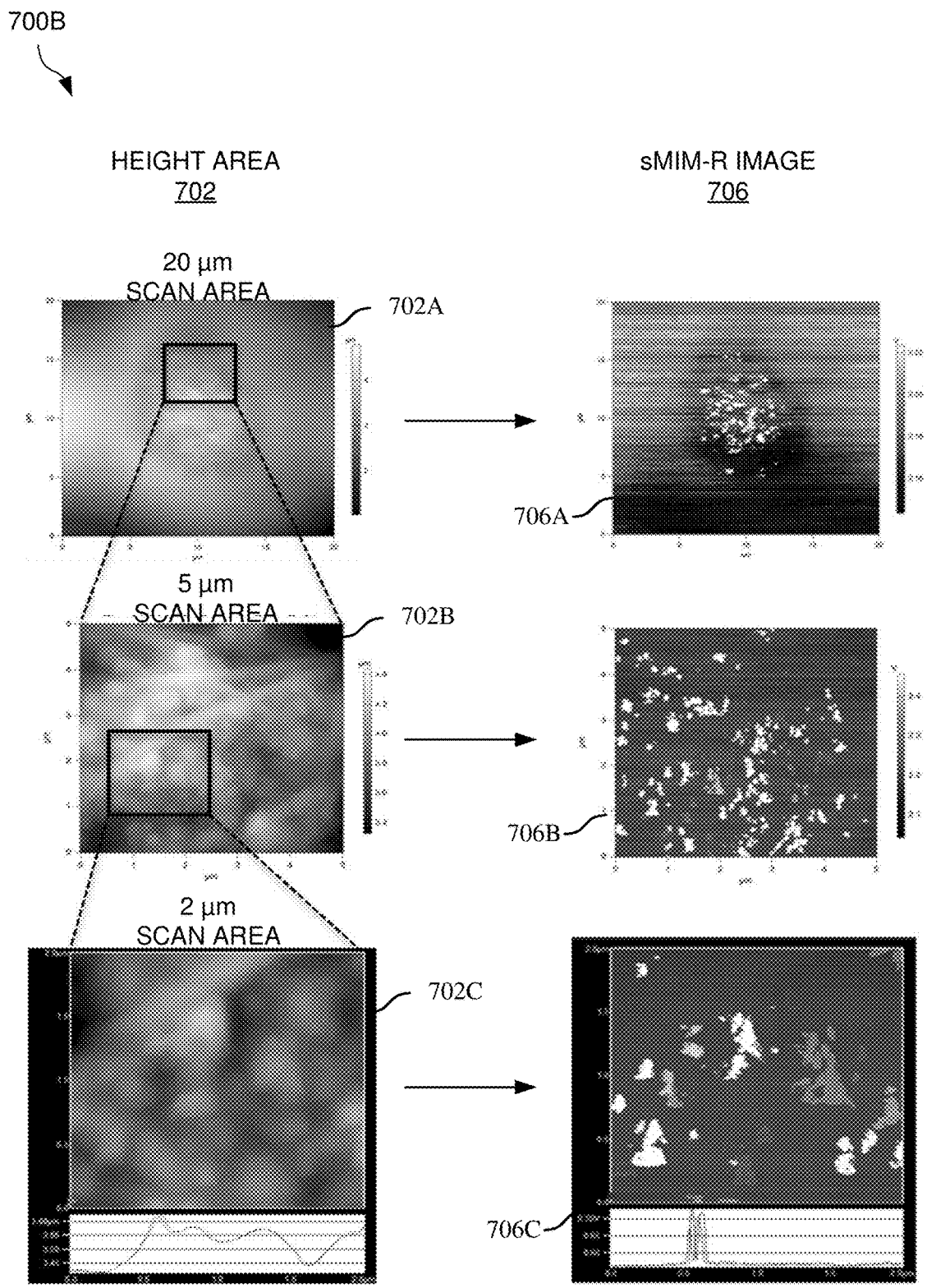

FIGS. 7A and 7B depict a set of images 700A, 700B for demonstrating physical properties of metamaterials, in accordance with one embodiment. As an option, the set of images 700A, 700B may be implemented in the context of any one or more of the embodiments set forth in any previous and/or subsequent figure(s) and/or description thereof. Of course, however, the set of images 700A, 700B may be implemented in the context of any desired environment. Further, the aforementioned definitions may equally apply to the description below.

Referring to FIG. 7A, a detailed view of a height area images 702 and corresponding scanning microwave impedance microscopy (sMIM-C) images 704 are depicted. The height area images 702 include a 20 μm scan area 702A, a 5 μm scan area 702B, and a 2 μm scan area 702C of a particular preconfigured meta-material. Each scan area is associated with a specific sMIM-C image: the 20 μm scan area 702A corresponds to the sMIM-C image for the 20 μm scan area 704A, the 5 μm scan area 702B corresponds to the sMIM-C image for the 5 μm scan area 704B, and the 2 μm scan area 702C corresponds to the sMIM-C image for the 2 μm scan area 704C.

The sMIM-C images 704 provide a visual representation of the effectiveness in absorbing particular frequencies. In particular, the white spots on the sMIM-C images 704 indicate an area of absorption of the preconfigured frequency.

As such, the sMIM-C images 704 show that the metamaterial is successful at absorbing at the preconfigured frequency.

It is to be appreciated that the sMIM-C images 704 may be utilized also to provide information about the pore size and structure of the metamaterial. As discussed earlier, the pore size of the metamaterial can be tuned to absorb specific frequencies of electromagnetic interference. The sMIM-C images 704 can provide a visual representation of the pore size and structure of the metamaterial, as well as the hot spots of absorption.

In other aspects, the sMIM-C images 704 can be used to evaluate the uniformity of the metamaterial. For example, a metamaterial with a uniform distribution may exhibit more consistent absorption or reflection performance across its surface.

Referring to FIG. 7B, a detailed view of a height area scan and corresponding scanning microwave impedance microscopy (sMIM-R) images 706 are depicted. The height area scan images 702 include a 20 μm scan area 702A, a 5 μm scan area 702B, and a 2 μm scan area 702C of a particular preconfigured meta-material. Each of these scan areas is associated with a corresponding sMIM-R image 706, specifically the sMIM-R image for the 20 μm scan area 706A, the sMIM-R image for the 5 μm scan area 706B, and the sMIM-R image for the 2 μm scan area 706C.

The sMIM-R images 706 provide a visual representation of the resistive properties of the metamaterial at a nanoscale level. In some aspects, these images can be used to analyze the electrical resistance of the metamaterial.

In particular, and similar to FIG. 7A, the sMIM-R images 706 provide a visual representation of the effectiveness in absorbing particular frequencies. In particular, the white spots on the sMIM-R images 706 indicate an area of absorption of the preconfigured frequency. Further, such sMIM-R images 706 may be used to provide information about pore size, structure, uniformity, etc.

Figure 8:
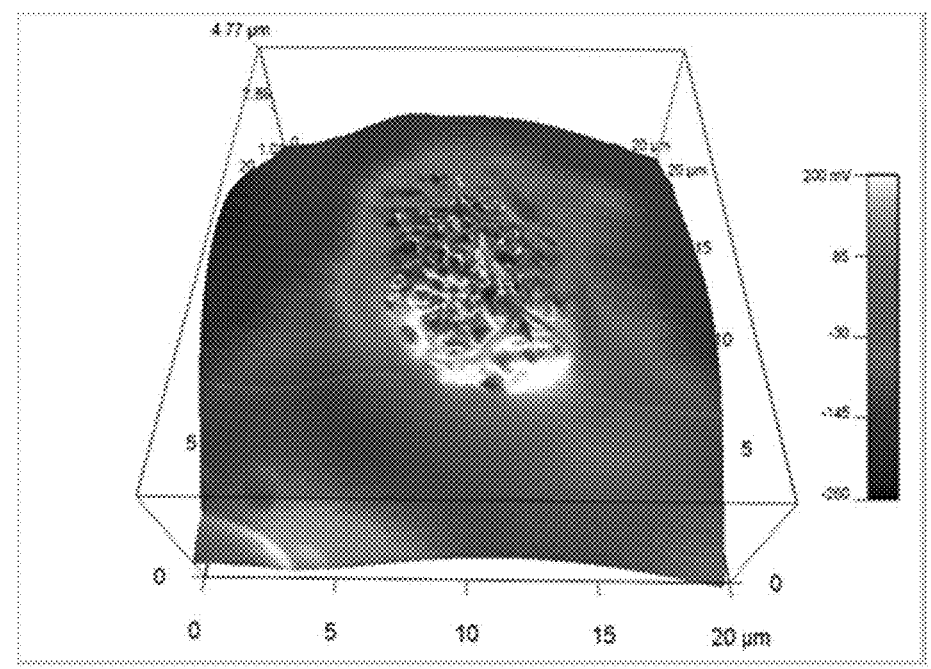
FIG. 8 depicts a three-dimensional (3D) topographical image, according to an embodiment.

FIG. 8 depicts a three-dimensional (3D) topographical image 800, in accordance with one embodiment. As an option, the 3D topographical image 800 may be implemented in the context of any one or more of the embodiments set forth in any previous and/or subsequent figure(s) and/or description thereof. Of course, however, the 3D topographical image 800 may be implemented in the context of any desired environment. Further, the aforementioned definitions may equally apply to the description below.

As shown, the 3D topographical image 800 is shown of a scanning microwave impedance microscopy (sMIM-C) overlay. The 3D topographical image 800 provides a visual representation of the surface topography of the metamaterial. The sMIM-C overlay, on the other hand, highlights variations in the material's properties across the scanned area. This overlay provides a visual representation of the material's electrical characteristics superimposed on the topographical data, allowing for a comprehensive analysis of the surface features and their corresponding electrical responses.

In particular, where the color is lighter in color (closer to white), such indicates a site of absorption at the preconfigured frequency. In this manner, the 3D topographical image 800 can be used to visualize a 3D mapping of the absorption of the frequency. Such may be particularly helpful in determining the effect of a depth of a meta-material in proportion to its effectiveness at absorbing the preconfigured frequency.

As such, the metamaterial may be configured to absorb or reflect specific frequencies of electromagnetic interference.

In other cases, the 3D topographical image 800 with the sMIM-C overlay can be used to evaluate the pore size, structure, uniformity, etc. of the metamaterial.

Figure 9A:
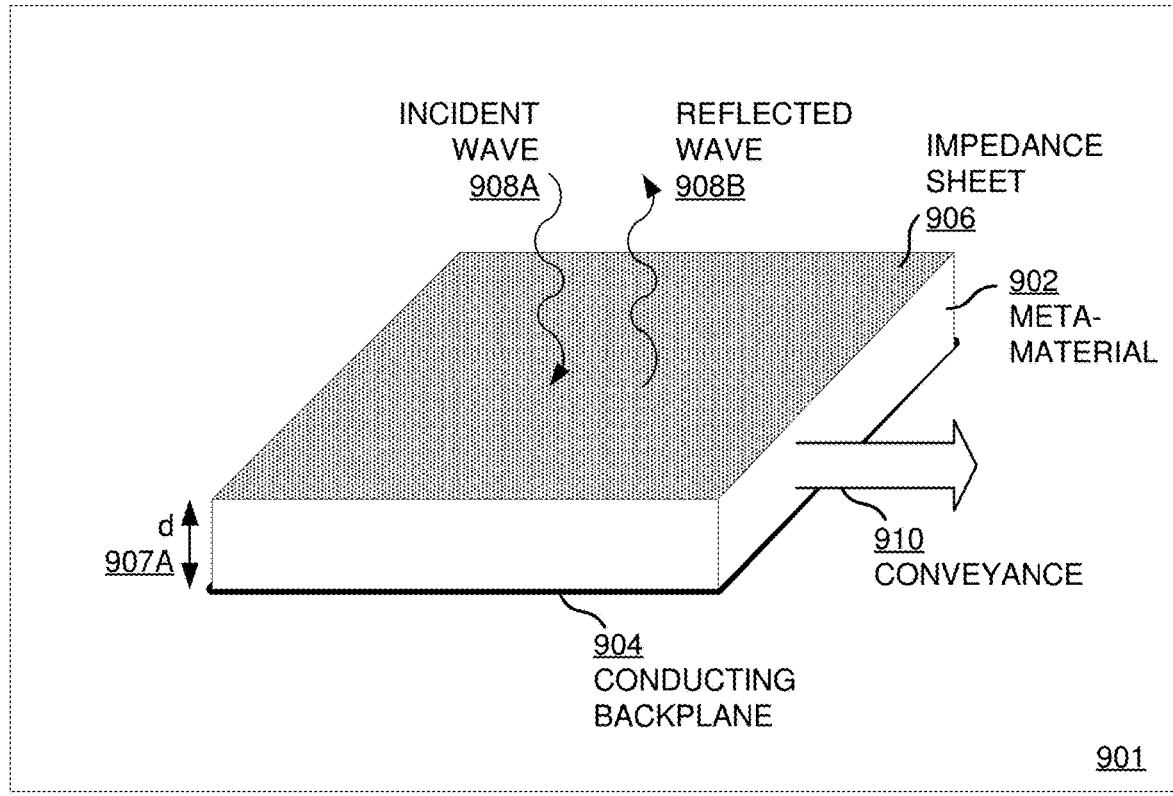
FIG. 9A depicts tunable metamaterials, according to an embodiment.
Figure 9A:
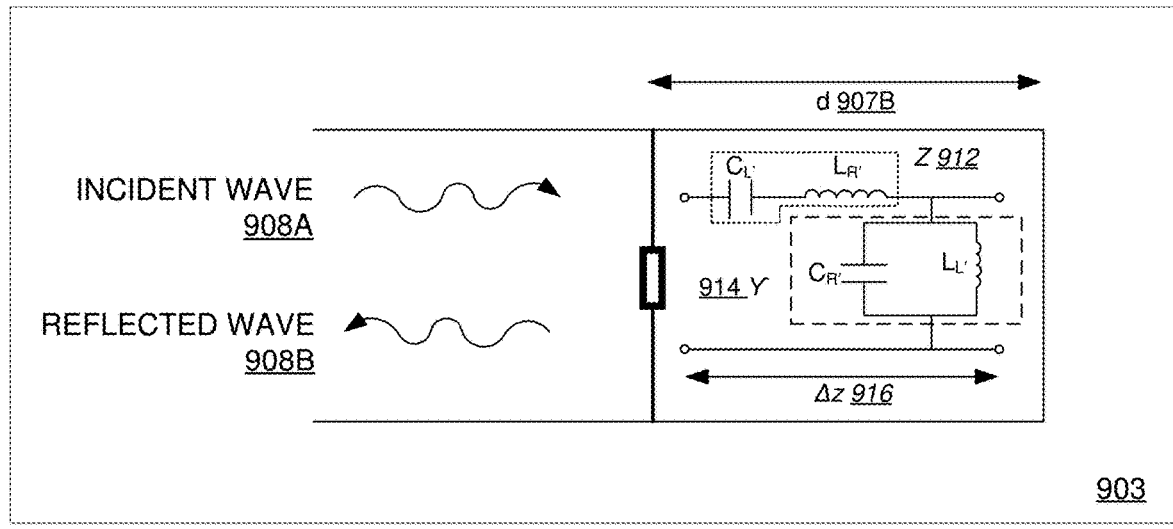

FIG. 9A depicts tunable metamaterials 901, 903, in accordance with one embodiment. As an option, the tunable metamaterials 901, 903 may be implemented in the context of any one or more of the embodiments set forth in any previous and/or subsequent figure(s) and/or description thereof. Of course, however, the tunable metamaterials 901, 903 may be implemented in the context of any desired environment. Further, the aforementioned definitions may equally apply to the description below.

As shown, the structure in the tunable metamaterial 901 includes a metamaterial 902 that includes an impedance sheet 906 (on a first side of the meta-material 902) and a conducting backplane 904 (on a second side of the meta-material 902). The metamaterial 902 may tuned to a specific permittivity and/or permeability to absorb or reflect a particular frequency of electromagnetic interference.

In one embodiment, the impedance sheet 906 may serve as a barrier that can absorb or reflect specific frequencies of electromagnetic interference. Additionally, the conducting backplane 904 may be formed from a conductive material, such as a metal or a conductive polymer, and may be configured to reflect or absorb electromagnetic interference that is not absorbed by the impedance sheet 906, and/or the meta-material 902.

The tunable metamaterial 901 also includes a conveyance 910, which may refer to the transmission or passage of the electromagnetic wave through the meta-material 902. The conveyance 910 may include therefore a wave propagating from one side of the meta-material 902 to the other, potentially undergoing various interactions with the material along the way.

In particular, the tunable metamaterial 901 may interact with an incident wave 908A and a reflected wave 908B. The incident wave 908A may represent the electromagnetic interference that is incident on the surface of the impedance sheet 906. The reflected wave 908B, on the other hand, represents the electromagnetic interference that is reflected by the impedance sheet 906. The interaction of the impedance sheet 906 with the incident wave 908A and the reflected wave 908B is determined by the properties (individual or in aggregate) of the meta-material 902, the impedance sheet 906, and/or the conducting backplane 904, and the conveyance 910.

Lastly, the depth d 907A of the meta-material 902 is shown.

As such, in some aspects, the meta-material may be configured to reflect or absorb specific frequencies of electromagnetic interference, thereby preventing these frequencies from passing through the layers of the tunable metamaterial 901.

The interaction of the incident wave 908A and the reflected wave 908B is shown in the tunable metamaterial 903. In particular, the depth d 907A is shown in the tunable metamaterial 903 as depth d 907B (but the depth d 907A is intended to then be analyzed in the circuit flow of the tunable metamaterial 903). For example, as a function of the depth d 907B, the impedance Z 912 of the material may be calculated. In particular, the impedance Z 912 may measure the opposition that a circuit presents to the flow of alternating current (AC). Additionally, the admittance Y 914 of the material may be calculated. In particular, the admittance 914 may include how easily a circuit allows the flow of alternating current (AC). Lastly, the change in impedance $\Delta z$ 916 may be used to calculate the change of impedance over the circuit.

In this manner, the circuitry design shown in the tunable metamaterial 903 may include the ability to calculate admittance, absorber performance, VHF resonance performance, energy conveyance, and/or vector network analysis.

Figure 9B:
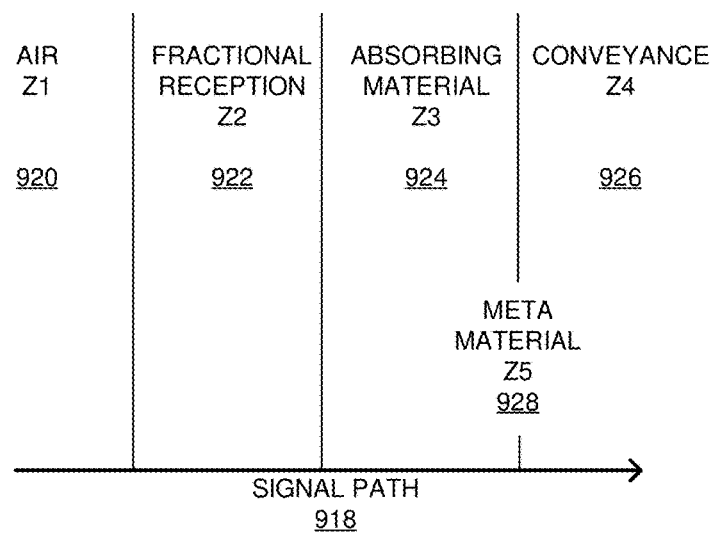
FIG. 9B depicts a system wide impedance analysis, according to an embodiment.

FIG. 9B depicts a system wide impedance analysis 900B, in accordance with one embodiment. As an option, the analysis 900B may be implemented in the context of any one or more of the embodiments set forth in any previous and/or subsequent figure(s) and/or description thereof. Of course, however, the analysis 900B may be implemented in the context of any desired environment. Further, the aforementioned definitions may equally apply to the description below.

As shown, the analysis 900B illustrates the interaction of a signal path 918 with various layers, including the air layer (Z1) 920, fractional reception layer (Z2) 922, absorbing material layer (Z3) 924, a metamaterial layer (Z5) 928, and a correspondence conveyance (Z4) 926.

The signal path 918 represents the path of an electromagnetic wave as it interacts with the various layers of the system. The air layer (Z1) 920 is the initial layer that the signal path 918 encounters. In some aspects, the air layer (Z1) 920 may represent the environmental medium through which the electromagnetic wave travels before reaching the protective enclosure (such as the impedance sheet 906).

The fractional reception layer (Z2) 922 is the next layer that the signal path 918 encounters. In some cases, the fractional reception layer (Z2) 922 may be composed of a metamaterial that is tuned to a specific permittivity and/or permeability. In one embodiment, the fractional reception may refer to the partial or incomplete reception of a transmitted signal. For example, the fractional reception (Z2) 922 layer may be configured to reflect (and/or scatter) an electromagnetic wave (at a preconfigured frequency).

The fractional reception layer (Z2) 922 may therefore serve to absorb or reflect a fraction of the electromagnetic wave, thereby reducing the intensity of the wave that reaches the subsequent layers.

The absorbing material layer (Z3) 924 is the next layer that the signal path 918 encounters. In some aspects, the absorbing material layer (Z3) 924 may be composed of a metamaterial that is tuned to absorb a specific frequency of electromagnetic interference. In particular, in contrast to the fractional reception layer (Z2) 922 layer which may be configured to reflect the signal path 918, the absorbing material layer (Z3) may be configured specifically to absorb a predetermined frequency.

The metamaterial layer (Z5) 928 is the next layer that the signal path 918 encounters. In some aspects, the metamaterial layer (Z5) 928 may be composed of a metamaterial that is tuned to a specific permittivity and/or permeability. It is to be appreciated that any of the fractional reception layer (Z2) 922, and/or the absorbing material layer (Z3) 924 may also be composed of a meta-material. Thus, the metamaterial layer (Z5) may represent an additional (and alternatively configured) metamaterial. For example, a first layer of metamaterial may be configured to widely reflect most frequencies, and the absorbing material may (with greater granularity) absorb a preconfigured type of frequency. Additionally, a wider absorbing layer of a metamaterial may further be provided to additional protect the contents.

In this manner, the conveyance (Z4) 926 may be minimized (having passed through the air layer (Z1) 920, the fractional reception layer (Z2) 922, the absorbing material layer (Z3) 924, and the metamaterial layer (Z5) 928.

It is to be appreciated that any of the air layer (Z1) 920, the fractional reception layer (Z2) 922, the absorbing material layer (Z3) 924, and/or the metamaterial layer (Z5) 928 may each be described as a layer (in the sense of a manufactured layer), a signal, an attenuation thereof, and/or any medium or interface where a signal or attenuation is at least partially received. For example, any of the air layer (Z1) 920, the fractional reception layer (Z2) 922, the absorbing material layer (Z3) 924, and/or the metamaterial layer (Z5) 928 may refer to and/or include a medium or interface where a signal is at least partially received or transmitted. As such, each layer may refer to an area of interest associated with a signal (and its response and/or mechanism associated with the area of interest within a material).

Figure 9C:
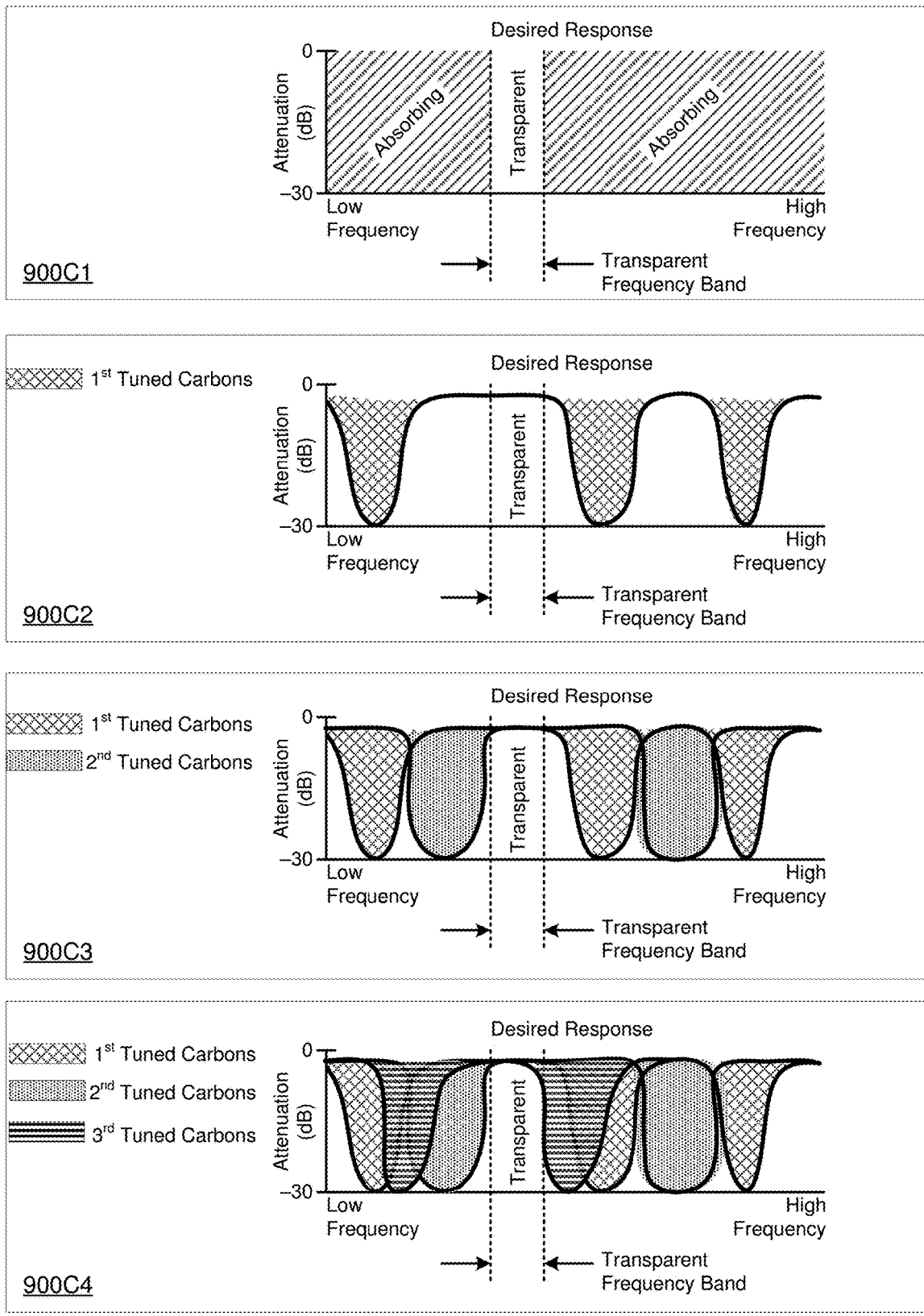
FIG. 9C depicts various desired response configurations, according to an embodiment.

FIG. 9C depicts various desired response configurations 900C1, 900C2, 900C3, 900C4, in accordance with one embodiment. As an option, the configurations 900C1, 900C2, 900C3, 900C4 may be implemented in the context of any one or more of the embodiments set forth in any previous and/or subsequent figure(s) and/or description thereof. Of course, however, the configurations 900C1, 900C2, 900C3, 900C4 may be implemented in the context of any desired environment. Further, the aforementioned definitions may equally apply to the description below.

As shown, the configurations 900C1, 900C2, 900C3, 900C4 show frequency response charts. In particular, the frequency response charts illustrate that the meta-material can be configured to respond at preconfigured frequencies. In this manner, the tuning of the meta-material (which may include carbon nanoparticles) can create different patterns of absorption and transparency across the frequency spectrum.

The single transparent frequency band chart of configuration 900C1 illustrates a desired response with absorption at low and high frequencies, and a transparent frequency band in the middle. This indicates that the meta-material may be tuned to absorb specific frequencies of electromagnetic interference, while allowing a specific, pre-configured frequency (or multiple frequencies) to pass through. In particular, the transparent frequency band may refer to a range of frequencies in which electromagnetic waves can propagate through the metamaterial with minimal attenuation or loss (i.e. the metamaterial is configured to not significantly absorb or reflect the electromagnetic waves, allowing them to pass through with little to no distortion or energy loss).

It is noted that the configuration 900C1 represents a binary on/off absorption, namely that except for the preconfigured transparent frequency band, all frequencies can otherwise be absorbed.

In some cases, as shown in the multiple transparent frequency bands chart of configuration 900C2, the metamaterial may be tuned to absorb multiple preconfigured frequencies. Similar to the configuration 900C1, the configuration 900C2 may also have a preconfigured transparent frequency band. Additionally, the metamaterial may be configured to absorb specifically at a multiple of frequencies. However, it is noted that in the configuration 900C2 that specific gaps in frequency absorption (outside of the transparent frequency band) exist.

It is to be appreciated that the configuration 900C2 may include a metamaterial configured to have a first tuned carbon to absorb at the predetermined frequencies.

The complex pattern of absorption chart of the configuration 900C3 presents a more intricate pattern of absorption and transparency across the frequency spectrum. This demonstrates the flexibility and versatility of the tuning process, where the metamaterial can be tuned to absorb or reflect a complex pattern of specific frequencies of electromagnetic interference. In one embodiment, the metamaterial of the configuration 900C3 may show multiple types of metamaterials. For example, a first pattern (corresponding with the configuration 900C2) is shown in the configuration 900C3. Additionally, a second pattern in the configuration 900C3 may represent a second type of metamaterial that is configured to fill in the gaps per the configuration 900C2. Thus, the configuration 900C3 creates a more cohesive absorption layer based on a multiple of metamaterial layers, each tuned to a variety of preconfigured frequency settings.

It is to be appreciated that the configuration 900C2 may include a metamaterial configured to have a first tuned carbon and a second tuned carbon to absorb at the predetermined frequencies.

The three tuned carbons frequency response chart configuration 900C4 demonstrates the combined effect of three different metamaterial (including three separately, independently, and individually tuned carbons), each contributing to the overall frequency response with distinct absorption and transparent bands. This indicates that multiple types of metamaterial (including carbon nanoparticles) may each be tuned to a specific frequency and which can be combined within the metamaterial to create a comprehensive frequency response that absorbs or reflects a wide range of electromagnetic interference frequencies.

As such, the configuration 900C4 using multiple metamaterials (and corresponding tuned carbons) may be used to create a situation where the configuration 900C4 begins to mirror the blanket absorption shown for the configuration 900C1.

It is to be appreciated that, as described herein, the use of multiple layers of metamaterials (each configured for a particular frequency response/absorption) may be equally satisfied by the inclusion of multiple tuned carbons within a single layer of the metamaterial.

In some implementations, the carbon nanoparticles may be tuned to absorb or reflect a specific frequency of electromagnetic interference. This tuning process involves adjusting the physical and chemical properties of the carbon nanoparticles, such as their size, shape, and composition, to resonate with the specific frequency of electromagnetic interference. When the tuned carbon nanoparticles encounter electromagnetic interference at this specific frequency, they absorb the energy, thereby preventing the interference from penetrating further into the protective enclosure.

In some cases, the tuning process can be adjusted to create carbon nanoparticles that both absorb and reflect specific frequencies of electromagnetic interference. This dual-function tuning can provide enhanced protection against a wider range of electromagnetic interference frequencies. For example, a first type of carbon may be tuned to absorb at a particular frequency, but reflect at others. In another example, a first type of carbon may be tuned to absorb at a particular frequency, and a second type of carbon may be tuned to reflect at another frequency.

Principles of Operation of Material Layer Stacks and Metamaterials

In various embodiments, the disclosure herein relates to a technological framework underpinning the development of EMI-absorbing materials. For example, a simple analogy may assist in conveying the concept of impedance with respect to EMI-absorbing materials, which in turn will highlight the importance of impedance matching. The analogy may include jumping into a swimming pool, where the goal is to cause as little splash (reflection) as possible. As such, an individual may try to slide into the water smoothly without disturbing it much. The jumping technique may represent impedance, and a smooth, controlled slide (causing a small splash) may represent minimal impedance (such as 1, like air), and a cannonball entrance (causing a big splash) may represent a greater impedance (such as 10, like metal). The water's response may represent an impedance of the medium, and water may have its own response to the jump. For purposes of the analogy, the water's natural response may match the jumping technique. Thus, the water's natural response may represent an impedance of 1 (like air) when the jumping technique is a smooth, controlled slide. If the jumping technique (impedance) matches the water's natural response (impedance of the medium), a smooth entry may be achieved with minimal splash, or as represented mathematically, jumping technique impedance (1)−water's impedance (1)=0 (i.e. minimal splash). In contrast, if a cannonball entry occurred, a big splash may result, or as represented mathematically, jumping technique impedance (10)−water's impedance (1)=9 (i.e. big splash). As such, one focus of the present disclosure is to adjust the jumping technique" (impedance) of objects so that it matches the water's natural response (impedance of the electromagnetic wave's propagation medium, usually air). When impedance is matched (under such an adjustment), and when the electromagnetic wave encounters the object, it slides in smoothly, causing minimal reflection. As such, the material may be modified and/or tuned via the EMI-absorbing material disclosed herein to absorb some of the waves to minimize overall impedance.

In the foregoing analogy, to accomplish a minimal splash (reflection), the jumper needs to adjust its technique (impedance) to match the water's natural response (impedance of the medium). In the context of the present disclosure involving protective enclosure applications, EMI-absorbing materials may assist with changing this technique such that electromagnetic waves are absorbed smoothly with minimal reflection.

A simple analogy may assist with conveying the perspective of permittivity. For example, imagine designing a soundproof room using multiple layers of different soundproofing materials. Some materials may be great at absorbing high-pitched sounds, some at absorbing mid-frequency tones, and some excel at absorbing low-pitched sounds. As such, if the goal were to absorb as much sound (reflection) as possible, then many different types of materials may be used to absorb a variety of sounds. The sound pitch may represent frequency and the material response may represent permittivity. Every material may respond differently to various sound pitches. Similarly, with respect to phenomena of a material's absorption of EMI, every different material may have a permittivity that determines how it responds to different frequencies of the EMI. Permittivity is a complex number, with real and imaginary parts, which dictates how much a material can store energy (real part) and how much a material can dissipate energy (imaginary part). Additionally, the layered design (with multiple types of materials) may represent absorption across multiple frequencies. With respect to EMI, the multiple layers of materials may be represented by multiple different permittivity values. As such, each layer may be configured to absorb EMI at a specific frequency range (by changing the permittivity value).

With continued reference to the prior analogy, the math may be simplified to define target frequencies (such as a high $f_H$, medium M, or low $f_L$ EMI frequency), and select materials (or design composite materials) that have effective permittivity tailored to each frequency (high frequency layer may have a permittivity of $\varepsilon_H$, medium frequency layer may have a permittivity of $\varepsilon_M$, and low frequency layer may have a permittivity of $\varepsilon_L$). For each layer, the permittivity of the layer may be configured to match the free space as closely as possible for its targeted frequency, which in turn may minimize reflection. Going back to the soundproofing analogy, this is like ensuring each material absorbs all of the energy at its target pitch (without letting any bounce back). As such, reflection may be minimized for each layer. Further, the thickness of each layer also matters. The wave should be absorbed within the layer and shouldn't reach the other side. For each frequency, an optimal thickness d may be determined and configured to ensure 100% absorption. As such, the design thickness may be configured for depth of absorption.

Thus, to create an effective multi-layered EMI-absorbing composite, materials may be selected with permittivity tailored to specific frequencies and each layer's thickness may be configured for optimal absorption. Going back to the analogy, this would be similar to designing a room with layers of soundproofing materials so that all types of sounds (from high-pitched to low-pitched) are absorbed, thus making the room quiet. EMI-absorbing materials are specifically designed materials that can absorb and dissipate the energy from electromagnetic waves to minimize reflection. Impedance matching may therefore be used in designing and optimizing EMI-absorbing materials.

With respect to impedance matching and how it plays a role in the functionality of EMI-absorbing materials, when an electromagnetic wave encounters a layer, some energy may be reflected back, and some energy may be transmitted into the object. The amount of reflected energy largely depends on the impedance difference (mismatch) between the air (or the medium through which the wave is propagating) and the layer's surface. Impedance generally may represent a complex quantity that relates the electric field to the magnetic field in a material. If the impedance of the air and the object are the same, then there would be no reflection (i.e. all of the energy would be transmitted into the object). As such, a phenomenon of impedance mismatch may occur where a significant impedance mismatch may lead to strong reflections. To reduce these reflections, EMI-absorbing materials may be designed and configured to match the impedance of free space (or air). This is achieved by ensuring that the effective impedance of the EMI-absorbing materials approaches that of free space.

In various embodiments, impedance matching may be achieved by using a graded or layered structure. The outermost layer of the EMI-absorbing materials may be designed or configured to have an impedance close to that of free space, while the innermost layer may include different impedance optimized for absorption. Additionally, with respect to the layers found in between the inner most and outermost layers, the layers may have a gradient of impedance values to ensure a smooth transition, minimizing reflections at each interface. As such, this approach of gradient index and layered EMI-absorbing materials may ensure impedance matching at the air-EMI-absorbing materials interface, as well as ensuring efficient absorption within the EMI-absorbing materials.

In various embodiments, the EMI-absorbing materials may be composed of and/or configured for intrinsically lossy materials. For example, once the electromagnetic wave penetrates the EMI-absorbing materials due to impedance matching, the lossy nature of the material ensures that the wave may be absorbed and converted to heat, minimizing any transmission or reflections arising from further layers.

In various embodiments, EMI-absorbing materials may be designed and/or configured to exploit both magnetic and dielectric losses. Ferrite-based EMI-absorbing materials, for instance, focus on magnetic losses, while certain carbon-based or conductive polymer EMI-absorbing materials exploit dielectric losses.

In various embodiments, while the theory behind impedance matching in EMI-absorbing materials is straightforward, achieving it in practice can be challenging due to factors like frequency dispersion, angle of incidence variations, and the physical constraints of fabricating gradient-index materials. As such, and notwithstanding such difficulties, impedance matching may be used in the design and configuration of effective EMI-absorbing materials. Properly designed EMI-absorbing materials may ensure that electromagnetic waves are neither reflected at the surface nor transmitted through but are absorbed within the material, thereby minimizing the detectability of the coated object.

Refractive Index and Impedance

Refractive index matching in EMI-absorbing materials (EMI-absorbing materials) may relate to impedance matching. For example, the refractive index may define how much a wave is bent or refracted when entering a material. Refractive index may include a measure of how much slower light (or in this context, electromagnetic waves) travels in a particular medium compared to a vacuum. The refractive index is typically represented by the symbol n and is related to the material's permittivity $\varepsilon$ and permeability $\mu$ as: $n=\varepsilon\mu$.

In various embodiments, impedance may relate to how much a wave is reflected at the boundary between two materials. In electromagnetic terms, impedance may relate to the permittivity and permeability of the material. When the impedance of two materials is the same (or closely matched), there's minimal reflection at the boundary.

In various embodiments, when electromagnetic waves hit an object (e.g., an enclosure), it may be desired for EMI waves to enter the EMI-absorbing materials rather than being reflected back. Using the material disclosed herein (such as a lossy material), once the waves enter inside the EMI-absorbing materials, the waves may be absorbed and dissipated as heat.

In various embodiments, by matching the refractive index of the EMI-absorbing materials to that of air (or free space), it can be ensured that electromagnetic waves that enter the EMI-absorbing materials stay within the material with minimal reflection. If n_AIR is the refractive index of air and n_EMI is the refractive index of the EMI-absorbing materials, for optimal performance, it may be desired for n_EMI to be approximately equal to n_AIR. This may ensure that the electromagnetic waves confront no significant boundary when the waves encounter the EMI-absorbing materials, thus leading to minimal reflections.

In various embodiments, while refractive index matching may ensure the electromagnetic waves enter the EMI-absorbing materials, the internal structure and composition of the EMI-absorbing materials may ensure that these waves are absorbed, thereby demonstrating the importance of the lossy nature of the EMI-absorbing materials. For example, the EMI-absorbing materials may have components that can effectively dissipate the electromagnetic wave's energy as heat.

In various embodiments, the EMI-absorbing materials may be tuned for specific EMI frequencies. This can involve adjusting the EMI-absorbing material's microstructure or using multiple layers with varying refractive indices. Each layer can be designed to be effective against a particular range of frequencies.

In various embodiments, achieving perfect refractive index matching can be challenging due to factors like frequency dispersion, angle of incidence variations, and the inherent properties of available materials. However, with nanotechnology and composite materials advancements, more avenues exist to engineer EMI-absorbing materials with closely matched refractive indices.

In the context of EMI-absorbing materials, and as discussed hereinabove, refractive index matching may include a technique used to minimize the reflection of electromagnetic waves at the material's surface. By ensuring the EMI-absorbing materials has a refractive index close to that of air, and by designing and/or configuring the internal structure of the EMI-absorbing materials to absorb and dissipate this energy, the amount of EMI can be reduced that penetrates the protective enclosure.

When discussing multi-layer refractive index matching in EMI-absorbing materials (EMI-absorbing materials), an objective may be to reduce the EMI's reflection at different frequency bands and from various angles of incidence, or the principle of multi-layer design.

In various embodiments, with respect to broadband absorption, a single-layer of EMI-absorbing materials might be optimized for a specific frequency, but with respect to real-world enclosure systems, they often are configured to operate across a range of frequencies. Multiple layers with varying refractive indices and loss factors can be combined to achieve broadband absorption.

In various embodiments, with respect to gradient refractive index, the transition in refractive index from one layer to the next should be gradual. This may ensure that there isn't a sudden impedance mismatch at any interface (which could cause a reflection). The refractive index may therefore transition from that of air to deeper layers that might be more lossy and have a higher refractive index.

In various embodiments, with respect to multi-layer refractive index matching, the outermost layer may be configured to have a refractive index close to that of air to minimize the initial reflection. This layer might not be very lossy but should help guide the electromagnetic wave into the deeper layers. The intermediate layers may have a progressively increasing refractive index, gradually transitioning from the outermost layer's value to the innermost layer's value. A function of the intermediate layers may include be to continue guiding the electromagnetic waves deeper while beginning the absorption process. The innermost layer may be highly lossy, ensuring that any electromagnetic wave that reaches this depth is efficiently absorbed. The refractive index of the innermost layer may be the highest (compared to the other layers), but since the innermost layer is deep within the EMI-absorbing materials, there's minimal risk of reflecting waves back (upwards) through the stack. In various embodiments, each layer's thickness may be tuned based on the target frequency bands. In simple terms, layers targeting lower frequencies (longer wavelengths) might be thicker, while those for higher frequencies (shorter wavelengths) might be thinner. The exact thickness would depend on the specific materials used and the desired absorption characteristics.

In various embodiments, and with respect to angular-dependency, propagated waves might not always hit the EMI-absorbing materials head-on. They can come in at various angles of incidence, which affects the effective angle of reflection (if any). Multi-layer designs may help in improving the angular response of a stack of EMI-absorbing materials.

In various embodiments, and with respect to material limitations, although it may be desired to select materials with the desired refractive index (such as that close to air), it may be challenging to find a material that meets all desired criteria. Often, composite materials, mixing dielectric and magnetic materials, may therefore be used.

In various embodiments, and with respect to fabrication, a consistent gradient in refractive index across layers may be configured to ensure a smooth transition from one layer to the next. Additionally, with respect to the weight and/or flexibility of the EMI-absorbing material stack, a multi-layer design may increase the weight (and thereby decrease the flexibility).

In various embodiments, multi-layer refractive index matching in EMI-absorbing materials may allow for broadband absorption and may reduce reflection from multiple angles of incidence. By designing and/or configuring layers with a gradient in refractive index and tuning each layer's material properties and thickness, a high degree of EMI absorption can be achieved over a wide range of frequencies and angles. Additionally, although EMI occurs across a wide spectrum, effective broadband absorption of EMI using thin layers may be achieved.

In various embodiments, and with respect to metamaterial absorbers, multi-resonant structures can be designed and/or configured to achieve absorption at multiple frequencies. In some embodiments, patterned metallic may be are formed on a dielectric substrate, possibly (e.g., in some applications, or for some components of a protective enclosure) with a ground plane beneath. The pattern can be adjusted to tune the resonant absorption frequencies.

In various embodiments, and with respect to carbon-based materials, composites of CNTs or graphene with polymers can be used as thin-layer absorbers. In one embodiment, carbon-based materials may benefit from being lightweight (which may be particularly useful for aerospace applications).

In various embodiments, and with respect to magnetic materials, ferrites may be used to absorb electromagnetic waves. However, absorption by ferrites is often narrowband. To widen the absorption bandwidth, ferrite-polymer composites or layering different ferrites with different resonant frequencies can be used. In various embodiments, and with respect to layered structures, by combining different materials (including ferrites) in a multi-layered structure, broadband absorption can be achieved. For example, a combination of a magnetic layer (like a ferrite) and a dielectric layer (like a polymer composite with CNTs) can provide dual-band or broadband absorption.

In various embodiments, and with respect to nanostructured designs, techniques like nano-imprinting or other nanofabrication methods can be used to create nanostructures that can resonate with selected frequencies. These structures can provide tuned absorption of a selected frequency or over a range of frequencies.

In various embodiments, and with respect to tuning and optimization, it is recognized that while many materials and structures can offer absorption in a selected band, the efficiency, bandwidth, and thickness need to be carefully optimized based on the application. Computational tools and optimization algorithms can be used to design and/or configure the most effective absorber for a given application.

In various embodiments, other factors like mechanical strength, flexibility, weight, and environmental stability should be considered, especially for real-world applications with respect to multi-layered refractive index matching.

In various embodiments, a variety of alternative materials may be used for EMI absorption. It is to be appreciated that the materials disclosed herein are merely exemplary and are not intended to be exhaustive in any manner. For example, graphene, graphene oxide (GO), and graphene-polymer composites may each be used as materials.

With respect to graphene, graphene may include a single layer of carbon atoms arranged in a 2D honeycomb lattice. It may exhibit outstanding electrical, mechanical, and thermal properties. Additionally, graphene can interact strongly with electromagnetic waves due to its high electrical conductivity and surface area, leading to highly desirable absorption profiles.

With respect to graphene oxide, graphene oxide may be a derivative of graphene with various oxygen-containing functional groups, which makes it more dispersible in water and some organic solvents. Additionally, graphene oxide may have reduced electrical conductivity (compared to pristine graphene) due to its functional groups. However, the layered nature of graphene oxide can cause multiple reflections and scattering within the layers, leading to desired levels of EMI absorption. The interaction between the functional groups and the electromagnetic wave can also contribute to absorption.

With respect to graphene-polymer composites, the graphene-polymer composites may include a mixture of graphene or graphene oxide mixed with polymers, which may combine the benefits of both components. Additionally, by embedding graphene or graphene oxide in a polymer matrix, the matrix can offer structural support, while graphene or graphene oxide may provide the primary absorption mechanism. Additionally, the composite can be tailored to achieve desired electromagnetic properties by varying the graphene or graphene oxide loading, ensuring a balance between reflection and absorption. Further, the interfaces between the graphene or graphene oxide and the polymer can also lead to additional scattering, enhancing absorption.

In various embodiments, a variety of different factors may be used to enhance radiofrequency absorption. For example, the radiofrequency absorption properties of graphene-polymer composites can be tuned by varying the filler's concentration and type (graphene or graphene oxide), the type of polymer, and the processing method. With respect to multi-layered structures, alternating between graphene or graphene oxide layers and polymer layers, can create multiple internal reflections and scattering points, which enhances absorption. Additionally, synergistic effects may be found with other fillers. For example, graphene and graphene oxide can be combined with other absorptive materials (such as magnetic particles or carbon nanotubes in a polymer matrix) to achieve synergistic absorption effects. Further, graphene-polymer composites can be lightweight and flexible, making them suitable for coatings or integration into flexible electronics or wearable devices.

As such, graphene, graphene oxide, and their polymer composites show promise for EMI absorption due to their unique electromagnetic interactions, tunability, and potential for creating multi-layered or hybrid absorptive structures.

In particular, and in accordance with various embodiments, polymer-containing matrix may comprise a thermoplastic material. Further, the metamaterial may be incorporated into the polymer-containing matrix by embedding the metamaterial within the matrix. In one embodiment, the resulting metamaterial-containing matrix may form the basis of a protective enclosure/layer, providing a barrier that can absorb or reflect specific frequencies of electromagnetic interference, thereby protecting the electronic systems housed within the enclosure. It is to be appreciated that such a metamaterial-containing matrix may be additional sprayed (as a coating) onto other surfaces, and/or be applied to any substrate for application.

In some cases, the metamaterial may be embedded within the polymer-containing matrix in a specific pattern or arrangement. For example, the metamaterial may be embedded in a layered structure, a grid-like structure, a random structure, or any other suitable structure.

In other aspects, the metamaterial may be embedded within the polymer-containing matrix in a manner that allows for the adjustment or tuning of the permittivity and/or permeability of the metamaterial after the formation of the protective enclosure. This can be achieved, for example, by embedding the metamaterial in a manner that allows for the application of an external stimulus, such as heat, light, or an electric field, to the metamaterial after the formation of the protective enclosure. The application of the external stimulus may cause a change in the permittivity and/or permeability of the metamaterial, thereby allowing for the tuning of the metamaterial to absorb or reflect a specific frequency of electromagnetic interference. In this manner, the absorption or reflection properties of the metamaterial may be modified and/or changed in response to a stimuli.

Carbon-Containing Metamaterials Overview

Figure 10B:
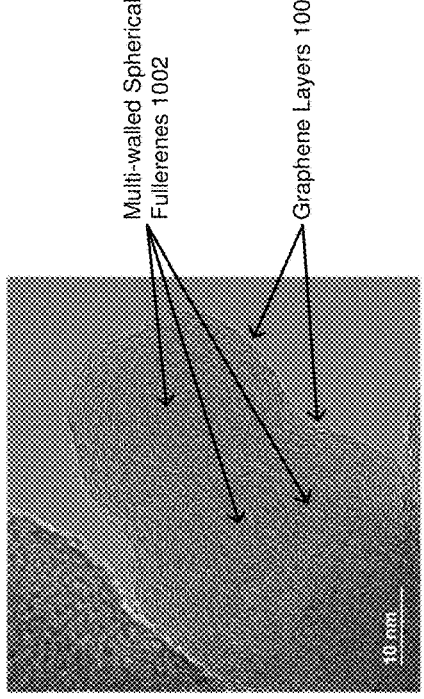
FIG. 10A through FIG. 10Y depict structured carbons, various carbon nanoparticles, various carbon-based aggregates, and various three-dimensional carbon-containing assemblies that are grown over other materials, according to an embodiment.
Figure 10A:
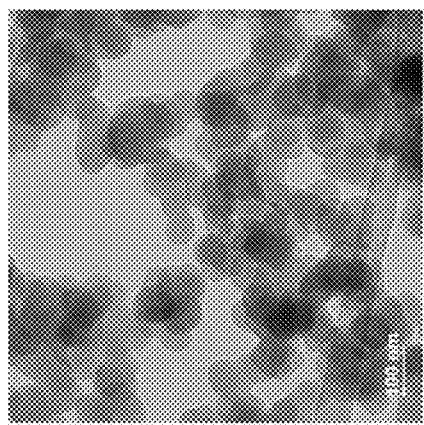
Figure 10C:
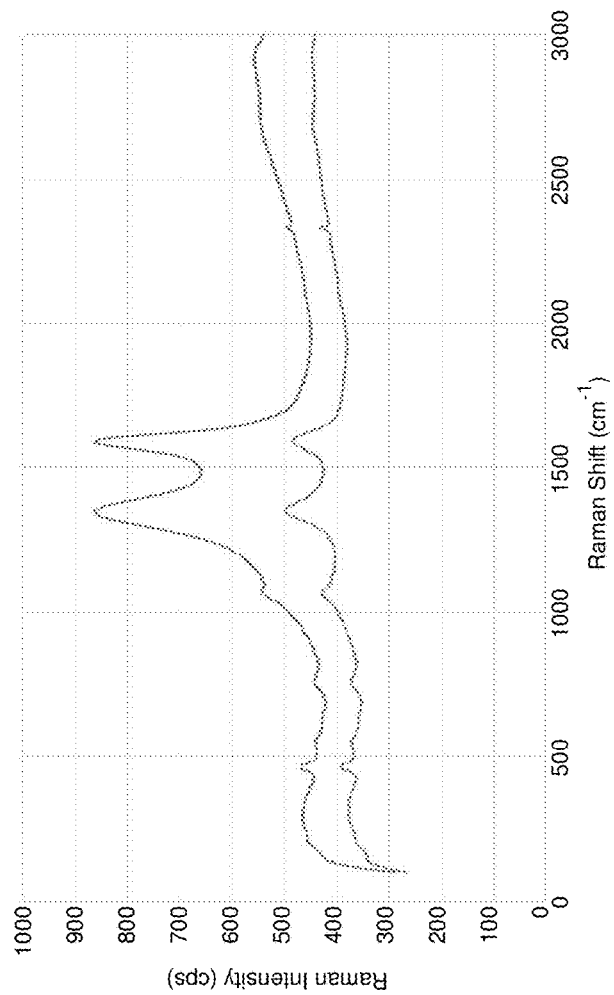
Figure 10E:
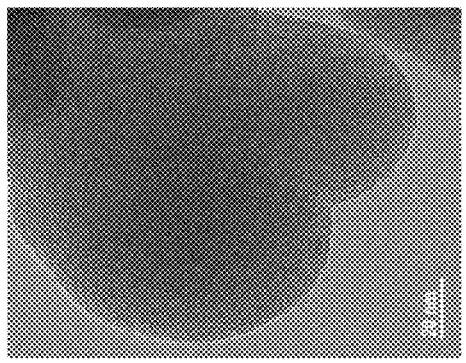
Figure 10D:
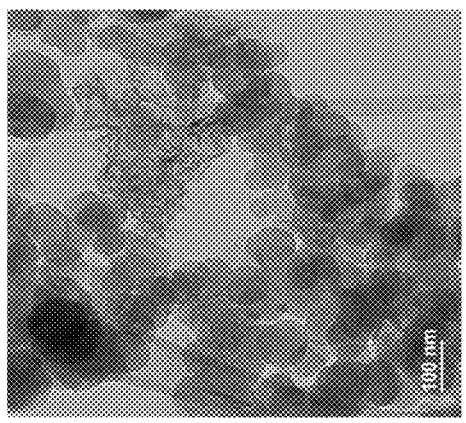
Figure 10F:
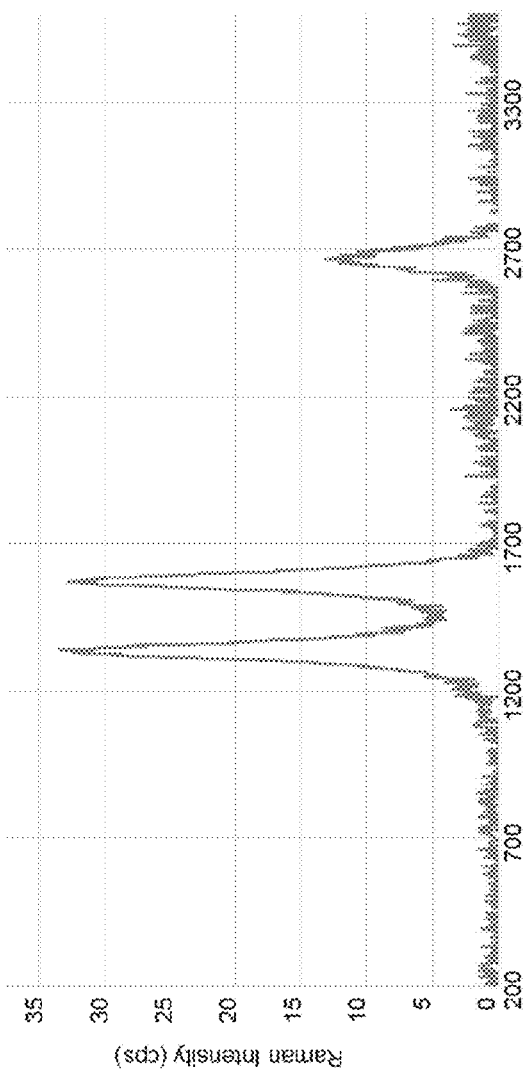
Figure 10K:
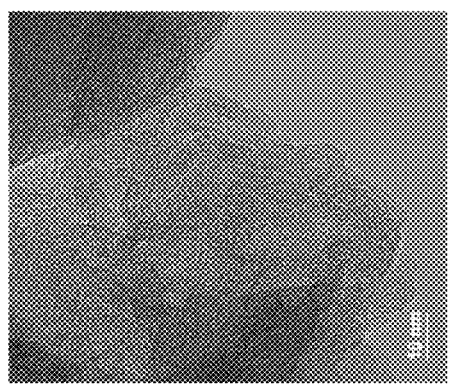
Figure 10L:
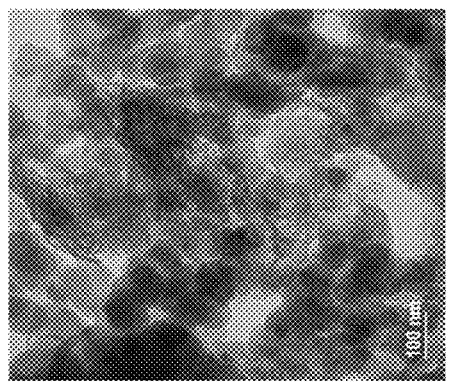
Figure 10M:
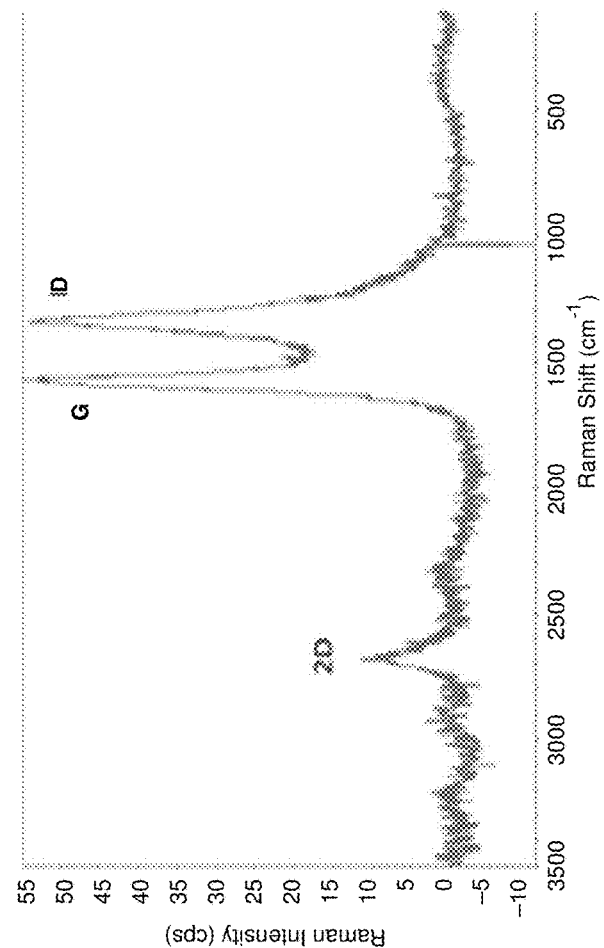
Figure 10N:
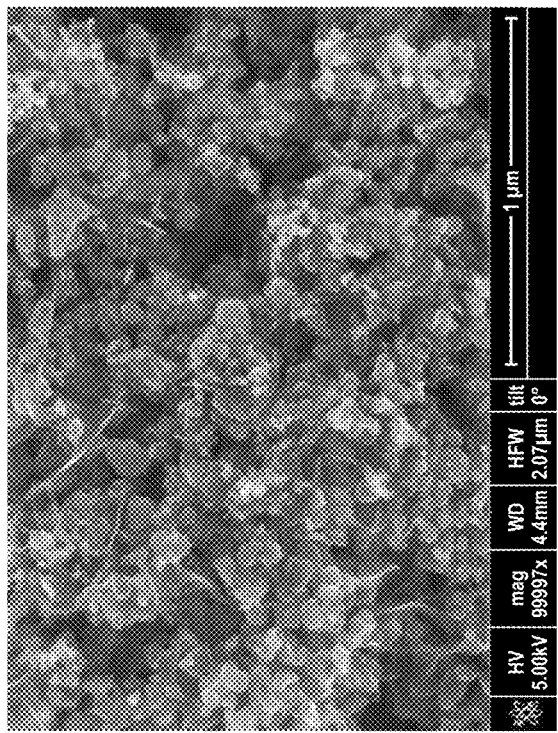
Figure 10O:
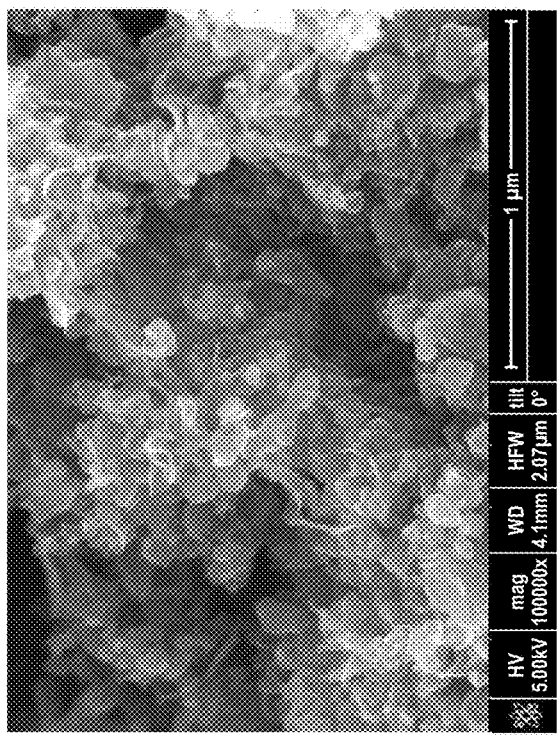
Figure 10P:
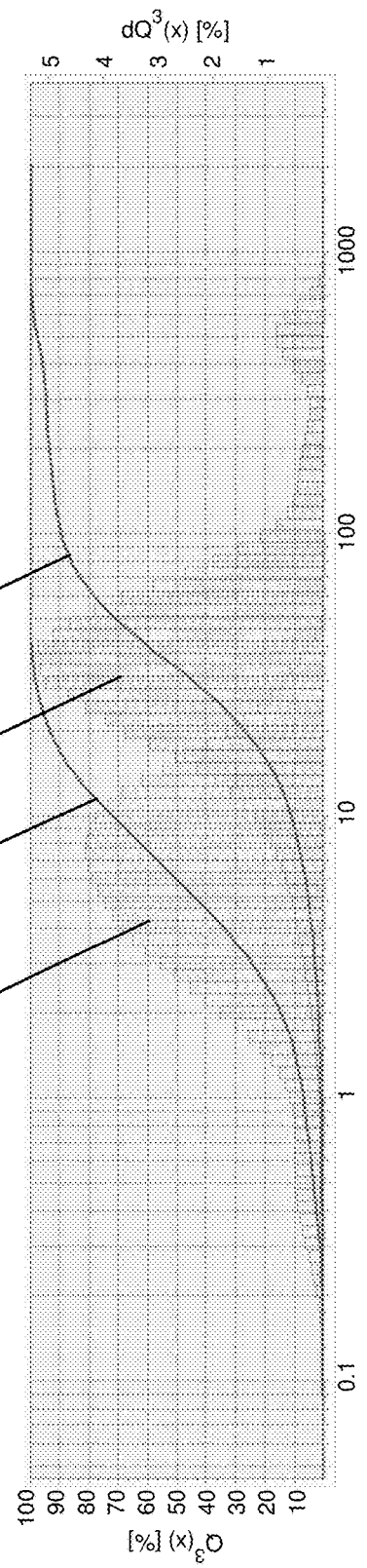
Figure 10Q:
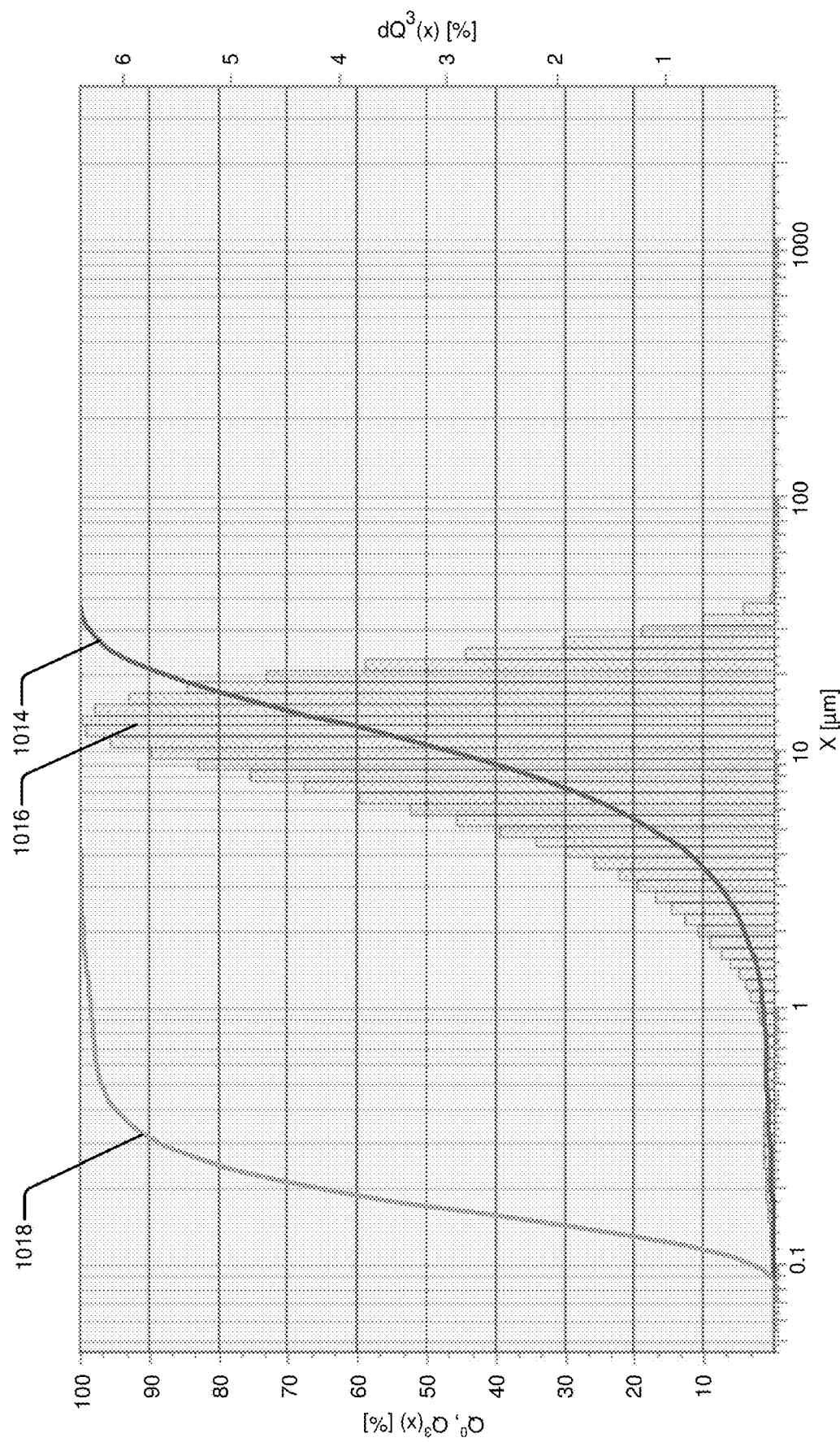
Figure 10R:
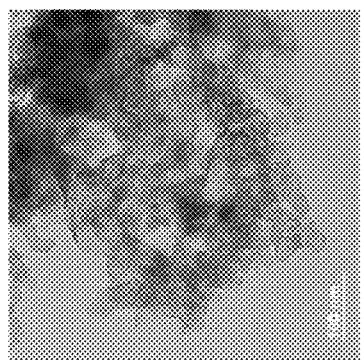
Figure 10S:
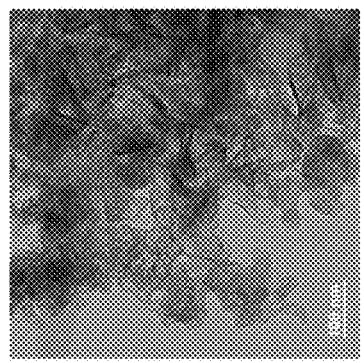
Figure 10T:
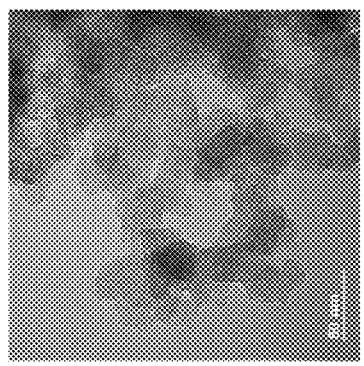
Figure 10U:
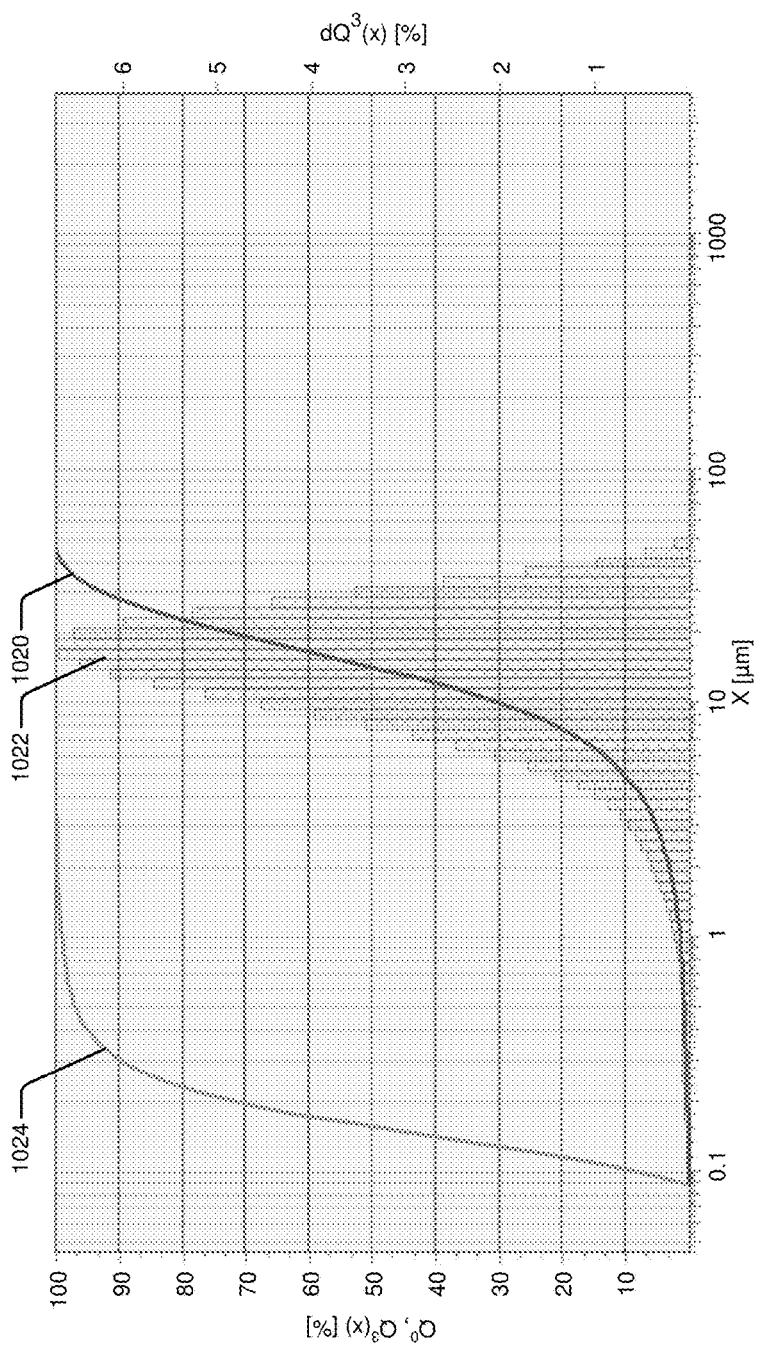
Figure 10V:
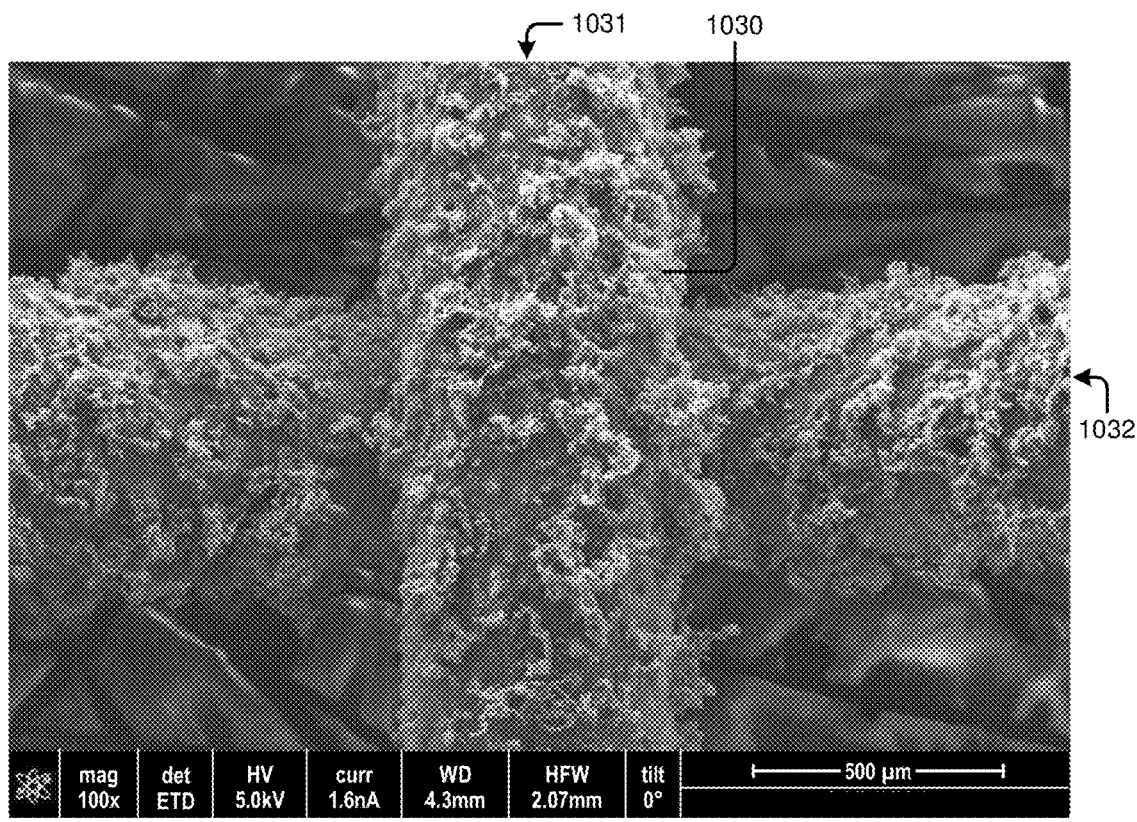
Figure 10W:
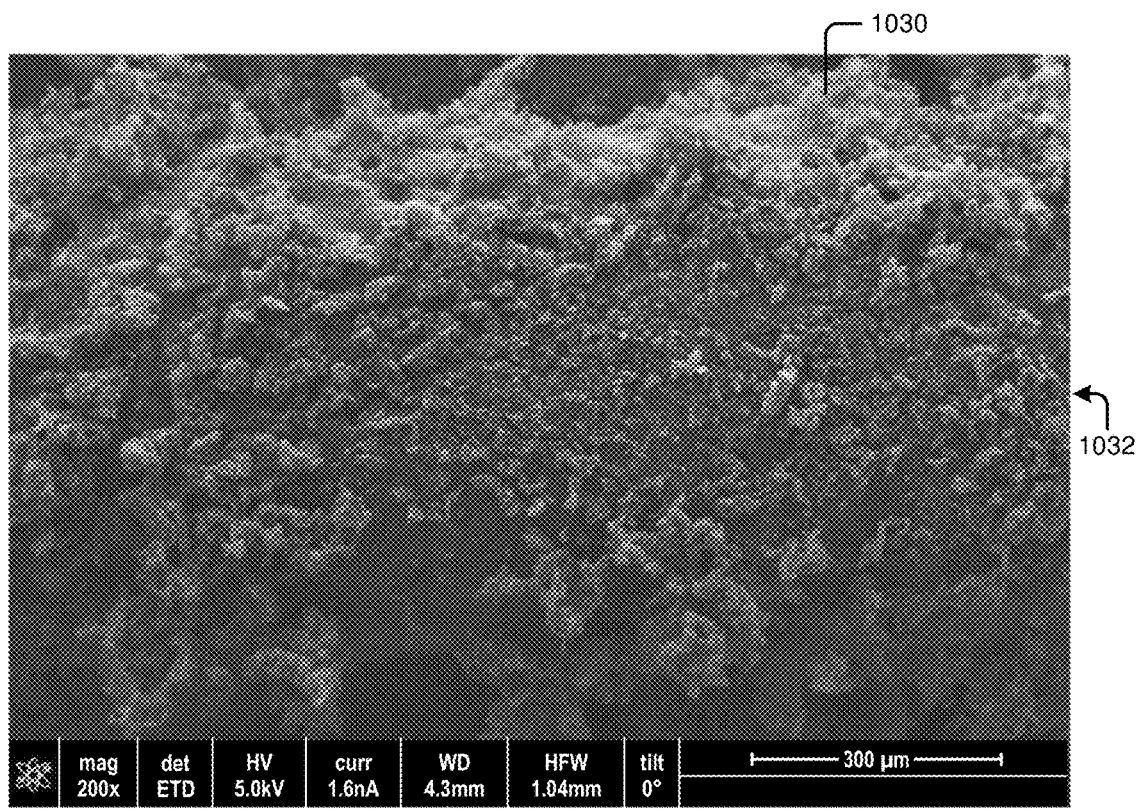
Figure 10X:
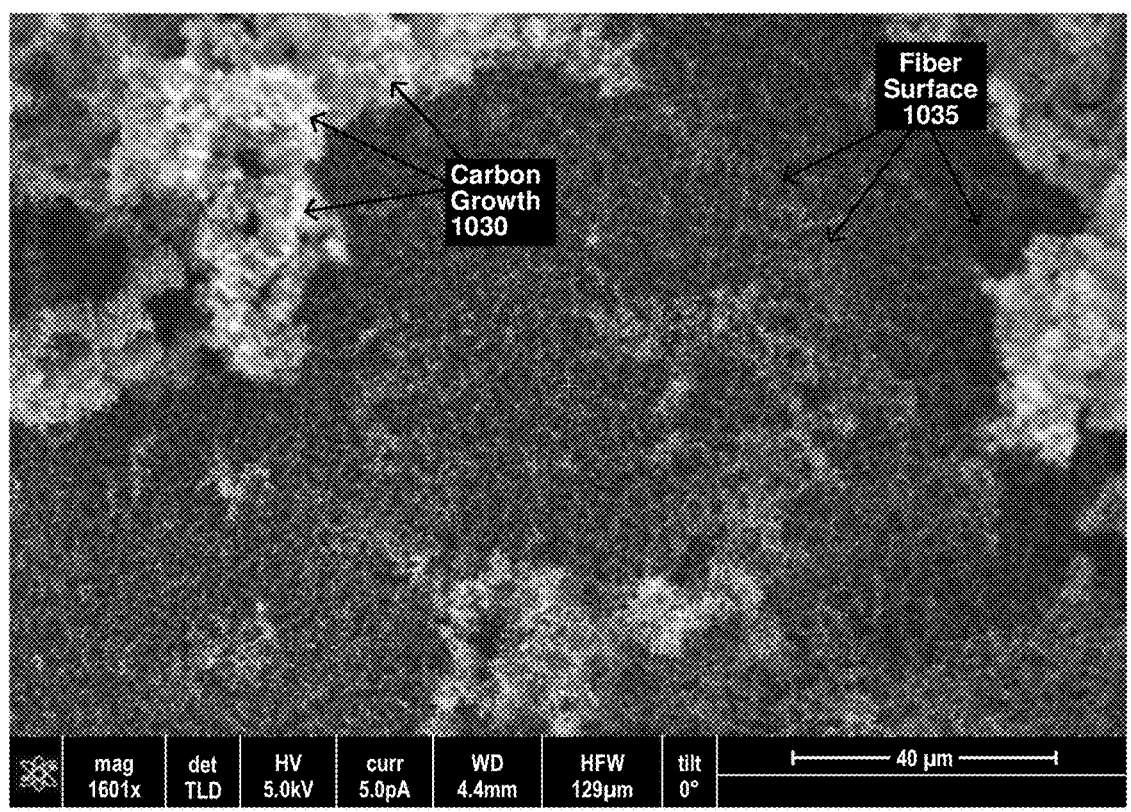
Figure 10Y:
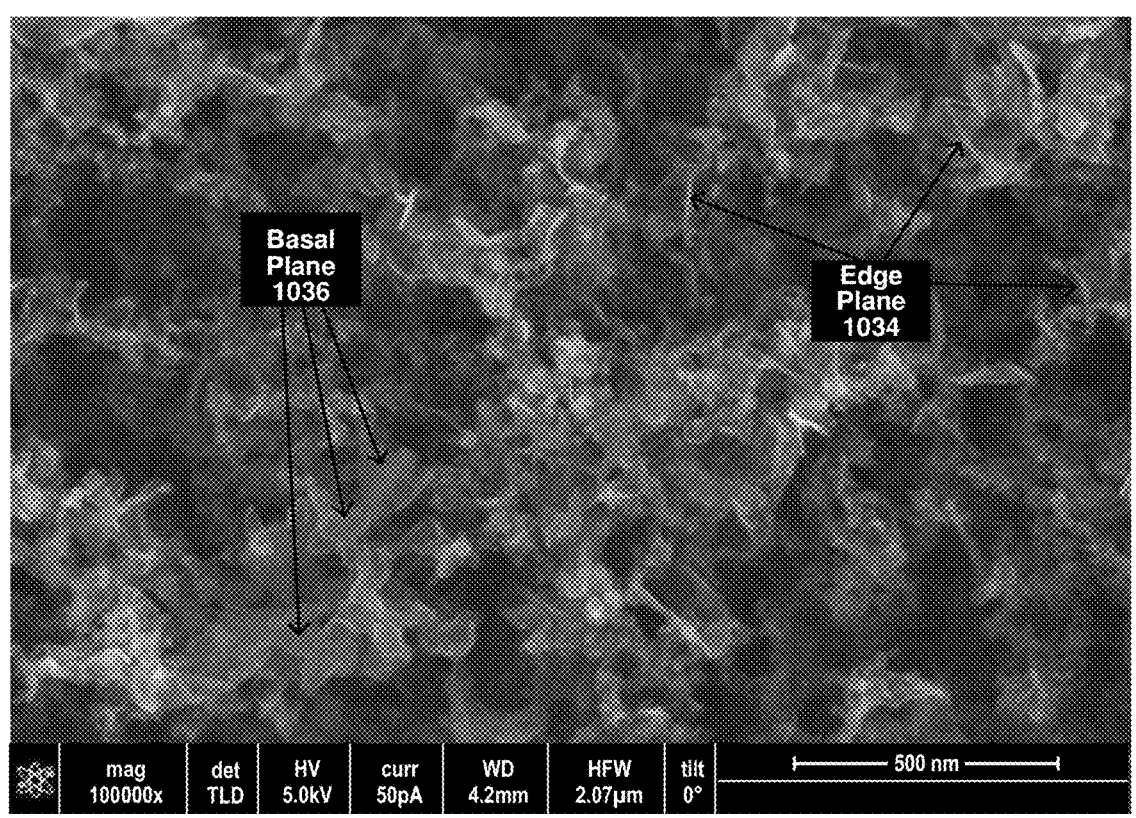

FIG. 10A through FIG. 10Y depict structured carbons, various carbon nanoparticles, various carbon-containing aggregates, and various three-dimensional carbon-containing structures that are grown over other materials, according to some embodiments of the present disclosure.

In some embodiments, the carbon nanoparticles and aggregates are characterized by a high "uniformity" (i.e., high mass fraction of desired carbon allotropes), a high degree of "order" (i.e., low concentration of defects), and/or a high degree of "purity" (i.e., low concentration of elemental impurities), in contrast to the lower uniformity, less ordered, and lower purity particles achievable with conventional systems and methods.

In some embodiments, the nanoparticles produced using the methods described herein contain multi-walled spherical fullerenes (MWSFs) or connected MWSFs and have a high uniformity (e.g., a ratio of graphene to MWSF from 20% to 80%), a high degree of order (e.g., a Raman signature with an $I_D/I_G$ ratio from 0.95 to 1.05), and a high degree of purity (e.g., the ratio of carbon to other elements (other than hydrogen) is greater than 99.9%). In some embodiments, the nanoparticles produced using the methods described herein contain MWSFs or connected MWSFs, and the MWSFs do not contain a core composed of impurity elements other than carbon. In some cases, the particles produced using the methods described herein are aggregates containing the nanoparticles described above with large diameters (e.g., greater than 10 μm across).

Conventional methods have been used to produce particles containing multi-walled spherical fullerenes with a high degree of order, but the conventional methods lead to carbon products with a variety of shortcomings. For example, high temperature synthesis techniques lead to particles with a mixture of many carbon allotropes and therefore low uniformity (e.g., less than 20% fullerenes to other carbon allotropes) and/or small particle sizes (e.g., less than 1 μm, or less than 100 nm in some cases). Methods using catalysts lead to products including the catalyst elements and therefore have low purity (e.g., less than 95% carbon to other elements) as well. These undesirable properties also often lead to undesirable electrical properties of the resulting carbon particles (e.g., electrical conductivity of less than 1000 S/m).

In some embodiments, the carbon nanoparticles and aggregates described herein are characterized by Raman spectroscopy that is indicative of the high degree of order and uniformity of structure. In some embodiments, the uniform, ordered and/or pure carbon nanoparticles and aggregates described herein are produced using relatively high speed, low cost improved thermal reactors and methods, as described below. Additional advantages and/or improvements will also become apparent from the following disclosure.

In the present disclosure, the term "graphene" refers to an allotrope of carbon in the form of a two-dimensional, atomic-scale, hexagonal lattice in which one atom forms each vertex. The carbon atoms in graphene are $sp^2$-bonded. Additionally, graphene has a Raman spectrum with two main peaks: a G-mode at approximately 1580 $cm^{-1}$ and a D-mode at approximately 1350 $cm^{-1}$ (when using a 532 nm excitation laser).

In the present disclosure, the term "fullerene" refers to a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

In the present disclosure, the term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) contain multiple concentric spheres of fullerenes.

In the present disclosure, the term "nanoparticle" refers to a particle that measures from 1 nm to 989 nm. The nanoparticle can include one or more structural characteristics (e.g., crystal structure, defect concentration, etc.), and one or more types of atoms. The nanoparticle can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (i.e., with few voids), porous shapes (i.e., with many voids), etc.

In the present disclosure, the term "aggregate" refers to a plurality of nanoparticles that are connected together by electrostatic forces (e.g., Van der Waals forces, London dispersion forces, dipole-dipole interactions, hydrogen bonding, etc.) by covalent bonds, by ionic bonds, by metallic bonds, or by other physical or chemical interactions. Aggregates can vary in size considerably, but in general are larger than about 500 nm.

In some embodiments, a carbon nanoparticle, as described herein, includes two or more connected multi-walled spherical fullerenes (MWSFs) and layers of graphene coating the connected MWSFs. In some embodiments, a carbon nanoparticle, as described herein, includes two or more connected multi-walled spherical fullerenes (MWSFs) and layers of graphene coating the connected MWSFs where the MWSFs do not contain a core composed of impurity elements other than carbon. In some embodiments, a carbon nanoparticle, as described herein, includes two or more connected multi-walled spherical fullerenes (MWSFs) and layers of graphene coating the connected MWSFs where the MWSFs do not contain a void (i.e., a space with no carbon atoms greater than approximately 0.5 nm, or greater than approximately 1 nm) at the center. In some embodiments, the connected MWSFs are formed of concentric, well-ordered spheres of $sp^2$-hybridized carbon atoms, as contrasted with spheres of poorly-ordered, non-uniform, amorphous carbon particles.

In some embodiments, the nanoparticles containing the connected MWSFs have an average diameter in a range from 5 to 500 nm, or from 5 to 250 nm, or from 5 to 100 nm, or from 5 to 50 nm, or from 10 to 500 nm, or from 10 to 250 nm, or from 10 to 100 nm, or from 10 to 50 nm, or from 40 to 500 nm, or from 40 to 250 nm, or from 40 to 100 nm, or from 50 to 500 nm, or from 50 to 250 nm, or from 50 to 100 nm. Of course, nanoparticles containing connected MWSFs may have an average diameter characterized by having any of the foregoing values or being within any of the foregoing exemplary ranges, or an average diameter characterized by having a value or being within a range between any of the foregoing exemplary ranges, without limitation and without departing from the scope of the presently described inventive concepts.

In some embodiments, the carbon nanoparticles described herein form aggregates, wherein many nanoparticles aggregate together to form a larger unit. In some embodiments, a carbon aggregate includes a plurality of carbon nanoparticles. A diameter across the carbon aggregate is in a range from 10 to 500 µm, or from 50 to 500 µm, or from 100 to 500 µm, or from 250 to 500 µm, or from 10 to 250 µm, or from 10 to 100 µm, or from 10 to 50 µm. Of course, carbon aggregates may have an average diameter characterized by having any of the foregoing values or being within any of the foregoing exemplary ranges, or an average diameter characterized by having a value or being within a range between any of the foregoing exemplary ranges, without limitation and without departing from the scope of the presently described inventive concepts.

In some embodiments, the aggregate is formed from a plurality of carbon nanoparticles, as defined above. In some embodiments, aggregates contain connected MWSFs. In some embodiments, the aggregates contain connected MWSFs with a high uniformity metric (e.g., a ratio of graphene to MWSF from 20% to 80%), a high degree of order (e.g., a Raman signature with an $I_D/I_G$ ratio from 0.95 to 1.05), and a high degree of purity (e.g., greater than 99.9% carbon).

One benefit of producing aggregates of carbon nanoparticles, particularly with diameters in the ranges described above, is that aggregates of particles greater than 10 µm are easier to collect than particles or aggregates of particles that are smaller than 500 nm. The case of collection reduces the cost of manufacturing equipment used in the production of the carbon nanoparticles and increases the yield of the carbon nanoparticles. Additionally, particles greater than 10 µm in size pose fewer safety concerns compared to the risks of handling smaller nanoparticles, e.g., potential health and safety risks due to inhalation of the smaller nanoparticles. The lower health and safety risks, thus, further reduce the manufacturing cost.

In some embodiments, a carbon nanoparticle has a ratio of graphene to MWSFs from 10% to 90%, or from 10% to 80%, or from 10% to 60%, or from 10% to 40%, or from 10% to 20%, or from 20% to 40%, or from 20% to 90%, or from 40% to 90%, or from 60% to 90%, or from 80% to 90%. In some embodiments, a carbon aggregate has a ratio of graphene to MWSFs is from 10% to 90%, or from 10% to 80%, or from 10% to 60%, or from 10% to 40%, or from 10% to 20%, or from 20% to 40%, or from 20% to 90%, or from 40% to 90%, or from 60% to 90%, or from 80% to 90%. Of course, carbon nanoparticles may have a graphene-to-MWSF ratio characterized by having any of the foregoing values or being within any of the foregoing exemplary ranges, or an average graphene-to-MWSF ratio characterized by having a value or being within a range between any of the foregoing exemplary ranges, without limitation and without departing from the scope of the presently described inventive concepts.

In some embodiments, a carbon nanoparticle has a ratio of graphene to connected MWSFs from 10% to 90%, or from 10% to 80%, or from 10% to 60%, or from 10% to 40%, or from 10% to 20%, or from 20% to 40%, or from 20% to 90%, or from 40% to 90%, or from 60% to 90%, or from 80% to 90%. In some embodiments, a carbon aggregate has a ratio of graphene to connected MWSFs is from 10% to 90%, or from 10% to 80%, or from 10% to 60%, or from 10% to 40%, or from 10% to 20%, or from 20% to 40%, or from 20% to 90%, or from 40% to 90%, or from 60% to 90%, or from 80% to 90%. Of course, carbon nanoparticles may have a graphene-to-connected MWSF ratio characterized by having any of the foregoing values or being within any of the foregoing exemplary ranges, or an average graphene-to-connected MWSF ratio characterized by having a value or being within a range between any of the foregoing exemplary ranges, without limitation and without departing from the scope of the presently described inventive concepts.

In some embodiments, Raman spectroscopy is used to characterize carbon allotropes to distinguish their molecular structures. For example, graphene can be characterized using Raman spectroscopy to determine information such as order/disorder, edge and grain boundaries, thickness, number of layers, doping, strain, and thermal conductivity. MWSFs have also been characterized using Raman spectroscopy to determine the degree of order of the MWSFs.

In some embodiments, Raman spectroscopy is used to characterize the structure of MWSFs or connected MWSFs. The main peaks in the Raman spectra are the G-mode and the D-mode. The G-mode is attributed to the vibration of carbon atoms in $sp^2$-hybridized carbon networks, and the D-mode is related to the breathing of hexagonal carbon rings with defects. In some cases, defects may be present, yet may not be detectable in the Raman spectra. For example, if the presented crystalline structure is orthogonal with respect to the basal plane, the D-peak will show an increase. On the other hand, if presented with a perfectly planar surface that is parallel with respect to the basal plane, the D-peak will be zero.

When using 532 nm incident light, the Raman G-mode is typically at 1582 $cm^{-1}$ for planar graphite, however can be downshifted for MWSFs or connected MWSFs (e.g., down to 1565 $cm^{-1}$ or down to 1580 $cm^{-1}$). The D-mode is observed at approximately 1350 $cm^{-1}$ in the Raman spectra of MWSFs or connected MWSFs. The ratio of the intensities of the D-mode peak to G-mode peak (i.e., the $I_D/I_G$) is related to the degree of order of the MWSFs, where a lower $I_D/I_G$ indicates a higher degree of order. An $I_D/I_G$ near or below 1 indicates a relatively high degree of order, and an $I_D/I_G$ greater than 1.1 indicates a lower degree of order.

In some embodiments, a carbon nanoparticle or a carbon aggregate containing MWSFs or connected MWSFs, as described herein, has a Raman spectrum with a first Raman peak at about 1350 $cm^{-1}$ and a second Raman peak at about 1580 $cm^{-1}$ when using 532 nm incident light. In some embodiments, the ratio of an intensity of the first Raman peak to an intensity of the second Raman peak (i.e., the $I_D/I_G$) for the nanoparticles or the aggregates described herein is in a range from 0.95 to 1.05, or from 0.9 to 1.1, or from 0.8 to 1.2, or from 0.9 to 1.2, or from 0.8 to 1.1, or from 0.5 to 1.5, or less than 1.5, or less than 1.2, or less than 1.1, or less than 1, or less than 0.95, or less than 0.9, or less than 0.8. Of course, carbon nanoparticles or aggregates including MWSFs or connected MWSFs may be characterized by a ratio of first and second Raman peak intensities having any of the foregoing values or being within any of the foregoing exemplary ranges, or a ratio of first and second Raman peak intensities characterized by having a value or being within a range between any of the foregoing exemplary ranges, without limitation and without departing from the scope of the presently described inventive concepts.

In some embodiments, a carbon aggregate containing MWSFs or connected MWSFs, as defined above, has a high purity. In some embodiments, the carbon aggregate containing MWSFs or connected MWSFs has a ratio of carbon to metals of greater than 99.99%, or greater than 99.95%, or greater than 99.9%, or greater than 99.8%, or greater than 99.5%, or greater than 99%. In some embodiments, the carbon aggregate has a ratio of carbon to other elements of greater than 99.99%, or greater than 99.95%, or greater than 99.9%, or greater than 99.5%, or greater than 99%, or greater than 90%, or greater than 80%, or greater than 70%, or greater than 60%. In some embodiments, the carbon aggregate has a ratio of carbon to other elements (except for hydrogen) of greater than 99.99%, or greater than 99.95%, or greater than 99.9%, or greater than 99.8%, or greater than 99.5%, or greater than 99%, or greater than 90%, or greater than 80%, or greater than 70%, or greater than 60%. Of course, carbon aggregates including MWSFs or connected MWSFs may be characterized by a ratio of carbon to metal having any of the foregoing values or being within any of the foregoing exemplary ranges, or a ratio of carbon to metal having value or being within a range between any of the foregoing exemplary ranges, without limitation and without departing from the scope of the presently described inventive concepts.

In some embodiments, a carbon aggregate containing MWSFs or connected MWSFs, as defined above, has a high specific surface area. In some embodiments, the carbon aggregate has a Brunauer, Emmett and Teller (BET) specific surface area from 10 to 200 $m^2/g$, or from 10 to 100 $m^2/g$, or from 10 to 50 $m^2/g$, or from 50 to 200 $m^2/g$, or from 50 to 100 $m^2/g$, or from 10 to 1000 $m^2/g$. Of course, carbon aggregates including MWSFs or connected MWSFs may be characterized by a BET specific surface area having any of the foregoing values or being within any of the foregoing exemplary ranges, or a BET specific surface area characterized by having a value or being within a range between any of the foregoing exemplary ranges, without limitation and without departing from the scope of the presently described inventive concepts.

In some embodiments, a carbon aggregate containing MWSFs or connected MWSFs, as defined above, has a high electrical conductivity. In some embodiments, a carbon aggregate containing MWSFs or connected MWSFs, as defined above, is compressed into a pellet and the pellet has an electrical conductivity greater than 500 S/m, or greater than 1000 S/m, or greater than 2000 S/m, or greater than 3000 S/m, or greater than 4000 S/m, or greater than 5000 S/m, or greater than 10000 S/m, or greater than 20000 S/m, or greater than 30000 S/m, or greater than 40000 S/m, or greater than 50000 S/m, or greater than 60000 S/m, or greater than 70000 S/m, or from 500 S/m to 100000 S/m, or from 500 S/m to 1000 S/m, or from 500 S/m to 10000 S/m, or from 500 S/m to 20000 S/m, or from 500 S/m to 100000 S/m, or from 1000 S/m to 10000 S/m, or from 1000 S/m to 20000 S/m, or from 10000 to 100000 S/m, or from 10000 S/m to 80000 S/m, or from 500 S/m to 10000 S/m. Of course, carbon aggregates including MWSFs or connected MWSFs may be characterized by an electrical conductivity having any of the foregoing values or being within any of the foregoing exemplary ranges, or an electrical conductivity characterized by having a value or being within a range between any of the foregoing exemplary ranges, without limitation and without departing from the scope of the presently described inventive concepts.

In some cases, the density of the pellet is approximately 1 $g/cm^3$, or approximately 1.2 $g/cm^3$, or approximately 1.5 $g/cm^3$, or approximately 2 $g/cm^3$, or approximately 2.2 $g/cm^3$, or approximately 2.5 $g/cm^3$, or approximately 3 $g/cm^3$. Of course, pellets may be characterized by a density having any of the foregoing values or being within any of the foregoing exemplary ranges, or a density having a value or being within a range between any of the foregoing exemplary ranges, without limitation and without departing from the scope of the presently described inventive concepts.

Additionally, tests have been performed in which compressed pellets of the carbon aggregate materials have been formed with compressions of 2000 psi and 12000 psi and with annealing temperatures of 800° C. and 1000° C. The higher compression and/or the higher annealing temperatures generally result in pellets with a higher degree of electrical conductivity, including in the range of 12410.0 S/m to 13173.3 S/m.

High Purity Carbon Allotropes Produced Using Thermal Processing Systems

In some embodiments, the carbon nanoparticles and aggregates described herein are produced using thermal reactors and methods, such as any appropriate thermal reactor and/or method. Further details pertaining to thermal reactors and/or methods of use can be found in U.S. Pat. No. 9,862,602, issued Jan. 9, 2018, titled "CRACKING OF A PROCESS GAS", which is hereby incorporated by reference in its entirety. Additionally, precursors (e.g., including methane, ethane, propane, butane, and natural gas) can be used with the thermal reactors to produce the carbon nanoparticles and the carbon aggregates described herein.

In some embodiments, the carbon nanoparticles and aggregates described herein are produced using the thermal reactors with gas flow rates from 1 slm to 10 slm, or from 0.1 slm to 20 slm, or from 1 slm to 5 slm, or from 5 slm to 10 slm, or greater than 1 slm, or greater than 5 slm. In some embodiments, the carbon nanoparticles and aggregates described herein are produced using the thermal reactors with gas resonance times from 0.1 seconds to 30 seconds, or from 0.1 seconds to 10 seconds, or from 1 seconds to 10 seconds, or from 1 seconds to 5 seconds, from 5 seconds to 10 seconds, or greater than 0.1 seconds, or greater than 1 seconds, or greater than 5 seconds, or less than 30 seconds. Of course, carbon nanoparticles and aggregates may be produced using thermal reactors with gas flow rates having any of the foregoing values or being within any of the foregoing exemplary ranges, or gas flow rates having a value or being within a range between any of the foregoing exemplary ranges, without limitation and without departing from the scope of the presently described inventive concepts.

In some embodiments, the carbon nanoparticles and aggregates described herein are produced using the thermal reactors with production rates from 10 g/hr to 200 g/hr, or from 30 g/hr to 200 g/hr, or from 30 g/hr to 100 g/hr, or from 30 g/hr to 60 g/hr, or from 10 g/hr to 100 g/hr, or greater than 10 g/hr, or greater than 30 g/hr, or greater than 100 g/hr. Of course, carbon nanoparticles and aggregates may be produced using thermal reactors with production rates having any of the foregoing values or being within any of the foregoing exemplary ranges, or production rates having a value or being within a range between any of the foregoing exemplary ranges, without limitation and without departing from the scope of the presently described inventive concepts.

In some embodiments, thermal reactors or other cracking apparatuses and thermal reactor methods or other cracking methods can be used for refining, pyrolizing, dissociating or cracking feedstock process gases into its constituents to produce the carbon nanoparticles and the carbon aggregates described herein, as well as other solid and/or gaseous products (e.g., hydrogen gas and/or lower order hydrocarbon gases). The feedstock process gases generally include, for example, hydrogen gas ($H_2$), carbon dioxide ($CO_2$), $C_1$ to $C_{10}$ hydrocarbons, aromatic hydrocarbons, and/or other hydrocarbon gases such as natural gas, methane, ethane, propane, butane, isobutane, saturated/unsaturated hydrocarbon gases, ethene, propene, etc., and mixtures thereof. The carbon nanoparticles and the carbon aggregates can include, for example, multi-walled spherical fullerenes (MWSFs), connected MWSFs, carbon nanospheres, graphene, graphite, highly ordered pyrolytic graphite, single-walled nanotubes, multi-walled nanotubes, other solid carbon products, and/or the carbon nanoparticles and the carbon aggregates described herein.

Some embodiments for producing the carbon nanoparticles and the carbon aggregates described herein include thermal cracking methods that use, for example, an elongated longitudinal heating element optionally enclosed within an elongated casing, housing or body of a thermal cracking apparatus. The body generally includes, for example, one or more tubes or other appropriate enclosures made of stainless steel, titanium, graphite, quartz, or the like. In some embodiments, the body of the thermal cracking apparatus is generally cylindrical in shape with a central elongate longitudinal axis arranged vertically and a feedstock process gas inlet at or near a top of the body. The feedstock process gas flows longitudinally down through the body or a portion thereof. In the vertical configuration, both gas flow and gravity assist in the removal of the solid products from the body of the thermal cracking apparatus.

The heating element generally includes, for example, a heating lamp, one or more resistive wires or filaments (or twisted wires), metal filaments, metallic strips or rods, and/or other appropriate thermal radical generators or elements that can be heated to a specific temperature (i.e., a molecular cracking temperature) sufficient to thermally crack molecules of the feedstock process gas. The heating element is generally disposed, located or arranged to extend centrally within the body of the thermal cracking apparatus along the central longitudinal axis thereof. For example, if there is only one heating element, then it is placed at or concentric with the central longitudinal axis, and if there is a plurality of the heating elements, then they are spaced or offset generally symmetrically or concentrically at locations near and around and parallel to the central longitudinal axis.

Thermal cracking to produce the carbon nanoparticles and aggregates described herein is generally achieved by passing the feedstock process gas over, or in contact with, or within the vicinity of, the heating element within a longitudinal elongated reaction zone generated by heat from the heating element and defined by and contained inside the body of the thermal cracking apparatus to heat the feedstock process gas to or at a specific molecular cracking temperature.

The reaction zone is considered to be the region surrounding the heating element and close enough to the heating element for the feedstock process gas to receive sufficient heat to thermally crack the molecules thereof. The reaction zone is thus generally axially aligned or concentric with the central longitudinal axis of the body. In some embodiments, the thermal cracking is performed under a specific pressure. In some embodiments, the feedstock process gas is circulated around or across the outside surface of a container of the reaction zone or a heating chamber in order to cool the container or chamber and preheat the feedstock process gas before flowing the feedstock process gas into the reaction zone.

In some embodiments, the carbon nanoparticles and aggregates described herein and/or hydrogen gas are produced without the use of catalysts. In other words, the process is catalyst free.

Some embodiments to produce the carbon nanoparticles and aggregates described herein using thermal cracking apparatuses and methods to provide a standalone system that can advantageously be rapidly scaled up or scaled down for different production levels as desired. For example, some embodiments are scalable to provide a standalone hydrogen and/or carbon nanoparticle producing station, a hydrocarbon source, or a fuel cell station. Some embodiments can be scaled up to provide higher capacity systems, e.g., for a refinery or the like.

In some embodiments, a thermal cracking apparatus for cracking a feedstock process gas to produce the carbon nanoparticles and aggregates described herein include a body, a feedstock process gas inlet, and an elongated heating element. The body has an inner volume with a longitudinal axis. The inner volume has a reaction zone concentric with the longitudinal axis. A feedstock process gas is flowed into the inner volume through the feedstock process gas inlet during thermal cracking operations. The elongated heating element is disposed within the inner volume along the longitudinal axis and is surrounded by the reaction zone. During the thermal cracking operations, the elongated heating element is heated by electrical power to a molecular cracking temperature to generate the reaction zone, the feedstock process gas is heated by heat from the elongated heating element, and the heat thermally cracks molecules of the feedstock process gas that are within the reaction zone into constituents of the molecules.

In some embodiments, a method for cracking a feedstock process gas to produce the carbon nanoparticles and aggregates described herein includes: (1) providing a thermal cracking apparatus having an inner volume that has a longitudinal axis and an elongated heating element disposed within the inner volume along the longitudinal axis; (2) heating the elongated heating element by electrical power to a molecular cracking temperature to generate a longitudinal elongated reaction zone within the inner volume; (3) flowing a feedstock process gas into the inner volume and through the longitudinal elongated reaction zone (e.g., wherein the feedstock process gas is heated by heat from the elongated heating element); and (4) thermally cracking molecules of the feedstock process gas within the longitudinal elongated reaction zone into constituents thereof (e.g., hydrogen gas and one or more solid products) as the feedstock process gas flows through the longitudinal elongated reaction zone.

In some embodiments, the feedstock process gas to produce the carbon nanoparticles and aggregates described herein includes a hydrocarbon gas. The results of cracking include hydrogen (e.g., $H^2$) and various forms of the carbon nanoparticles and aggregates described herein. In some embodiments, the carbon nanoparticles and aggregates include two or more MWSFs and layers of graphene coating the MWSFs, and/or connected MWSFs and layers of graphene coating the connected MWSFs. In some embodiments, the feedstock process gas is preheated (e.g., to 100° C. to 500° C.) by flowing the feedstock process gas through a gas preheating region between a heating chamber and a shell of the thermal cracking apparatus before flowing the feedstock process gas into the inner volume. In some embodiments, a gas having nanoparticles therein is flowed into the inner volume and through the longitudinal elongated reaction zone to mix with the feedstock process gas, and a coating of a solid product (e.g., layers of graphene) is formed around the nanoparticles.

Post-Processing High Purity Structured Carbons

In some embodiments, the carbon nanoparticles and aggregates containing multi-walled spherical fullerenes (MWSFs) or connected MWSFs described herein are produced and collected, and no post-processing is done. In other embodiments, the carbon nanoparticles and aggregates containing multi-walled spherical fullerenes (MWSFs) or connected MWSFs described herein are produced and collected, and some post-processing is done. Some examples of post-processing involved in the present application include mechanical processing such as ball milling, grinding, attrition milling, micro fluidizing, and other techniques to reduce the particle size without damaging the MWSFs. Some further examples of post-processing include exfoliation processes such as sheer mixing, chemical etching, oxidizing (e.g., Hummer method), thermal annealing, doping by adding elements during annealing (e.g., sulfur, nitrogen), steaming, filtering, and lyophilizing, among others. Some examples of post-processing include sintering processes such as spark plasma sintering (SPS), direct current sintering, microwave sintering, and ultraviolet (UV) sintering, which can be conducted at high pressure and temperature in an inert gas. In some embodiments, multiple post-processing methods can be used together or in a series. In some embodiments, the post-processing produces functionalized carbon nanoparticles or aggregates containing multi-walled spherical fullerenes (MWSFs) or connected MWSFs.

In some embodiments, the materials are mixed together in different combinations. In some embodiments, different carbon nanoparticles and aggregates containing MWSFs or connected MWSFs described herein are mixed together before post-processing. For example, different carbon nanoparticles and aggregates containing MWSFs or connected MWSFs with different properties (e.g., different sizes, different compositions, different purities, from different processing runs, etc.) can be mixed together. In some embodiments, the carbon nanoparticles and aggregates containing MWSFs or connected MWSFs described herein can be mixed with graphene to change the ratio of the connected MWSFs to graphene in the mixture. In some embodiments, different carbon nanoparticles and aggregates containing MWSFs or connected MWSFs described herein can be mixed together after post-processing. For example, different carbon nanoparticles and aggregates containing MWSFs or connected MWSFs with different properties and/or different post-processing methods (e.g., different sizes, different compositions, different functionality, different surface properties, different surface areas) can be mixed together.

In some embodiments, the carbon nanoparticles and aggregates described herein are produced and collected, and subsequently processed by mechanical grinding, milling, and/or exfoliating. In some embodiments, the processing (e.g., by mechanical grinding, milling, exfoliating, etc.) reduces the average size of the particles. In some embodiments, the processing (e.g., by mechanical grinding, milling, exfoliating, etc.) increases the average surface area of the particles. In some embodiments, the processing by mechanical grinding, milling and/or exfoliation shears off some fraction of the carbon layers, producing sheets of graphite mixed with the carbon nanoparticles.

In some embodiments, the mechanical grinding or milling is performed using a ball mill, a planetary mill, a rod mill, a shear mixer, a high-shear granulator, an autogenous mill, or other types of machining used to break solid materials into smaller pieces by grinding, crushing or cutting. In some embodiments, the mechanical grinding, milling and/or exfoliating is performed wet or dry. In some embodiments, the mechanical grinding is performed by grinding for some period of time, then idling for some period of time, and repeating the grinding and idling for a number of cycles. In some embodiments, the grinding period is from 1 minute to 20 minutes, or from 1 minute to 10 minutes, or from 3 minutes to 8 minutes, or approximately 3 minutes, or approximately 8 minutes. In some embodiments, the idling period is from 1 minute to 10 minutes, or approximately 5 minutes, or approximately 6 minutes. In some embodiments, the number of grinding and idling cycles is from 1 minute to 100 minutes, or from 5 minutes to 100 minutes, or from 10 minutes to 100 minutes, or from 5 minutes to 10 minutes, or from 5 minutes to 20 minutes. In some embodiments, the total amount of time of grinding and idling is from 10 minutes to 1200 minutes, or from 10 minutes to 600 minutes, or from 10 minutes to 240 minutes, or from 10 minutes to 120 minutes, or from 100 minutes to 90 minutes, or from 10 minutes to 60 minutes, or approximately 90 minutes, or approximately 120 minutes. Of course, grinding, milling, or idling times within the scope of the presently disclosed inventive embodiments may have any of the foregoing values or be within any of the foregoing exemplary ranges, between any of the foregoing exemplary ranges, without limitation and without departing from the scope of the presently described inventive concepts.

In some embodiments, the grinding steps in the cycle are performed by rotating a mill in one direction for a first cycle (e.g., clockwise), and then rotating a mill in the opposite direction (e.g., counterclockwise) for the next cycle. In some embodiments, the mechanical grinding or milling is performed using a ball mill, and the grinding steps are performed using a rotation speed from 100 to 1000 rpm, or from 100 to 500 rpm, or approximately 400 rpm, or any value or range of values therebetween. In some embodiments, the mechanical grinding or milling is performed using a ball mill that uses a milling media with a diameter from 0.1 mm to 20 mm, or from 0.1 mm to 10 mm, or from 1 mm to 10 mm, or approximately 0.1 mm, or approximately 1 mm, or approximately 10 mm, or any value or range of values therebetween. In some embodiments, the mechanical grinding or milling is performed using a ball mill that uses a milling media composed of metal such as steel, an oxide such as zirconium oxide (zirconia), yttria stabilized zirconium oxide, silica, alumina, magnesium oxide, or other hard materials such as silicon carbide or tungsten carbide.

In some embodiments, the carbon nanoparticles and aggregates described herein are produced and collected, and subsequently processed using elevated temperatures such as thermal annealing or sintering. In some embodiments, the processing using elevated temperatures is done in an inert environment such as nitrogen or argon. In some embodiments, the processing using elevated temperatures is done at atmospheric pressure, or under vacuum, or at low pressure. In some embodiments, the processing using elevated temperatures is done at a temperature from 500° C. to 2500° C., or from 500° C. to 1500° C., or from 800° C. to 1500° C., or from 800° C. to 1200° C., or from 800° C. to 1000° C., or from 2000° C. to 2400° C., or approximately 800° C., or approximately 1000° C., or approximately 1500° C., or approximately 2000° C., or approximately 2400° C. Of course, processing using elevated temperatures may be performed at any of the foregoing temperatures, or at a temperature within any of the foregoing exemplary ranges, or between any of the foregoing exemplary ranges, without limitation and without departing from the scope of the presently described inventive concepts.

In some embodiments, the carbon nanoparticles and aggregates described herein are produced and collected, and subsequently, in post processing steps, additional elements or compounds are added to the carbon nanoparticles, thereby incorporating the unique properties of the carbon nanoparticles and aggregates into other mixtures of materials.

In some embodiments, either before or after post-processing, the carbon nanoparticles and aggregates described herein are added to solids, liquids or slurries of other elements or compounds to form additional mixtures of materials incorporating the unique properties of the carbon nanoparticles and aggregates. In some embodiments, the carbon nanoparticles and aggregates described herein are mixed with other solid particles, polymers or other materials.

In some embodiments, either before or after post-processing, the carbon nanoparticles and aggregates described herein are used in various applications beyond applications pertaining to the present disclosure. Such applications including but not limited to transportation applications (e.g., automobile and truck tires, couplings, mounts, elastomeric o-rings, hoses, sealants, grommets, etc.) and industrial applications (e.g., rubber additives, functionalized additives for polymeric materials, additives for epoxies, etc.).

FIGS. 10A and 10B show transmission electron microscope (TEM) images of as-synthesized carbon nanoparticles. The carbon nanoparticles of FIG. 10A (at a first magnification) and FIG. 10B (at a second magnification) contain connected multi-walled spherical fullerenes 1002 (MWSFs) with graphene layers 1004 that coat the connected MWSFs. The ratio of MWSF to graphene allotropes in this example is approximately 80% due to the relatively short resonance times. The MWSFs in FIG. 10A are approximately 5 nm to 10 nm in diameter, and the diameter can be from 5 nm to 500 nm using the conditions described above. In some embodiments, the average diameter across the MWSFs is in a range from 5 nm to 500 nm, or from 5 nm to 250 nm, or from 5 nm to 100 nm, or from 5 nm to 50 nm, or from 10 nm to 500 nm, or from 10 nm to 250 nm, or from 10 nm to 100 nm, or from 10 nm to 50 nm, or from 40 nm to 500 nm, or from 40 nm to 250 nm, or from 40 nm to 100 nm, or from 50 nm to 500 nm, or from 50 nm to 250 nm, or from 50 nm to 100 nm. Of course, average MWSF diameter within the scope of the presently disclosed inventive embodiments may have any of the foregoing values or be within any of the foregoing exemplary ranges, or between any of the foregoing exemplary ranges, without limitation and without departing from the scope of the presently described inventive concepts. No catalyst was used in this process, and therefore, there is no central seed containing contaminants. The aggregate particles produced in this example had a particle size of approximately 10 μm to 100 μm, or approximately 10 μm to 500 μm.

FIG. 10C shows the Raman spectrum of the as-synthesized aggregates in this example taken with 532 nm incident light. The $I_D/I_G$ for the aggregates produced in this example is from approximately 0.99 to 1.03, indicating that the aggregates were composed of carbon allotropes with a high degree of order.

FIG. 10D and FIG. 10E show example TEM images of the carbon nanoparticles after size reduction by grinding in a ball mill. The ball milling was performed in cycles with a 3 minute counter-clockwise grinding step, followed by a 6 minute idle step, followed by a 3 minute clockwise grinding step, followed by a 6 minute idle step. The grinding steps were performed using a rotation speed of 400 rpm. The milling media was zirconia and ranged in size from 0.1 mm to 10 mm. The total size reduction processing time was from 60 minutes to 120 minutes. After size reduction, the aggregate particles produced in this example had a particle size of approximately 1 µm to 5 µm. The carbon nanoparticles after size reduction are connected MWSFs with layers of graphene coating the connected MWSFs.

FIG. 10F shows a Raman spectrum from these aggregates after size reduction taken with a 532 nm incident light. The $I_D/I_G$ for the aggregate particles in this example after size reduction is approximately 1.04. Additionally, the particles after size reduction had a Brunauer, Emmett and Teller (BET) specific surface area of approximately 40 m²/g to 50 m²/g.

The purity of the aggregates produced in this sample were measured using mass spectrometry and x-ray fluorescence (XRF) spectroscopy. The ratio of carbon to other elements, except for hydrogen, measured in 16 different batches was from 99.86% to 99.98%, with an average of 99.94% carbon.

In this example, carbon nanoparticles were generated using a thermal hot-wire processing system. The precursor material was methane, which was flowed from 1 slm to 5 slm. With these flow rates and the tool geometry, the resonance time of the gas in the reaction chamber was from approximately 20 second to 30 seconds, and the carbon particle production rate was from approximately 20 g/hr.

Further details pertaining to such a processing system can be found in the previously mentioned U.S. Pat. No. 9,862,602, titled "CRACKING OF A PROCESS GAS."

FIG. 10G, FIG. 10H and FIG. 10I show TEM images of as-synthesized carbon nanoparticles of this example. The carbon nanoparticles contain connected multi-walled spherical fullerenes (MWSFs) with layers of graphene coating the connected MWSFs. The ratio of multi-walled fullerenes to graphene allotropes in this example is approximately 30% due to the relatively long resonance times allowing thicker, or more, layers of graphene to coat the MWSFs. No catalyst was used in this process, and therefore, there is no central seed containing contaminants. The as-synthesized aggregate particles produced in this example had particle sizes of approximately 10 µm to 500 µm. FIG. 10J shows a Raman spectrum from the aggregates of this example. The Raman signature of the as-synthesized particles in this example is indicative of the thicker graphene layers which coat the MWSFs in the as-synthesized material. Additionally, the as-synthesized particles had a Brunauer, Emmett and Teller (BET) specific surface area of approximately 90 m²/g to 100 m²/g.

FIG. 10K and FIG. 10L show TEM images of the carbon nanoparticles of this example. Specifically, the images depict the carbon nanoparticles after performance of size reduction by grinding in a ball mill. The size reduction process conditions were the same as those described as pertains to the foregoing FIG. 10G through FIG. 10J. After size reduction, the aggregate particles produced in this example had a particle size of approximately 1 µm to 5 µm. The TEM images show that the connected MWSFs that were buried in the graphene coating can be observed after size reduction. FIG. 10M shows a Raman spectrum from the aggregates of this example after size reduction taken with 532 nm incident light. The $I_D/I_G$ for the aggregate particles in this example after size reduction is approximately 1, indicating that the connected MWSFs that were buried in the graphene coating as-synthesized had become detectable in Raman after size reduction, and were well ordered. The particles after size reduction had a Brunauer, Emmett and Teller (BET) specific surface area of approximately 90 m²/g to 100 m²/g.

FIG. 10N is a scanning electron microscope (SEM) image of carbon aggregates showing the graphite and graphene allotropes at a first magnification. FIG. 10O is a SEM image of carbon aggregates showing the graphite and graphene allotropes at a second magnification. The layered graphene is clearly shown within the distortion (wrinkles) of the carbon. The 3D structure of the carbon allotropes is also visible.

The particle size distribution of the carbon particles of FIG. 10N and FIG. 10O is shown in FIG. 10P. The mass basis cumulative particle size distribution 1006 corresponds to the left y-axis in the graph ($Q^3(x)$ [%]). The histogram of the mass particle size distribution 1008 corresponds to the right axis in the graph ($dQ^3(x)$ [%]). The median particle size is approximately 33 µm. The 10th percentile particle size is approximately 9 µm, and the 90th percentile particle size is approximately 103 µm. The mass density of the particles is approximately 10 g/L.

The particle size distribution of the carbon particles captured from a multiple-stage reactor is shown in FIG. 10Q. The mass basis cumulative particle size distribution 1014 corresponds to the left y-axis in the graph ($Q^3(x)$ [%]). The histogram of the mass particle size distribution 1016 corresponds to the right axis in the graph ($dQ^3(x)$ [%]). The median particle size captured is approximately 11 µm. The 10th percentile particle size is approximately 3.5 µm, and the 90th percentile particle size is approximately 21 µm. The graph in FIG. 10Q also shows the number basis cumulative particle size distribution 1018 corresponding to the left y-axis in the graph ($Q^0(x)$ [%]). The median particle size by number basis is from approximately 0.1 µm to approximately 0.2 µm. The mass density of the particles collected is approximately 22 g/L.

Returning to the discussion of FIG. 10P, the graph also shows a second set of example results. Specifically, in this example, the particles were size-reduced by mechanical grinding, and then the size-reduced particles were processed using a cyclone separator. The mass basis cumulative particle size distribution 1010 of the size-reduced carbon particles captured in this example corresponds to the left y-axis in the graph ($Q^3(x)$ [%]). The histogram of the mass basis particle size distribution 1012 corresponds to the right axis in the graph ($dQ^3(x)$ [%]). The median particle size of the size-reduced carbon particles captured in this example is approximately 6 µm. The 10th percentile particle size is from 1 µm to 2 µm, and the 90th percentile particle size is from 10 µm to 20 µm.

Further details pertaining to making and using cyclone separators can be found in U.S. patent application Ser. No. 15/725,928, filed Oct. 5, 2017, titled "MICROWAVE REACTOR SYSTEM WITH GAS-SOLIDS SEPARATION", which is hereby incorporated by reference in its entirety.

High Purity Carbon Allotropes Produced Using Microwave Reactor Systems

In some cases, carbon particles and aggregates containing graphite, graphene and amorphous carbon can be generated using a microwave plasma reactor system using a precursor material that contains methane, or contains isopropyl alcohol (IPA), or contains ethanol, or contains a condensed hydrocarbon (e.g., hexane). In some other examples, the carbon-containing precursors are optionally mixed with a supply gas (e.g., argon). The particles produced in this example contained graphite, graphene, amorphous carbon and no seed particles. The particles in this example had a ratio of carbon to other elements (other than hydrogen) of approximately 99.5% or greater.

In one particular example, a hydrocarbon was the input material for the microwave plasma reactor, and the separated outputs of the reactor comprised hydrogen gas and carbon particles containing graphite, graphene and amorphous carbon. The carbon particles were separated from the hydrogen gas in a multi-stage gas-solid separation system. The solids loading of the separated outputs from the reactor was from 0.001 g/L to 2.5 g/L.

FIG. 10R, FIG. 10S, and FIG. 10T are TEM images of as-synthesized carbon nanoparticles. The images show examples of graphite, graphene and amorphous carbon allotropes. The layers of graphene and other carbon materials can be clearly seen in the images.

The particle size distribution of the carbon particles captured is shown in FIG. 10U. The mass basis cumulative particle size distribution 1020 corresponds to the left y-axis in the graph ($Q^3(x)$ [%]). The histogram of the mass particle size distribution 1022 corresponds to the right axis in the graph ($dQ^3(x)$ [%]). The median particle size captured in the cyclone separator in this example was approximately 14 μm. The 10th percentile particle size was approximately 5 μm, and the 90th percentile particle size was approximately 28 μm. The graph in FIG. 10U also shows the number basis cumulative particle size distribution 1024 corresponding to the left y-axis in the graph ($Q^0(x)$ [%]). The median particle size by number basis in this example was from approximately 0.1 μm to approximately 0.2 μm.

FIG. 10V, FIG. 10W, and FIGS. 10X, and 10Y are images that show three-dimensional carbon-containing structures that are grown onto other three-dimensional structures. FIG. 10V is a 100× magnification of three-dimensional carbon structures grown onto carbon fibers, whereas FIG. 10W is a 200× magnification of three-dimensional carbon structures grown onto carbon fibers. FIG. 10X is a 10000× magnification of three-dimensional carbon structures grown onto carbon fibers. The three-dimensional carbon growth over the fiber surface is shown. FIG. 10Y is a 10000× magnification of three-dimensional carbon structures grown onto carbon fibers. The image depicts growth onto the basal plane as well as onto edge planes.

More specifically, FIGS. 10V-10Y show example SEM images of 3D carbon materials grown onto fibers using plasma energy from a microwave plasma reactor as well as thermal energy from a thermal reactor. FIG. 10V shows an SEM image of intersecting fibers 1031 and 1032 with 3D carbon material 1030 grown on the surface of the fibers. FIG. 10W is a higher magnification image (the scale bar is 300 μm compared to 500 μm for FIG. 10V) showing 3D carbon growth 1030 on the fiber 1032. FIG. 10X is a further magnified view (scale bar is 40 μm) showing 3D carbon growth 1030 on fiber surface 1035, where the 3D nature of the carbon growth 1030 can be clearly seen. FIG. 10Y shows a close-up view (scale bar is 500 nm) of the carbon alone, showing interconnection between basal planes 1036 and edge planes 1034 of numerous sub-particles of the 3D carbon material grown on the fiber. FIGS. 10V-10Y demonstrate the ability to grow 3D carbon on a 3D fiber structure according to some embodiments, such as 3D carbon growth grown on a 3D carbon fiber.

In some embodiments, 3D carbon growth on fibers can be achieved by introducing a plurality of fibers into the microwave plasma reactor and using plasma in the microwave reactor to etch the fibers. The etching creates nucleation sites such that when carbon particles and sub-particles are created by hydrocarbon disassociation in the reactor, growth of 3D carbon structures is initiated at these nucleation sites. The direct growth of the 3D carbon structures on the fibers, which themselves are three-dimensional in nature, provides a highly integrated, 3D structure with pores into which resin can permeate. This 3D reinforcement matrix (including the 3D carbon structures integrated with high aspect ratio reinforcing fibers) for a resin composite results in enhanced material properties, such as tensile strength and shear, compared to composites with conventional fibers that have smooth surfaces and which smooth surfaces typically delaminate from the resin matrix.

Functionalizing Carbon

In some embodiments, carbon materials, such as 3D carbon materials described herein, can be functionalized to promote adhesion and/or add elements such as oxygen, nitrogen, carbon, silicon, or hardening agents. In some embodiments, the carbon materials can be functionalized in situ—that is, within the same reactor in which the carbon materials are produced. In some embodiments, the carbon materials can be functionalized in post-processing. For example, the surfaces of fullerenes or graphene can be functionalized with oxygen- or nitrogen-containing species which form bonds with polymers of the resin matrix, thus improving adhesion and providing strong binding to enhance the strength of composites.

Embodiments include functionalizing surface treatments for carbon (e.g., CNTs, CNO, graphene, 3D carbon materials such as 3D graphene) utilizing plasma reactors (e.g., microwave plasma reactors) described herein. Various embodiments can include in situ surface treatment during creation of carbon materials that can be combined with a binder or polymer in a composite material. Various embodiments can include surface treatment after creation of the carbon materials while the carbon materials are still within the reactor.

In some aspects, the techniques described herein relate to a protective enclosure for electronic systems, including: a polymer-containing matrix; a first metamaterial embedded within the polymer-containing matrix, the first metamaterial having a specific permittivity or permeability to absorb a particular frequency of electromagnetic energy; and a second metamaterial embedded within the polymer-containing matrix, the second metamaterial configure to allow specific communication frequencies to pass through the protective enclosure.

In some aspects, the techniques described herein relate to a protective enclosure, wherein the first metamaterial includes carbon nanoparticles.

In some aspects, the techniques described herein relate to a protective enclosure, wherein the carbon nanoparticles are tuned to absorb a specific frequency of electromagnetic energy by adjusting their size, shape, or composition.

In some aspects, the techniques described herein relate to a protective enclosure, wherein the second metamaterial includes a frequency selective surface.

In some aspects, the techniques described herein relate to a protective enclosure, wherein the frequency selective surface is configured to allow electromagnetic radiation in a communication band to pass through while reflecting or absorbing other frequencies.

In some aspects, the techniques described herein relate to a protective enclosure, wherein the polymer-containing matrix includes a thermoplastic material.

In some aspects, the techniques described herein relate to a protective enclosure, wherein the first metamaterial is embedded within the polymer-containing matrix in a uniform distribution.

In some aspects, the techniques described herein relate to a protective enclosure, wherein the first metamaterial is embedded within the polymer-containing matrix in a layered structure.

In some aspects, the techniques described herein relate to a protective enclosure, wherein the first metamaterial is embedded within the polymer-containing matrix in a grid-like structure.

In some aspects, the techniques described herein relate to a protective enclosure, wherein the first metamaterial is embedded within the polymer-containing matrix in a random structure.

In some aspects, the techniques described herein relate to a protective enclosure, wherein the first metamaterial is embedded within the polymer-containing matrix in a manner that allows for the application of an external stimulus to the first metamaterial after the formation of the protective enclosure.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein included the one or more modes known to the inventor for carrying out the claimed subject matter. Of course, variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A protective enclosure for electronic systems, comprising:
    a polymer-containing matrix; and
    a metamaterial incorporated into or embedded within the polymer-containing matrix, the metamaterial having a particular specific permittivity or permeability to absorb or reflect a particular frequency of electromagnetic energy;
    wherein the metamaterial is configured to protect against electromagnetic disturbances, wherein the electromagnetic disturbances includes at least one selected from the group of electromagnetic radiation, electromagnetic energy, electromagnetic wave energy, electromagnetic interference, radio frequency interference, electromagnetic pulse, data interception, static electricity, and preconfigured electromagnetic frequencies.

2. The protective enclosure of claim 1, wherein the metamaterial comprises carbon nanoparticles and aggregates.

3. The protective enclosure of claim 2, wherein the carbon nanoparticles are tuned to absorb a specific frequency of electromagnetic energy.

4. The protective enclosure of claim 2, wherein the carbon nanoparticles are tuned to reflect a specific frequency of electromagnetic energy.

5. The protective enclosure of claim 1, wherein the polymer-containing matrix comprises a thermoplastic material.

6. The protective enclosure of claim 1, wherein the metamaterial is embedded within the polymer-containing matrix in at least one selected from the group of a uniform distribution, a layered structure, a grid-like structure, and a random structure.

7. The protective enclosure of claim 1, wherein the metamaterial is tuned to allow wireless communication signals in a frequency band associated with Wi-Fi or cellular communication.

8. The protective enclosure of claim 1, wherein the metamaterial is tuned to absorb electromagnetic energy in a specific frequency band while allowing wireless communication signals in a different frequency band to pass through.

9. The protective enclosure of claim 1, wherein the metamaterial is tuned to absorb electromagnetic energy in a frequency band associated with radio frequency interference.

10. The protective enclosure of claim 1, wherein the metamaterial is embedded within the polymer-containing matrix in a manner that allows for application of an external stimulus to the metamaterial after formation of the protective enclosure.

11. The protective enclosure of claim 10, wherein the external stimulus comprises at least one selected from the group of heat, light, and an electric field.

12. The protective enclosure of claim 10, wherein the external stimulus is configured to cause a change in the metamaterial to absorb or reflect a different particular frequency.

13. The protective enclosure of claim 1, wherein the polymer-containing matrix is a coated surface layer of the protective enclosure.

14. The protective enclosure of claim 1, wherein the polymer-containing matrix is embedded into a structure of the protective enclosure.

15. The protective enclosure of claim 1, wherein the metamaterial is configured to enhance a performance of at least one selected from the group of:
    an antenna housed within the protective enclosure,
    a telemetry module housed within the protective enclosure, a communication device housed within the protective enclosure, a computing device housed within the protective enclosure, a sensing equipment housed within the protective enclosure, a battery pack that includes telemetry devices for sending alert signals to safety systems housed within the protective enclosure, and a device that requires uninterrupted wireless telemetry housed within the protective enclosure.

16. The protective enclosure of claim 1, wherein the metamaterial is configured with a non-metallic material.

17. The protective enclosure of claim 1, wherein the metamaterial is configured to repeal, at a first level of the metamaterial, a preconfigured electromagnetic first frequency or a first set of frequencies, and to absorb, at a second level of the metamaterial, a preconfigured electromagnetic second frequency or a second set of frequencies.

18. The protective enclosure of claim 1, further comprising an impedance sheet, located on a first side of the metamaterial, and a conducting backplane, located on a second side of the metamaterial, wherein the impedance sheet is configured to reflect or shield a first set of preconfigured frequencies, the metamaterial is configured to absorb a second set of preconfigured frequencies, and the conducting backplane is configured to reflect a third set of preconfigured frequencies.

19. The protective enclosure of claim 18, wherein the impedance sheet is configured such that only a fraction of incoming electromagnetic waves pass through the impedance sheet and reach the metamaterial.

20. A protective enclosure for electronic systems, comprising:

a polymer-containing matrix; and a metamaterial incorporated into or embedded within the polymer-containing matrix, the metamaterial having a particular specific permittivity or permeability to absorb or reflect a particular frequency of electromagnetic energy;

wherein the metamaterial is configured to repeal, at a first level of the metamaterial, a preconfigured electromagnetic first frequency or a first set of frequencies, and to absorb, at a second level of the metamaterial, a preconfigured electromagnetic second frequency or a second set of frequencies.

21. A protective enclosure for electronic systems, comprising:

a polymer-containing matrix; and a metamaterial incorporated into or embedded within the polymer-containing matrix, the metamaterial having a particular specific permittivity or permeability to absorb or reflect a particular frequency of electromagnetic energy;

wherein the metamaterial is configured with a non-metallic material;

wherein the non-metallic material includes a carbon-containing material that is functionalized to selectively absorb specific frequencies of electromagnetic radiation.

22. The protective enclosure of claim 1, wherein the metamaterial comprises a graphene, and wherein the polymer-containing matrix includes a phase-change material that alters its electromagnetic properties in response to temperature changes.

23. The protective enclosure of claim 1, wherein the metamaterial is arranged in a fractal pattern within the polymer-containing matrix, and wherein the protective enclosure further comprises a layer of electromagnetic absorbing foam adjacent to the polymer-containing matrix.

24. The protective enclosure of claim 1, wherein the metamaterial includes ferroelectric nanoparticles that can be electrically tuned to adjust the frequency range of electromagnetic absorption, and wherein the protective enclosure includes embedded sensors to detect and measure incident electromagnetic radiation.

25. The protective enclosure of claim 1, wherein the polymer-containing matrix comprises a multi-layered structure with alternating layers of different metamaterials, each layer tuned to absorb or reflect a specific frequency range, and wherein the protective enclosure includes a self-diagnostic system to monitor its shielding effectiveness over time.

26. The protective enclosure of claim 1, wherein the metamaterial includes shape-memory alloy particles that change their electromagnetic properties in response to mechanical stress, and wherein the protective enclosure incorporates a passive cooling system to dissipate heat generated by absorbed electromagnetic energy.

27. The protective enclosure of claim 1, wherein the metamaterial is characterized using a measurement platform configured to obtain direct measurements of electrical properties including local variations of permittivity (E) and conductivity (o) with a lateral resolution of less than 100 nm.

28. The protective enclosure of claim 1, wherein the metamaterial comprises a combination of dielectric, insulating, semiconducting, and metallic materials, and wherein the electrical properties of the metamaterial are measured using a platform compatible with all of these material types.

29. The protective enclosure of claim 1, wherein the metamaterial is incorporated into the polymer-containing matrix in a layered structure, and wherein the electrical properties of the metamaterial are characterized using a measurement platform with sub-surface sensitivity capable of imaging through overlayers of approximately 100 nm thickness.

30. The protective enclosure of claim 20, wherein the first level of the metamaterial comprises a frequency selective surface with a periodic pattern of conductive elements, and wherein the second level of the metamaterial comprises carbon-based particles aligned perpendicular to the first level.

31. The protective enclosure of claim 20, wherein the first set of frequencies includes frequencies in the range of 1-5 GHZ, and the second set of frequencies includes frequencies in the range of 10-30 GHZ, and wherein the protective enclosure further comprises a third level of metamaterial configured to absorb frequencies in the range of 30-300 GHz.

32. The protective enclosure of claim 20, wherein the polymer-containing matrix includes a gradient of metamaterial concentration that increases from the outer surface to the inner surface of the protective enclosure, and wherein the protective enclosure includes a layer of electromagnetic interference (EMI) gasket material at its edges.

33. The protective enclosure of claim 20, wherein the metamaterial includes magnetically alignable particles that can be oriented post-manufacturing to optimize shielding performance.

34. The protective enclosure of claim 20, wherein the first level and second level of the metamaterial are separated by a layer of piezoelectric material that converts absorbed electromagnetic energy into electrical energy.

35. The protective enclosure of claim 20, wherein the protective enclosure incorporates a removable and replaceable outer layer containing the first level of metamaterial.

36. The protective enclosure of claim 20, wherein the metamaterial includes plasmonic nanostructures that enhance electromagnetic absorption at specific frequencies.

37. The protective enclosure of claim 21, wherein the non-metallic material comprises a composite of carbon-based particles and ceramic particles, and wherein the protective enclosure includes a layer of electromagnetic absorbing paint on its outer surface.

38. The protective enclosure of claim 21, wherein the non-metallic material includes doped semiconductor nanoparticles that provide tunable electromagnetic absorption.

39. The protective enclosure of claim 21, wherein the non-metallic material comprises a network of conductive polymers interspersed with ferrite particles, and wherein the protective enclosure includes a layer of radar-absorbing material on its outer surface.

40. The protective enclosure of claim 21, wherein carbon-containing material includes graphene oxide sheets.

41. The protective enclosure of claim 21, wherein the non-metallic material comprises a metamaterial with a negative refractive index in a predefined frequency range, and wherein the protective enclosure includes active electronic components that generate cancelling electromagnetic fields.

42. The protective enclosure of claim 21, wherein the protective enclosure incorporates a layer of electromagnetic bandgap (EBG) structures.

43. The protective enclosure of claim 21, wherein the non-metallic material comprises a composite of carbon-based particles and boron nitride nanotubes providing broadband electromagnetic absorption, and wherein the protective enclosure includes a layer of magnetically permeable material to redirect electromagnetic fields.

* * * * *